(12) United States Patent
Jerman et al.

(10) Patent No.: US 6,847,661 B2
(45) Date of Patent: Jan. 25, 2005

(54) TUNABLE LASER WITH MICROACTUATOR

(75) Inventors: John H. Jerman, Palo Alto, CA (US); John D. Grade, Mountain View, CA (US); Jill D. Berger, Los Gatos, CA (US); John F. Heanue, San Jose, CA (US)

(73) Assignee: Iolon, Inc., San Jose, CA (US)

( * ) Notice: Subject to any disclaimer, the term of this patent is extended or adjusted under 35 U.S.C. 154(b) by 296 days.

(21) Appl. No.: 09/728,212

(22) Filed: Nov. 29, 2000

(65) Prior Publication Data

US 2001/0036206 A1 Nov. 1, 2001

Related U.S. Application Data

(60) Provisional application No. 60/167,937, filed on Nov. 29, 1999, provisional application No. 60/167,951, filed on Nov. 29, 1999, provisional application No. 60/174,562, filed on Jan. 5, 2000, provisional application No. 09/491,429, filed on Jan. 26, 2000, provisional application No. 60/154,899, filed on Sep. 20, 1999, provisional application No. 60/227,933, filed on Aug. 25, 2000, and provisional application No. 60/234,042, filed on Sep. 20, 2000.

(51) Int. Cl.$^7$ .............................. H01S 3/10; H01S 3/00; H01S 3/08

(52) U.S. Cl. .......................... 372/20; 372/38.1; 372/99; 372/101; 372/102

(58) Field of Search .......................... 372/20, 38.1, 43, 372/99, 101, 102, 15, 14, 11, 26, 23, 9, 107

(56) References Cited

U.S. PATENT DOCUMENTS

| | | |
|---|---|---|
| 625,971 A | 5/1899 | Gardner et al. |
| 4,460,977 A | 7/1984 | Shimada et al. |
| 4,504,950 A | 3/1985 | AuYeung |
| 4,560,246 A | 12/1985 | Cotter |
| 4,583,227 A | 4/1986 | Kirkby |
| 4,770,047 A | 9/1988 | Arditty et al. |
| 4,839,614 A | 6/1989 | Hill et al. |

(List continued on next page.)

FOREIGN PATENT DOCUMENTS

| | | | |
|---|---|---|---|
| EP | 0 924821 | 6/1999 | ........... H01S/3/085 |
| EP | 0 952643 | 10/1999 | ........... H01S/3/085 |

(List continued on next page.)

OTHER PUBLICATIONS

Akimoto et al, Micro electro mechanical systems (MEMS) and their photonic applicaton, SPIE Proceedings, vol. 3098, Sep. 1997, pp. 374–381.*

(List continued on next page.)

*Primary Examiner*—Minsun Oh Harvey
*Assistant Examiner*—Armando Rodriguez
(74) *Attorney, Agent, or Firm*—Dorsey & Whitney LLP

(57) ABSTRACT

A tunable laser comprising a laser source for providing light with a wavelength along an optical path. A diffractive element is positioned in the optical path and spaced from the laser source for redirecting the light received from the laser source. A reflective element is positioned in the optical path and spaced from the diffractive element for receiving the light redirected by the diffractive element and for further redirecting the light back along the optical path to the reflective element. The diffractive element receives the light further redirected by the reflective element and returns the light along the optical path to the laser source. The optical path created by the laser source, the diffractive element and the reflective element causes the light to lase at the wavelength. At least one microactuator is coupled to one of the diffractive element and the reflective element for moving such element to select the wavelength of the light. A variety of microactuators that can be used with the tunable laser are provided.

40 Claims, 18 Drawing Sheets

U.S. PATENT DOCUMENTS

| | | |
|---|---|---|
| 4,843,233 A | 6/1989 | Jeunhomme |
| 4,847,854 A | 7/1989 | Van Dijk |
| 4,870,269 A | 9/1989 | Jeunhomme et al. |
| 4,932,782 A | 6/1990 | Graindorge et al. |
| 4,994,677 A | 2/1991 | Graindorge |
| 5,028,395 A | 7/1991 | Sebille et al. |
| 5,050,179 A | 9/1991 | Mooradian |
| 5,058,124 A | 10/1991 | Cameron et al. |
| 5,103,457 A | 4/1992 | Wallace et al. |
| 5,115,677 A | 5/1992 | Martin et al. |
| 5,124,993 A | 6/1992 | Braunlich et al. |
| 5,141,316 A | 8/1992 | Lefevre et al. |
| 5,163,063 A | 11/1992 | Yoshikawa et al. |
| 5,172,185 A | 12/1992 | Leuchs et al. |
| 5,181,078 A | 1/1993 | Lefevre et al. |
| 5,181,214 A | 1/1993 | Berger et al. |
| 5,181,717 A | 1/1993 | Donntag et al. |
| 5,185,643 A | 2/1993 | Vry et al. |
| 5,218,610 A | 6/1993 | Dixon |
| 5,225,930 A | 7/1993 | Land et al. |
| 5,263,037 A | 11/1993 | Trutna, Jr. et al. |
| 5,270,791 A | 12/1993 | Lefevre et al. |
| 5,305,330 A | 4/1994 | Rieder et al. |
| 5,319,257 A * | 6/1994 | McIntyre .................... 310/328 |
| 5,319,668 A | 6/1994 | Luecke ....................... 372/107 |
| 5,321,717 A | 6/1994 | Adachi et al. |
| 5,327,447 A | 7/1994 | Mooradian |
| 5,331,651 A | 7/1994 | Becker et al. |
| 5,347,527 A | 9/1994 | Favre et al. |
| 5,349,440 A | 9/1994 | DeGroot |
| 5,373,515 A | 12/1994 | Wakabayashi et al. |
| 5,387,974 A | 2/1995 | Nakatani |
| 5,412,474 A | 5/1995 | Reasenberg et al. |
| 5,414,280 A | 5/1995 | Girmay |
| 5,418,800 A | 5/1995 | Prior et al. |
| 5,420,416 A | 5/1995 | Iida et al. |
| 5,420,687 A | 5/1995 | Kachanov |
| 5,428,700 A | 6/1995 | Hall |
| 5,438,579 A | 8/1995 | Eda et al. |
| 5,444,724 A | 8/1995 | Goto |
| 5,450,202 A | 9/1995 | Tisue |
| 5,473,625 A | 12/1995 | Hansen et al. |
| 5,543,916 A | 8/1996 | Kachanov |
| 5,583,638 A | 12/1996 | Cutler |
| 5,594,744 A | 1/1997 | Lefevre et al. |
| 5,606,439 A | 2/1997 | Wu |
| 5,631,736 A | 5/1997 | Thiel et al. |
| 5,651,018 A | 7/1997 | Mehuys et al. |
| 5,673,129 A | 9/1997 | Mizrahi |
| 5,712,704 A | 1/1998 | Martin et al. |
| 5,719,674 A | 2/1998 | Martin et al. |
| 5,737,109 A | 4/1998 | Goodwin |
| 5,751,750 A | 5/1998 | Friede et al. |
| 5,760,391 A | 6/1998 | Narendran |
| 5,771,252 A * | 6/1998 | Lang et al. .................... 372/20 |
| 5,777,773 A | 7/1998 | Epworth et al. |
| 5,802,085 A | 9/1998 | Lefevre et al. |
| 5,812,716 A | 9/1998 | Ohishi |
| 5,825,792 A | 10/1998 | Villeneuve et al. |
| 5,848,092 A | 12/1998 | Mitsumoto et al. |
| 5,862,162 A | 1/1999 | Maeda |
| 5,867,512 A | 2/1999 | Sacher ........................ 372/20 |
| 5,872,881 A | 2/1999 | Rossi et al. |
| 5,886,785 A | 3/1999 | Lefevre et al. |
| 5,917,188 A | 6/1999 | Atkinson et al. |
| 5,943,352 A | 8/1999 | Fee |
| 5,946,331 A | 8/1999 | Amersfoort et al. |
| 5,991,061 A | 11/1999 | Adams et al. |
| 5,998,906 A * | 12/1999 | Jerman et al. ............... 310/309 |
| 6,018,535 A * | 1/2000 | Maeda ........................ 372/20 |
| 6,026,100 A | 2/2000 | Maeda |
| 6,034,799 A | 3/2000 | Hansen |
| 6,040,950 A | 3/2000 | Broome |
| 6,043,883 A | 3/2000 | Leckel et al. |
| 6,044,095 A | 3/2000 | Asano et al. |
| 6,061,369 A | 5/2000 | Conradi |
| 6,064,501 A | 5/2000 | Roberts et al. |
| 6,081,539 A * | 6/2000 | Mattori et al. ................. 372/20 |
| 6,084,695 A | 7/2000 | Martin et al. |
| 6,108,355 A | 8/2000 | Zorabedian |
| 6,115,121 A | 9/2000 | Erskine |
| 6,115,401 A | 9/2000 | Scobey et al. |
| RE37,044 E | 2/2001 | Wu |
| 6,192,058 B1 | 2/2001 | Abeles |
| 6,198,757 B1 * | 3/2001 | Broutin et al. ................. 372/32 |
| 6,205,159 B1 | 3/2001 | Sesko et al. |
| 6,215,802 B1 | 4/2001 | Lunt |
| 6,229,835 B1 | 5/2001 | Tomaru et al. |
| 6,243,517 B1 | 6/2001 | Deacon |
| 6,246,480 B1 | 6/2001 | O'Brien |
| 6,249,364 B1 | 6/2001 | Martin et al. |
| 6,249,365 B1 | 6/2001 | Mizrahi et al. |
| 6,252,718 B1 | 6/2001 | Lefevre |
| 6,282,215 B1 | 8/2001 | Zorabedian et al. |
| 6,301,274 B1 | 10/2001 | Tayebati et al. |
| 6,301,280 B1 | 10/2001 | Broutin et al. |
| 6,304,586 B1 | 10/2001 | Pease et al. |
| 6,314,115 B1 | 11/2001 | Delfyett et al. |
| 6,321,011 B2 | 11/2001 | Deacon |
| 6,324,204 B1 | 11/2001 | Deacon |
| 6,330,253 B1 | 12/2001 | Tuganov et al. |
| 6,331,892 B1 | 12/2001 | Green |
| 6,337,660 B1 | 1/2002 | Esman et al. |
| 6,366,592 B1 | 4/2002 | Flanders |
| 6,366,689 B1 | 4/2002 | Rao et al. |
| 6,404,538 B1 | 6/2002 | Chen et al. |
| 6,404,798 B1 * | 6/2002 | Leckel et al. ................ 372/108 |
| 6,428,173 B1 * | 8/2002 | Dhuler et al. ................ 359/872 |
| 6,441,933 B1 | 8/2002 | Jang |
| 6,463,085 B1 | 10/2002 | Tayebati |
| 6,493,365 B1 * | 12/2002 | Wu et al. ..................... 372/20 |
| 6,532,091 B1 | 3/2003 | Miyazaki et al. |
| 2002/0048297 A1 | 4/2002 | Irie et al. |
| 2002/0126345 A1 | 9/2002 | Green et al. |
| 2002/0136104 A1 | 9/2002 | Daiber |

FOREIGN PATENT DOCUMENTS

| | | | | |
|---|---|---|---|---|
| JP | 06188497 | 12/1992 | ........... | H01S/3/105 |
| JP | 09318888 | 12/1997 | ........... | G02B/26/08 |
| JP | 10178240 | 6/1998 | ............. | H01S/3/18 |
| WO | WO 99/37013 | 7/1999 | ............. | H02N/1/00 |
| WO | WO 00/36447 | 6/2000 | ............ | G02B/6/35 |
| WO | WO 00/36740 | 6/2000 | ............ | H02N/1/00 |
| WO | WO 00/62410 | 10/2000 | ............ | H02N/1/00 |

OTHER PUBLICATIONS

Favre, F. et al., "External Cavity Semiconductor Laser", *Electronics Letters*, Jan. 17, 1991, vol. 27, No. 2, pp. 183–184.

MacLeod, H.A., "Thin–Film Optical Filters, Second Edition", McGraw–Hill, 1989, pp. 244–269.

Ketelsen, L.J.P., "Simple Technique for Measuring Cavity Loss in Semiconductor Lasers", *Electronic Letters*, Aug. 18, 1994, vol. 30, No. 17, pp. 1422–1424.

Mellis, J. et al., Miniature Packaged External–Cavity Semiconductor Laser with 50 GHz Continuous Electrical Tuning Range, *Electrical Lettes*, Aug. 4, 1988, vol. 24, No. 16, pp. 988–989.

Scobey, M., et al., "Stable Ultra–Narrow Bandpass Filters", *SPIE*, vol. 2262, pp. 37–46.

Shtengel, G. E., et al., "Internal Optical Loss Measurements in 1.3 μm InGaAsP Lasers", *Electronic Letters*, Jul. 6, 1995, vol. 31, No. 14, pp. 1157–1159.

Siegman, A.E., "LASERS", *University Science Books*, Chapter 11: Laser Mirrors and Regenerative Feedback, Section 11.5 Optical–Cavity Mode Frequencies, pp. 432–440.

Takahashi, H., "Temperature Stability of Thin–Film Narrow–Bandpass Filters Produced by Ion–Assisted Deposition", *Applied Optics*, Feb. 1, 1995, vol. 34, No. 4, pp. 667–675.

"Batch–Fabricated Area–Efficient Milli–Actuators", L.–S. Fan, S.J. Woodman, R.C. Moore, L. Crawforth, T.C. Reiley, M.A. Moser, pp. 38–42, 0–9640024–0–X, Solid–State Sensor and Actuator Workshop, Hilton Head, South Carolina, Jun. 13–16, 1994.

"Dual Axis Operation of a Micromachined Rate Gyroscope", Thor Juneau, A.P. Pisano, James H. Smith, pp. 883–886, 0–7803–3829–4/97 IEEE, Transducers '97, 1997 International Conference on Solid–State Sensors and Actuators, Chicago, Jun. 16–19, 1997.

"Angular Micropositioner for Disk Drives", David A. Horsley, Angad Singh, Albert P. Pisano, Roberto Horowitz, pp. 454–459, 0–7803–3744–1/97 ©1997 IEEE.

* cited by examiner

TUNABLE LASER WITH MICROACTUATOR

CROSS-REFERENCE TO RELATED APPLICATION

THIS APPLN CLAIMS BENEFIT OF No. 60/167,937 Nov. 29, 1999; AND CLAIMS BENEFIT OF No. 60/167,951 Nov. 29, 1999; AND CLAIMS BENEFIT OF No. 60/174,562 Jan. 5, 2000; AND CLAIMS BENEFIT OF Ser. No. 09/491,429 Jan. 26, 2000 WHICH CLAIMS BENEFIT OF No. 60/154,899 Sep. 20, 1999; AND CLAIMS BENEFIT OF No. 60/227,933 Aug. 25, 2000 AND CLAIMS BENEFIT OF No. 60/234,042 Sep. 20, 2000.

FIELD OF THE INVENTION

The present invention relates to tunable lasers and more particularly to tunable lasers for use in the telecommunications industry.

BACKGROUND

In telecommunications networks that utilize wavelength division multiplexing (WDM), widely tunable lasers enable transmission of information at different wavelengths. Many proposed network configurations require transmitters that can be tuned to transmit at any of N distinct wavelengths. Even in networks where the individual transmitter wavelengths are held fixed, tunable sources are desirable for maintaining stability of the wavelength. Also, because the same part can be used for any channel, a tunable transmitter is useful from an inventory control perspective.

One prior art tunable laser design, disclosed in U.S. Pat. No. 5,771,252, uses an external optical cavity. As disclosed therein, a laser diode is used in combination with a diffraction grating and a rotating mirror to form an external optical cavity. The diffraction grating is fixed. As the mirror is rotated, light propagating within the optical cavity is fed back to the laser diode. The feedback causes the laser diode to "lase" with a changeable frequency that is a function of the rotation angle of the mirror. Unless accounted for, the frequency of the laser may "mode hop" due to the distinct, spatial longitudinal modes of the optical cavity. It is desirable that the longitudinal mode spectrum of the output beam of the laser diode change without discontinuities. This condition may be satisfied by careful selection of the pivot point about which the mirror is rotated, whereby both the optical cavity length and the grating feedback angle can be scanned such that the single pass optical path length of the external optical cavity is equal to the same integer number of half-wavelengths available across the tuning range of the laser cavity. If this condition is satisfied, rotation of the mirror will cause the frequency of the output beam to change without discontinuities and at a rate corresponding to the rotation of the mirror. U.S. Pat. No. 5,319,668 also describes a tunable laser. Both U.S. Pat. Nos. 5,771,252 and 5,319,668 disclose an expression for an optical cavity phase error, which represents the deviation in the number of wavelengths in the cavity from the desired constant value as a function of wavelength. The expression for optical cavity phase error includes terms related to the dispersion of the laser and other optical elements. U.S. Pat. No. 5,771,252 teaches a pivot point whereby the cavity phase error and its first and second derivatives with respect to the wavelength all go to zero at the center wavelength. For all practical purposes, the two methods describe the same pivot point.

The grating-based external cavity tunable laser (ECLs) of U.S. Pat. No. 5,771,252 is a relatively large, expensive device that is not suitable for use as a transmitter in a large-scale WDM network. Because of the size and distance between components, assembly and alignment of the prior art ECL above is difficult to achieve. Known prior art ECLs use stepper motors for coarse positioning and piezoelectric actuators for fine positioning of wavelength selective components. Because piezoelectric actuators exhibit hysteresis, precise temperature control is needed. In addition, prior art ECL lasers are not robust in the presence of shock and vibration.

Another prior art tunable laser design utilizes a Vertical-Cavity Surface-Emitting Laser (VCSEL). In one embodiment of this device, a MEMS (micro-electro-mechanical-system) mirror device is incorporated into the structure of the VCSEL and is used to tune the wavelength of the laser. Wide tuning range has been demonstrated in such devices for operation around 830 nanometers, but so far the development of a reliable, high performance VCSEL at 1550 nanometers has proved elusive. This device is very difficult to build because the MEMS device must be physically incorporated into the structure of the VCSEL. Furthermore, development of the MEMS actuators in InP-based materials is a formidable challenge.

In other prior art, angular motors have been used in angular gyroscopes and as fine tracking servo actuators for magnetic heads for disk drives. In "Angular Micropositioner for Disk Drives," D. A. Horsley, A. Singh, A. P. Pisano, and R. Horowitz, Proceedings of the $10^{th}$ Int. Workshop on Micro Electro Mechanical Systems, 1997, p. 454–458, a deep polysilicon device is described with radial flexures extending from a central fixed column, and radial, parallel plate electrodes that effect rotation of less than 0.5 degree. Batch Fabricated Area Efficient Milli-Actuators, L.-S. Fan, et. al., Proceedings 1994 Solid State Sensor and Actuator Workshop, Hilton Head, p. 38–42 shows a rotary flexural actuator with what appears to be two central flexures from central supports; the rotational range is not given but appears to be small. Dual Axis Operation of a Micromachined Rate Gyroscope, T. Juneau, A. P. Pisano, and J. H. Smith, Proceedings 1997 Int. Conf. On Solid State Sensors and Actuators, V.2, pp. 883–890 describes a polysilicon, surface micromachined gyro, which has four radial springs supporting a central circular mass. The springs are supported on the outside, and have a small strain relief feature. The angular drive range is not specified, but appears to be small. All of these prior art devices provide limited angular range. These prior art devices completely fill a circular area in a plan view, thus making it difficult or impossible to arrange such an actuator to provide a remote pivot location, as is required by ECLs.

Tunable Distributed Bragg Reflector (DBR) lasers are currently commercially available, however, these lasers have a limited tuning range. Total tuning of about 15 nanometers and continuous tuning without mode hops over about 5 nanometers range is typical.

A tunable laser based on sampled grating DBR technology is presently available. The DBR device is tunable over about 50 nanometers, but the fabrication is difficult and the control electronics are complex, requiring four different control currents.

Another prior art approach to making a tunable laser is to fabricate multiple Distributed Feedback (DFB) lasers on a single chip and couple them together with an arrayed waveguide structure. Each DFB is fabricated with a slightly different grating pitch so that each lases at a slightly different wavelength. Wavelength tuning is accomplished by activating the laser that matches the particular wavelength of interest. The main problems with this approach are cost and insertion loss. Furthermore, fabrication of multiple lasers on the same chip with different operating wavelengths may require direct e-beam writing of the gratings. Also, if one wants to cover a very wide tuning range, the number of lasers required is prohibitively large.

Additionally, the multiple laser approach is lossy because coupling N lasers together into one output waveguide results in an efficiency proportional to 1/N.

What is needed, therefore, is a tunable laser that provides advantages over the prior art.

SUMMARY OF THE INVENTION

In general, a tunable laser is provided comprising a laser source for providing light with a wavelength along an optical path. A diffractive element is positioned in the optical path and spaced from the laser source for redirecting the light received from the laser source. A reflective element is positioned in the optical path and spaced from the diffractive element for receiving the light redirected by the diffractive element and for further redirecting the light back along the optical path to the reflective element. The diffractive element receives the light further redirected by the reflective element and returns the light along the optical path to the laser source. The optical path created by the laser source, the diffractive element and the reflective element causes the light to lase at the wavelength. At least one microactuator is coupled to one of the diffractive element and the reflective element for moving such element to select the wavelength of the light. A variety of microactuators that can be used with the tunable laser are provided.

BRIEF DESCRIPTION OF THE DRAWINGS

The accompanying drawings, which are somewhat schematic in many instances and are incorporated in and form a part of this specification, illustrate several embodiments of the invention and, together with the description, serve to explain the principles of the invention.

DETAILED DESCRIPTION OF THE INVENTION

Figure 1:
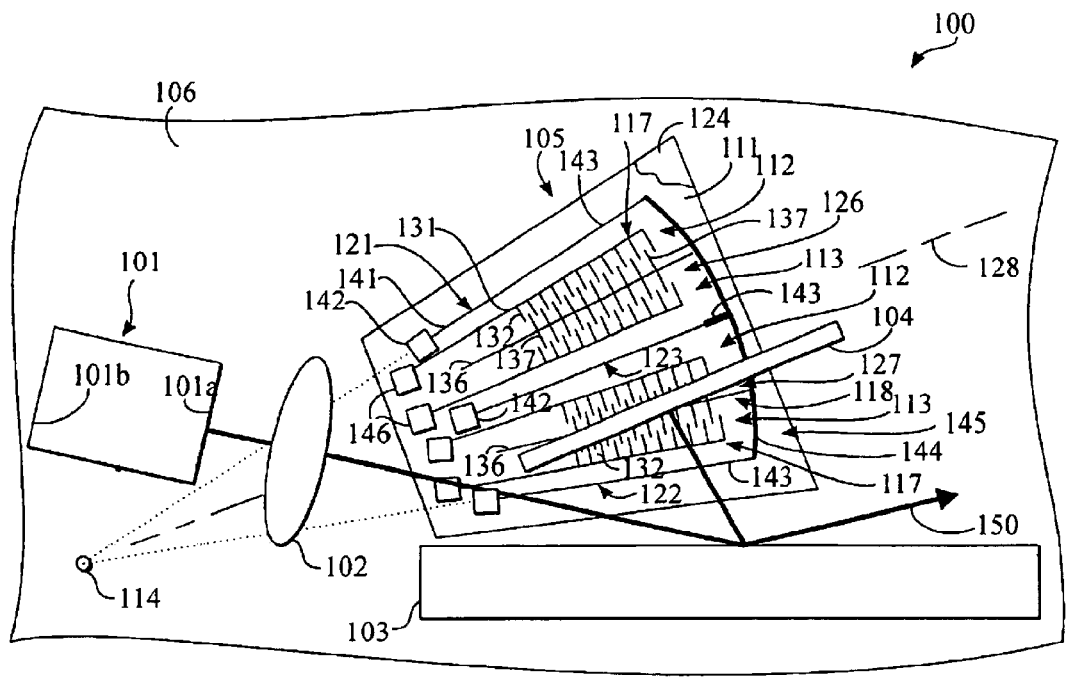
FIG. 1 shows a schematic plan view, partially cut away, of a tunable laser with microactuator of the present invention.

Referring now to FIG. 1, there is seen a preferred embodiment of a micro-electro-mechanical-system (MEMS) based widely-tunable external cavity laser (ECL) of the present invention. Advantages of the present invention over that of the prior art that will be apparent from the description provided below include: the ability to use commonly available inexpensive Fabry-Perot (FP) laser diodes; high operating frequencies; wide operating bandwidth; reduced size and mass; thermal and mechanical stability; precise alignment of optical components made simple by use of photolithographically-defined features in a silicon substrate; high production yields; and simple output frequency control schemes. Other advantages will become apparent from a reading of the following description of the present invention.

A widely-tunable laser (ECL) or tunable laser 100 of the present invention includes a laser or laser source 101, a collimating lens 102, any suitable surface relief configuration such as a diffraction element 103, a reflector 104 and a MEMS-based actuator 105. The laser source 101, collimating lens 102, diffraction element or grating 103 and microactuator 105 are all carried by a mounting block, made from any suitable material such as ceramic. The reflector 104 is mounted on microactuator 105. Laser source 101 has a first or front facet 101a and a second or rear facet 101b that together define an internal cavity. The laser source 101 is a single output laser in that the outgoing laser beam exits front facet 101a of the laser source. A highly reflective coating is providing on the rear facet 101b and an anti-reflective or AR coating is provided on the front facet 101a.

In the preferred embodiment, the laser source 101 is preferably a laser diode and more preferably a Fabry-Perot laser diode and the reflector 104 is preferably a retroreflector. The reflector 104 utilizes a high reflectivity coating on its surface. In the preferred embodiment, the grating 103 is replicated in glass, which provides several advantages compared to traditional polymer gratings, including thermal stability, replication and stability using thin substrates, and the ability to be handled, diced, cleaned and otherwise processed. The diffraction grating can be provided with any suitable groove configuration, and any groove configuration disclosed herein is merely exemplary. Grating 103 preferably has an efficiency of 50%, so that 50% of the light reflected from the grating and 50% of the light goes into the first diffracted order.

In the preferred embodiment, the reflector actuator 105 is a rotary actuator and preferably a rotary electrostatic microactuator. Microactuator 105 can be constructed in the manner disclosed in U.S. Pat. No. 5,998,906 and in International Publication No. WO 00/36740 that published on Jun. 22, 2000, the entire contents of each of which are incorporated herein by this reference. More specifically, microactuator 105 is formed on a substrate 111. A plurality of first and second comb drive assemblies 112 and 113 are carried by substrate 111 for pivoting reflector 104 in first and second opposite angular directions about an axis of rotation extending perpendicular to planar substrate 111 and through a virtual pivot point 114. Each of the first and second comb drive assemblies 112 and 113 includes a first comb drive member or comb drive 117 mounted on substrate 111 and a second comb drive member or comb drive 118 overlying the substrate 111. First, second and third spaced-apart spring members or springs 121, 122 and 123 are included in microactuator 105 for supporting or suspending second comb drives 118 over substrate 111 and for providing radial stiffness to the movable second comb drives 118 and thus reflector 104 carried thereby.

Substrate 111 is made from any suitable material such as silicon and is preferably formed from a silicon wafer. The substrate has a thickness ranging from 200 to 600 microns and preferably approximately 400 microns. First and second comb drive assemblies 112 and 133 and suspension beams or springs 121–123 are formed atop the substrate 111 by a second or top layer 124 made from a wafer of any suitable material such as silicon and secured to the substrate 111 by any suitable means such as fusion bonding. First and second comb drive assemblies 112 and 113 and springs 121–123 are formed from top wafer 124 by any suitable means and preferably by means of deep reactive ion etching (DRIE) techniques or the Lithographie Gavanometrie and Abformung (LIGA) process, which permit such structures to have a high aspect ratio and thus enhance the out-of-plane stiffness of such structures.

Although a variety of configurations of first and second comb drive assemblies 112 and 113 can be provided, microactuator 105 is shown as having two sets 126 and 127 of first and second comb drive assemblies 112 and 113 disposed symmetrically about a centerline 128 extending radially outwardly from virtual pivot point 114. Each comb drive assembly set 126 and 127 includes one first comb drive assembly 112 and one second comb drive assembly 113 extending radially outwardly from the pivot point 114. Each of the first and second comb drive assemblies 112 and 113 has a length ranging from 300 to 3000 microns and more preferably approximately 1000 microns.

First comb drives 117 of first and second comb drive assemblies 112 and 113 are rigidly mounted to substrate 111. Each of the first comb drives 117 has a radially-extending bar 131 and a plurality of comb drive fingers 132 extending from one side of the bar in radially spaced-apart positions along the length of the bar or truss 131. The comb drive fingers 132, shown schematically in FIG. 1, can have a variety of shapes and configurations including the exemplary configurations shown in U.S. Pat. No. 5,998,906 and in International Publication No. WO 00/36740. In the illustrated embodiment of microactuator 105, each comb drive finger 132 is joined substantially perpendicularly to the bar 131 and extends from the bar substantially along an arc that preferably has a center at virtual pivot point 114.

Second comb drives 118 of the first and second comb drive assemblies 112 and 113 are spaced above substrate 111 by an air gap so as to be movable relative to the substrate and first comb drives 117. The second comb drives 118 have a construction similar to the first comb drives 117 and, more specifically, are each made with a bar 136 that extends radially outwardly the from axis of rotation of microactuator 105 at virtual pivot point 114. A plurality of comb drive fingers 137 substantially similar to comb drive fingers 132 extend from one side of the bar in radially spaced-apart positions towards the corresponding first comb drive 117. The arcuate comb fingers 137 are offset relative to stationary comb fingers 132 so that the comb fingers 137 of the second comb drive 118 can interdigitate with the comb fingers 132 of the respective first comb drive 117 when the second comb drive 118 is pivoted or rotated about axis 114 towards the stationary first comb drive 117. The second comb drives 118 in each set 126 and 127 of comb drive assemblies in microactuator 105 are back-to-back and thus share a common bar or truss 136.

Means including springs 121–123 are provided in rotary electrostatic microactuator for movably supporting second comb drives 118 over substrate 111. First and second or outer springs 121 and 122 and third or central spring 123, which extends along radial centerline 128 of microactuator 105, each have a length approximating the length of first and second comb drive assemblies 112 and 113. Each of the springs 121–123, shown schematically in FIG. 1, has a first end portion 141 joined to substrate 111 by means of an anchor 142 and a second end portion 143 secured to an arcuate suspension member or shuttle 144 extending along the outer radial extremity of microactuator 105 between first and second springs 121 and 122. The outer radial extremities of second comb drive bars 136 are joined to rigid shuttle 144 and in this manner supported above substrate 111 by means of springs 121–123.

Rotary microactuator 105 has a radial dimension ranging from 500 to 5000 microns and more preferably approximately 2500 microns and has an angular dimension relative to pivot point 114 which can range from 20 to 120 degrees and is preferably approximately 45 degrees. Microactuator 105 is spaced from pivot point a distance ranging from 500 to 5000 microns and preferably approximately 2000 microns. Rotary microactuator 105 resembles a truncated or foreshortened sector of a circle that is spaced radially outwardly from virtual pivot point 114. The microactuator can also be described as having the shape of a truncated fan.

Second comb drives 118 of first and second comb drive assemblies 112 and 113 are movable in an angular direction of travel about virtual pivot point 114 by means of flexible springs 121–123. The second comb drives 118, shown in a first or rest position in FIG. 1, are movable in a first or counterclockwise direction so that first and second comb drives 117 and 118 of the first comb drive assemblies 112 move toward each other to a second position in which the respective movable comb fingers 137 substantially fully interdigitate with the respective stationary comb fingers 132. The second comb drives 118 are also movable in a second or clockwise direction from their first or intermediate position of FIG. 1 so that the first and second comb drives 117 and 118 of the second comb drive assemblies 113 move toward each other to a second position in which the respective movable comb fingers 137 fully interdigitate with the respective stationary comb fingers 132. When second comb drive assemblies 113 are in their second position, first comb drive assemblies 112 are in a third position in which the respective first and second comb drives 117 and 118 are spaced apart and fully disengaged. Each of the first and second comb drive assemblies 112 and 113 can thus be moved between a second position, in which comb fingers 132 and 137 are substantially fully interdigitated, through an intermediate position, in which the comb fingers 132 and 137 are not substantially fully interdigitated, to a third position, in which the comb fingers 132 and 137 are spaced apart and fully disengaged. When the first and second comb drives 117 and 118 of a comb drive assembly 112 or 113 are in their first or intermediate positions as shown in FIG. 1, respective comb fingers 132 and 137 can be fully disengaged or partially interdigitated and be within the scope of the present invention.

Reflector 104 is secured to the movable structure 145 of microactuator 105, that is second comb drives 118 and shuttle 144, and is preferably secured to the top of shuttle 144 and one or more of second comb drives 118 by any suitable means such as an adhesive. Reflector 104 can thus be moved by microactuator 105 in a counterclockwise direction about virtual pivot point 114 from its intermediate position shown in FIG. 1 to a position farther away from diffraction grating 103 when first comb drive assemblies 112 are substantially fully interdigitated and second comb drive assemblies 113 are not substantially fully interdigitated. Alternatively, the reflector can be moved about virtual pivot point 114 by the microactuator in a clockwise direction towards diffraction grating 103 when first comb drive assemblies 112 are not substantially fully interdigitated and second comb drive assemblies 113 are substantially fully interdigitated.

A controller and power source, not shown in FIG. 1, is provided for supplying suitable control signals, such as drive voltages, to microactuator 105 for rotating reflector 104 about virtual pivot point 114 when it is desired to adjust the wavelength of output beam 150 of tunable laser 100 or otherwise move the reflector 104 relative to the substrate 111. Movable structure 145 is electrically coupled to the controller by means of anchors 142, which further serve as bond pads. Bar 131 of each first comb drive 117 is joined at its inner radial extremity to a bond pad 146 which can be electrically coupled to the controller. Suitable electrical signals can be provided by the controller to movable structure 145 and first comb drives 117 for selectively moving reflector 104 relative to diffraction grating 103.

Means in the form of a closed loop servo control can optionally be included in tunable laser 100 for monitoring and maintaining the position of second comb drives 118 and thus reflector 104. For example, the controller can determine the position of the movable comb drives 118 by means of a conventional algorithm included in the controller or related control electronics for measuring the capacitance between comb drive fingers 137 of the movable comb drives 118 and comb drive fingers 132 of the stationary comb drives 117. A signal separate from the drive signal to the comb drive members can be transmitted by the controller to the microactuator for measuring such capacitance. Such a method does not require physical contact between the comb drive fingers. The wavelength of output beam 150 can be calibrated to the capacitance of the microactuator 105, and thus the wavelength of output beam 150 can be fixed over time with such capacitance sensing. This method of servo control can be implemented at low cost and does not require extra optical components. Because the capacitance of the microactuator 105 and performance of the capacitance-sensing electronics are temperature dependent, a thermal electric cooler (TEC) may be needed to stabilize the temperature of the tunable laser.

In the present invention, output beam 150 of tunable laser 100 preferably has a beam diameter of 0.25 millimeters. Light from the laser source 101 is directed through the lens 102 towards the grating 103, by the grating 103 towards the reflector 104, by the reflector 104 back towards the grating 103, and by the grating 103 back towards the laser source 101. The optical path traversed by the laser light between the front facet 101a of laser source 101 and the reflector 104 forms an external cavity, which causes an output beam 150 of the laser source 101 to lase at a particular wavelength that is a function of the rotation angle of the reflector 104. As can thus be seen, movement of reflector 104 by microactuator 105 determines the wavelength of the output beam 150 of the tunable laser. In the exemplary embodiment, the tunable laser 100 can be tuned over +/−26 nanometers with +/− two degrees of motion of the actuator or microactuator 105. Single-mode operation occurs when the spacing of the external cavity modes are greater than the line width of the grating 103. The line width of the grating 103 is determined by the angle of incidence and by the beam size. In an exemplary embodiment, the grating 103 line width is about 21 GHz and the external cavity modes are spaced by about 30 GHz. The ultimate line width is determined by the external cavity mode spacing and by the quality of the external cavity. In the exemplary embodiment, with high reflectivity coatings on the reflector 104 and on the rear facet of the laser source 101, the line width is less than 1 Mhz.

For optimum performance of the tunable laser 100, it is desired that the wavelength of the output beam 150 be continuously tunable, that is no mode hops occur as the laser source 101 is tuned over a range of wavelengths. This condition can be satisfied by selecting a virtual pivot point 114 about which the reflector 104 rotates, such that an optical path length of the cavity formed between a rear facet of the laser source 101 and the reflector 104 measured in integer number of half wavelengths remains constant over the desired tuning range.

Adequate performance of the present invention may be obtained by choosing a pivot point such that the cavity phase error and only the first derivative of the error go to zero at the center wavelength. This condition gives an acceptably accurate location for the pivot point. The virtual pivot point 114 of the present invention allows for a compact geometry and results in a lower-cost device with better optical performance than if a real pivot point, that is a pivot point through which the structure of the microactuator 105 extends, is used. Better optical performance is achieved because the compact geometry results in greater spacing of the external optical cavity modes and greater side-mode suppression.

In an exemplary embodiment, the optical path length of the external cavity, that is the aggregate optical path length between the rear facet of the laser source 101, the grating 103 and the front of the reflector 104, is approximately five millimeters; and the center wavelength, grating pitch, angle of incidence, and diffraction angle of the grating 103 are 1540 nanometers, 1000 lines per millimeter, 85 degrees, and 33 degrees, respectively. Although the overall tuning range of the tunable laser 100 is a function of the width of the gain curve of the laser source 101, which in the preferred embodiment of the present invention can be tuned over a range on the order of 40 nanometers, it is understood that a much broader gain profile may be achievable using, for example, a Fabry-Perot strongly-pumped quantum-well laser design, referenced in *Electronics Letters*, Vol. 26, No. 11, pp. 742–743, "External Grating Laser With Wide Tuning Range of 240 nm," by Epler et al.

Tunable laser 100 can be used in a telecommunications system, for example a fiber optic telecommunications system, to select a transmission wavelength and transmit information over that wavelength. The output beam 150 of the tunable laser 100 can be modulated directly to carry such information by varying the laser source 101 current in accordance with the data stream to be transferred. External modulation of the output beam 150 can also be utilized for transmitting the information.

Figure 2:
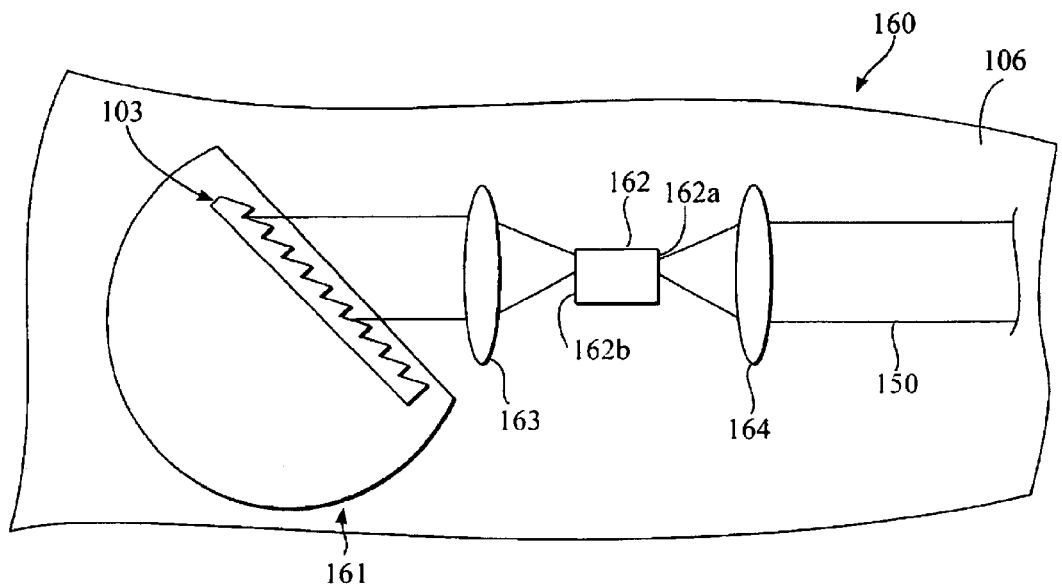
FIG. 2 shows a schematic plan view of another embodiment of a tunable laser with microactuator of the present invention.

Referring now to FIG. 2, there is disclosed an alternative embodiment of the tunable laser of the present invention. As illustrated in FIG. 2, it is envisioned that the present invention could be implemented in an alternative embodiment in which an external cavity tunable laser 160 is provided. Tunable laser 160 has similarities to tunable laser 100 and like reference numerals have been used to describe like components of tunable lasers 160 and 100. The tunable laser 160 has a MEMS microactuator 161 to pivot diffraction grating 103. Although diffractive element 103 is shown in FIG. 2 as having certain shaped grooves thereon, it should be appreciated that any suitable diffractive element can be utilized and that any grooves utilized on such a diffractive element can be of any suitable shape. Microactuator 161 is preferably a rotary microactuator, such as a rotary electrostatic microactuator, and more preferably a rotary electrostatic microactuator such as microactuator 105. Alternatively, microactuator 161 can be of the type disclosed in International Publication No. WO 00/36740. Grating 103 is mounted atop the movable structure of microactuator 161 in the manner discussed above with respect to tunable laser 100.

Tunable laser 160 shown in FIG. 2 further includes a laser source in the form of laser source 162, which is preferably a laser diode and more preferably a Fabry-Perot laser diode having opposite front and rear facets 162a and 162b. The laser source 162 is a dual output laser source in that an outgoing beam is provided at both the front and rear facets 162a and 162b. A first collimating lens 163 focuses the laser light from one end of laser source 101 onto grating 103 and a second collimating lens 164 focuses the outgoing laser beam 150. In tunable laser 160, because the grating 103 provides the reflective function of the reflector 104 of tunable laser 100, a reflector need not be used in tunable laser 160 and the optical cavity length can be reduced from the optical cavity length of tunable laser 100 shown in FIG. 1. It is easier to modulate a tunable laser at very high frequencies when a shorter external optical cavity length is utilized and therefore it is desirable to keep such external optical cavity length as short as possible. However, it may be more difficult to achieve single-mode operation of tunable laser 160, in comparison to tunable laser 100, because there is only a single-pass reflection of the output beam 150 from the grating 103 in tunable laser 160.

It should be appreciated that any of the tunable lasers disclosed herein can use a laser source having an electroabsorptive modulator for achieving high data transfer rates and be within the scope of the present invention. At high data rates a decrease in laser modulation response can occur. In this regard, a lifetime of a photon for a laser source, such as laser source 101 of tunable laser 100, is given by $1/(c \cdot \alpha)$, where c is the speed of light and $\alpha$ is the total loss of the photon distributed over the equivalent free-space cavity. In a solitary laser, a photon spends all its time in a highly absorbing medium so that the photon lifetime is short. In tunable laser 100, a photon spends a large fraction of time in loss-less free space so the lifetime of the proton is proportionally longer. When modulating tunable laser 100 at high frequency, it is desirable that the photons disappear when the current is turned off, which does not happen quickly when the lifetime of the photon is long.

Figure 3:
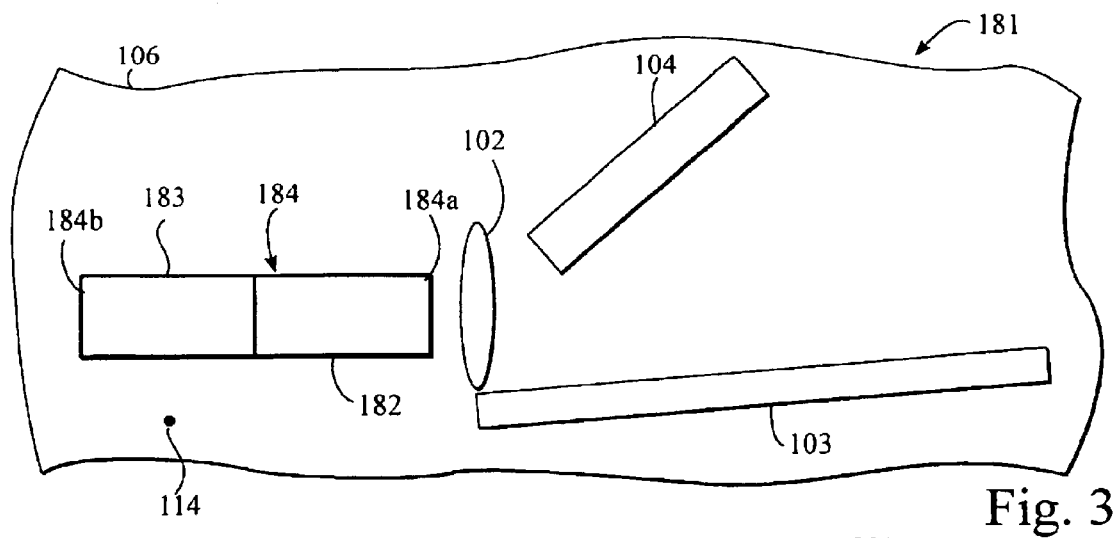
FIG. 3 shows a schematic plan view of a further embodiment of a tunable laser with microactuator of the present invention.

An exemplary embodiment of a tunable laser utilizing an electroabsorptive modulator is shown in FIG. 3 where a tunable laser 181 similar to tunable laser 100 is disclosed. Like reference numerals have been used to describe like components of tunable lasers 181 and 100. Reflector 104 in tunable laser 181 is pivoted about a virtual pivot point 114 in the same manner as in tunable laser 100. In the schematic drawing of FIG. 3, the microactuator for moving reflector 104 has not been shown for simplicity. It should be appreciated, however, that a suitable MEMS-based microactuator such as an electrostatic microactuator like microactuator 105 is included in tunable laser 181 for moving reflector 104 in the manner discussed herein.

Where a short photon lifetime is desired, an electroabsorptive modulator 182 can be positioned in the external optical cavity, preferably adjacent the front facet of the laser source of tunable laser 181. An advantage with this approach is that modulator 182 can be fabricated on the same chip as the laser source. In one preferred embodiment, shown in FIG. 3, a laser source 183 substantially similar to laser source 101 is provided, except that a modulator 182 is formed forwardly of the laser source 183 from the same chip 184 as the laser source 183. Chip 184 has a front facet 184a, which is the front facet of modulator 182, having an antireflective coating thereon, and a rear facet 184b, which is the rear facet of laser source 183, having a highly reflective coating thereon. The electroabsorptive or EA modulator 182 absorbs photons at a speed corresponding to its modulation frequency. In the exemplary embodiment of FIG. 3, EA modulator 182 is used to modulate output beam 150 at up to 10 gigabits/sec.

Figure 4:
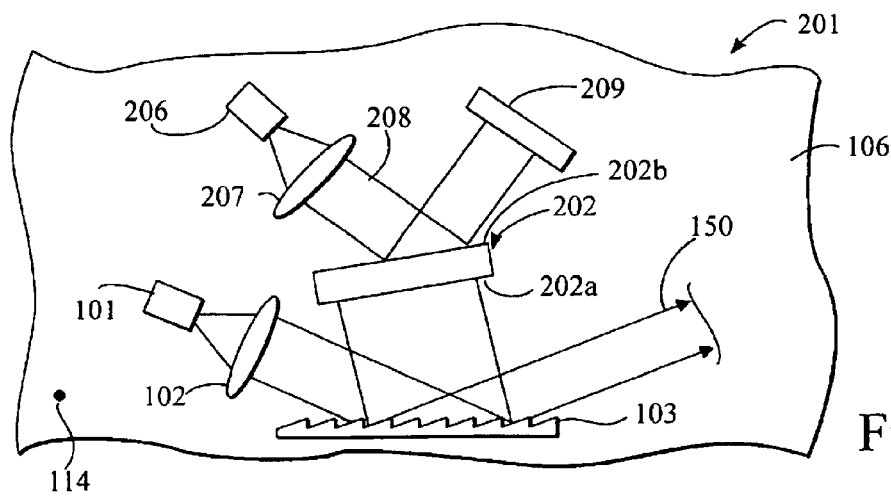
FIG. 4 shows a schematic plan view of yet another embodiment of a tunable laser with microactuator of the present invention.

Referring now to FIG. 4, a tunable laser 201 is shown that has similarities to the tunable lasers discussed above. Like reference numerals have been used to describe like components of tunable lasers 201, 100, 160 and 181. Tunable laser 181 includes a reflector 202 that is pivotable about virtual pivot point 114 in the same manner as reflector 104 by a microactuator that is preferably an electrostatic microactuator and more preferably a rotary electrostatic microactuator like electrostatic microactuator 105. The microactuator of tunable laser 201 is not shown in FIG. 4 for simplicity. The reflector 202 of tunable laser 201 has a first or front reflective surface 202a and an optional second or rear reflective surface 202b.

The tunable laser 181 includes wavelength monitoring means such as a secondary optical system for determining the position of reflector 202 and thus the wavelength of output beam 150. In this regard, an optional monitor laser source 206, which can be a laser diode of any suitable type such as laser source 101, and an optional additional focusing lens 207 for focusing the reference laser beam 208 from source 206 onto the rear reflective surface 202 are provided. An optional optical sensing device of any suitable type such as a position sensing device or PSD 209 is included for receiving the reflected beam from monitoring laser source 206.

Optical sensor or PSD 209 is calibrated with respect to grating 103 and reflector 202 so that the location on the PSD contacted by beam 208 determines the angle of the beam 208 relative to the reflector 202. The electrical signal from the PSD is used in a servo loop with a controller and power supply (not shown) to set the drive signal applied to microactuator 105. Reflector 202 can thus be properly positioned with respect to substrate 111 and diffraction grating 103. An advantage of this embodiment is that the wavelength of the reference beam 208 can be matched to the sensitivity of the commercially available PSD.

Figure 5:
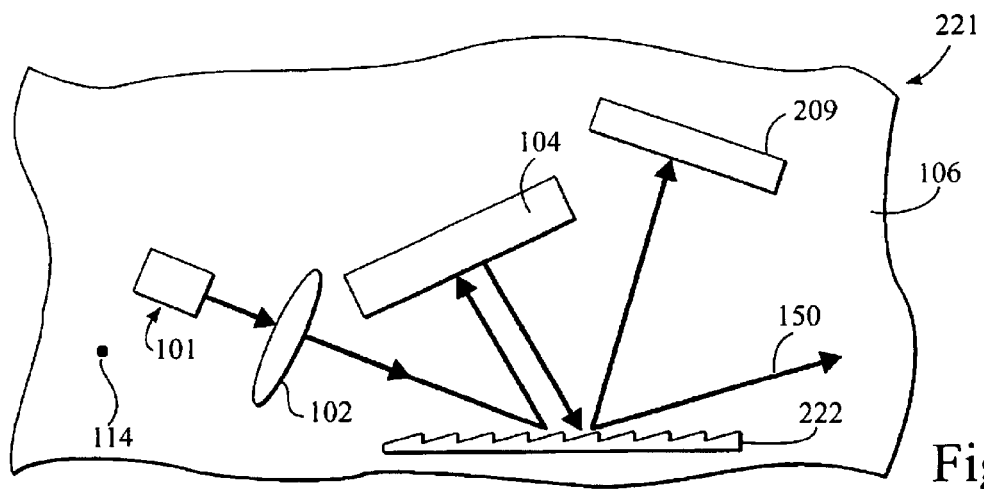
FIG. 5 shows a schematic plan view of yet a further embodiment of a tunable laser with microactuator of the present invention.

Referring now to FIG. 5, there is shown a further embodiment of the tunable laser of the present invention having an optional position sensing device or PSD for monitoring the wavelength of output beam 150. Tunable laser 221 of FIG. 5 has similarities to the tunable lasers disclosed above and like reference numerals have been used to describe like components of tunable lasers 221, 100, 110, 181 and 201. Reflector 104 of tunable laser 241 is pivotable about virtual pivot point 114 in the same manner as in tunable laser 100 by a microactuator that is preferably an electrostatic microactuator and more preferably a rotary electrostatic microactuator like electrostatic microactuator 105. The microactuator of tunable laser 221 is not shown in FIG. 5 for simplicity. Tunable laser 221 has as PSD 209 for receiving at least a portion of the light from laser source 101 to monitor the wavelength of light beam 150. The first order diffracted beam of tunable laser 221 is reflected from a suitable diffractive element such as diffraction grating 222 after reflection by the mirror 104 and is measured by PSD 209 to determine the wavelength of the output beam 150. The signal from the PSD is used in a servo loop with a controller and power supply (not shown) to set the drive signal applied to the microactuator of tunable laser 221.

Figure 6:
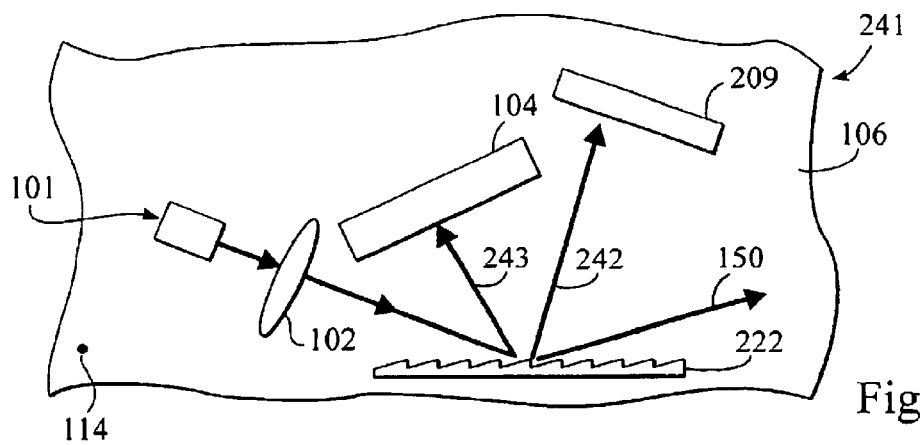
FIG. 6 shows a schematic plan view of another embodiment of a tunable laser with microactuator of the present invention.

Referring now to FIG. 6, there is shown another embodiment of the tunable laser of the present invention having an optional position sensing device or PSD for monitoring the wavelength of output beam 150. Tunable laser 241 of FIG. 6 has similarities to the tunable lasers disclosed above and like reference numerals have been used to describe like components of tunable lasers 241, 100, 160, 181, 201 and 221. Reflector 104 of tunable laser 241 is pivotable about virtual pivot point 114 in the same manner as in tunable laser 100 by a microactuator that is preferably an electrostatic microactuator and more preferably a rotary electrostatic microactuator like electrostatic microactuator 105. The microactuator of tunable laser 241 is not shown in FIG. 5 for simplicity. Either the first order beam 242 or the second order beam 243 can be directed to PSD 209 to measure the angle of reflector 104 and thus determine the wavelength of output beam 150. Diffraction grating 222 of laser 241 has grooves with a sufficient width such that both first and second order diffracted output beams are produced from the beam provided by laser source 101. The electrical signal from the PSD 209 is used in a servo loop with a controller and power supply (not shown) to set the drive signal applied to the microactuator of tunable laser 241 when a change in the wavelength of output beam 150 is required or an adjustment in the position of reflector 104 is otherwise needed. It should be appreciated that in tunable lasers 201, 221 and 241, the electrical signal provided by the PSD can in addition be used for servo control of the power of the laser source 101.

As discussed above with respect to tunable laser 100, a capacitance measurement of the microactuator can be used as an indication of the position of the attached reflector or microreflector and thus the wavelength of output beam 150. Such a capacitance measurement technique can be used with any of the tunable lasers of the present invention and can be used in addition to or alternatively of the measurement techniques disclosed with respect to tunable lasers 201, 221 and 241.

In yet another wavelength monitoring technique of the present invention, the wavelength of output beam 150 can be measured as a function of the capacitance behavior of the microactuator of the tunable laser at a number of different temperatures. A thermistor or other temperature sensor can be used to measure any suitable temperature of the tunable laser, such as the ambient temperature within the package or module containing the tunable laser. This temperature can be used, along with the desired wavelength of output beam 150, to determine the voltage or other control signal to the microactuator controlling the reflective element for servo control. For example, the drive signal for the microactuator controlling the reflector can be determined from a look-up table containing such signal as a function of the temperature of the tunable laser and the wavelength of the output beam 150. In an exemplary embodiment, a stability of better than one part in one thousand is achievable with capacitance sensing.

Figure 7:
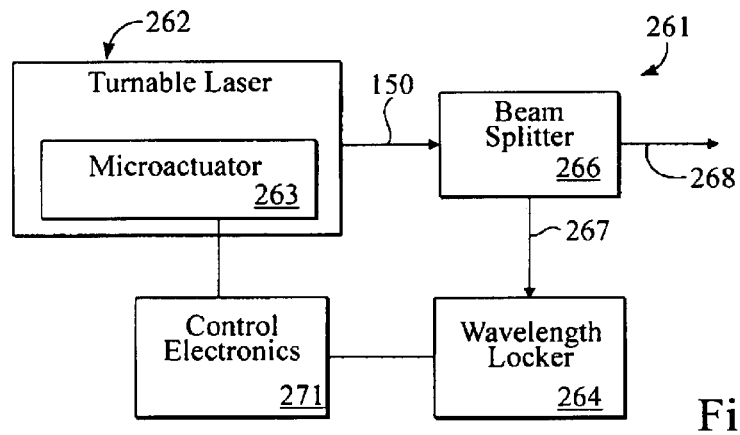
FIG. 7 shows a block diagram of a further embodiment of a tunable laser with microactuator of the present invention.

Referring now to FIG. 7, another embodiment of the wavelength monitoring means of the present invention is disclosed. The apparatus or system 261 disclosed in FIG. 7 includes a tunable laser 262, that can be any of the tunable lasers disclosed herein for providing a tunable output beam 150, and an optional wavelength measuring device or locker that can be external of the tunable laser 262. The tunable laser has a suitable microactuator 263, such as any of the type disclosed herein. At least a portion of the output beam is directed through an optional optical sensor or wavelength locker 264. In this regard, a beam splitter 266 is provided for diverting a portion 267 of the output beam to the wavelength locker. The remaining portion 268 of the beam 150 emerges from the beam splitter as a reduced intensity output beam. The wavelength locker is used to measure any deviation in the wavelength of tunable laser 262 from the desired wavelength. An error signal is supplied by the wavelength locker if any such deviation in wavelength is detected. The error signal may be used in a servo loop to set the voltage or other drive signal applied to microactuator 263. More specifically, the error signal is directed to a controller and power supply, referred to in FIG. 7 as control electronics 271, that is electrically coupled to the microactuator 263. A full discussion of wavelength locking techniques is set forth in the article "Wavelength Lockers Keep Lasers in Line", Photonics Spectra, February 1999, pp. 104–110 by Ed Miskovic.

It should be appreciated that similar techniques can be used to stabilize or measure the wavelength of output beam 150. System 261 can be used in addition to or as an alternative to the wavelength monitoring techniques discussed above with respect to tunable lasers 201, 221 and 241.

In one exemplary operation of system 261 having both coarse and fine servo control of the wavelength of output beam 150, capacitive sensing of the reflector microactuator can optionally be used by the control electronics 271, for example with a look-up table, to determine the coarse position of the microactuator as a function of the desired wavelength of output beam 150 and optionally the temperature of tunable laser 262. A wavelength locker, or other wavelength monitoring device, can thereafter be used by the control electronics 271, for example with another look-up table, to determine the fine position of the microactuator as a function of the error signal provided by the wavelength locker and optionally the temperature of the tunable laser 262.

Figure 8:
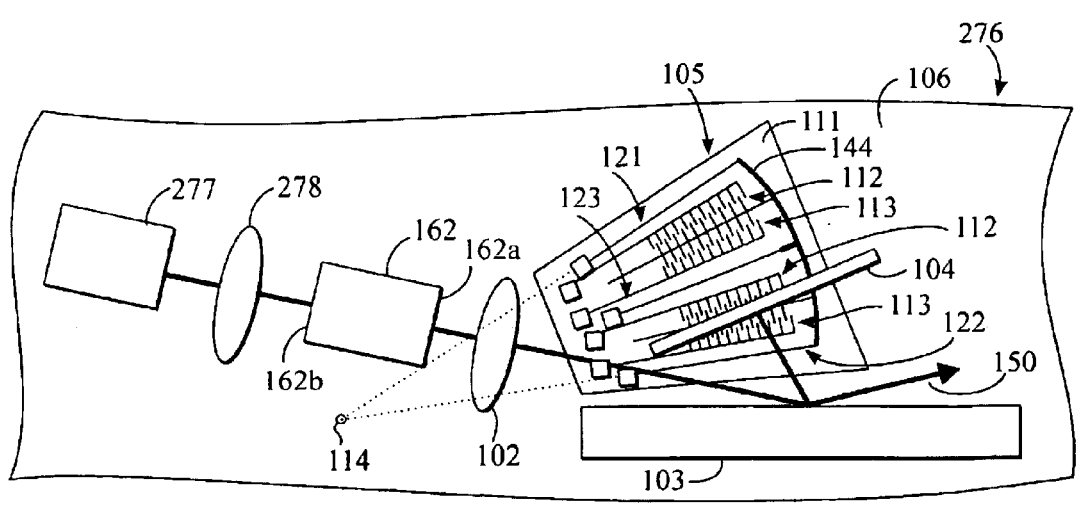
FIG. 8 shows a schematic plan view of another embodiment of a tunable laser with microactuator of the present invention that is similar to the tunable laser of FIG. 7.

A further embodiment of the wavelength monitoring means of the present invention is disclosed in FIG. 8, where a tunable laser 276 having similarities to tunable lasers 100 and 160 is shown with an internal optical sensor or wavelength locker 277. Like reference numerals have been used in FIG. 8 to describe like components of tunable lasers 276, 100 and 160. A reference beam 278 substantially identical to output beam 150 is directed from rear facet 162b of laser source 162 to wavelength locker 277, which is shown as being located internal of tunable laser 276. An additional collimating lens 279 is disposed between rear facet 162b of the laser source 162 and the wavelength locker 277 for focusing the laser light beam 278 from light source 162 onto the wavelength locker. In the manner discussed above with respect to tunable laser 261, wavelength locker 277 supplies an electrical signal corresponding to any deviation in the wavelength of reference beam 278 from the desired wavelength of output beam 150 to the controller providing the drive signal to microactuator 105. Reflector 104 is then moved to correct the deviation in wavelength of output beam 150. It should be appreciated that wavelength locker 277 can be external of the tunable laser 276 and be within the scope of the present invention. In addition, any of tunable lasers disclosed herein can be used with a dual output laser source 162 for monitoring and adjusting the wavelength of output beam 150 in the manner disclosed in FIG. 8.

Figure 9:
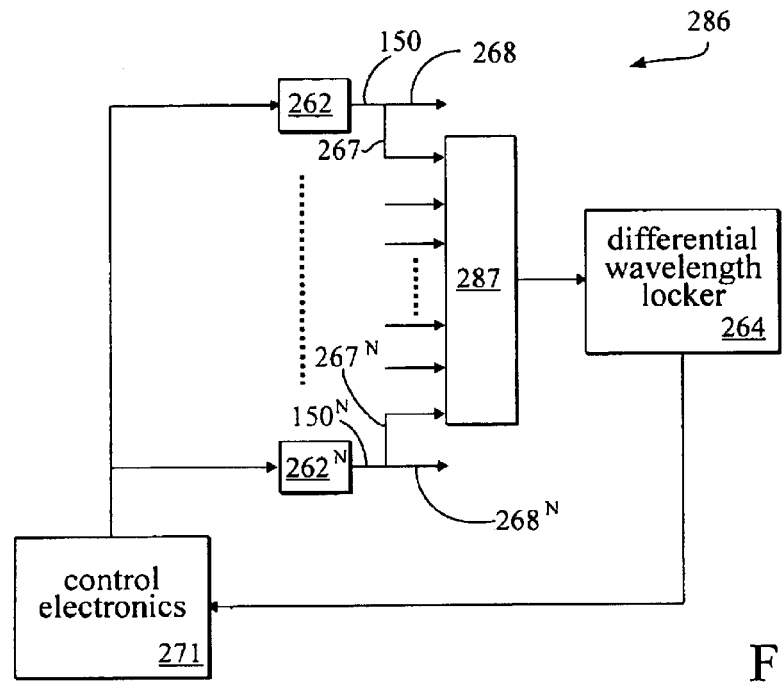
FIG. 9 shows a block diagram of yet another embodiment of a tunable laser with microactuator of the present invention that is similar to the tunable laser of FIG. 8.

Referring now to FIG. 9, an apparatus and system 286 similar to the system 261 shown in FIG. 7 and described above is illustrated. Like reference numerals have been used to describe like components of systems 286 and 261. System 286 includes a plurality of N tunable lasers 262. Only the first switch 262 and the last switch $262^N$ are shown in FIG. 9 for simplicity. A portion of the output beam 150 from each tunable laser 262 is directed by a beam splitter 268 to a 1×N switch 287. System 286 is particularly suited where the wavelength of the output beam 150 of each tunable laser 262 needs to be checked for stability only intermittently. Switch 287 is utilized to sequentially or otherwise selectively direct the diverted beam portion or monitor signal 267 from each of the tunable lasers 262 to a single wavelength calibrator/locker 264 to measure any deviation in the wavelength of output beam 150 from the desired wavelength. In the manner discussed above with respect to system 261, the error signal provided by wavelength locker 264 for the selected tunable laser 262 is used in a servo loop to set the voltage or other drive signal applied to microactuator 263 of the tunable laser 262. System 286 permits a single wavelength locker to be shared by the N tunable lasers 262 of system 286. Elimination of N−1 wavelength calibrators/lockers 264 represents a significant cost saving.

A further embodiment of the tunable laser of the present invention is disclosed in FIGS. 10–13. Tunable laser 501 includes a laser source 502 for producing an output beam 150. A collimating lens 503 is disposed adjacent laser source 502 and directs beam 150 onto a suitable diffractive element such as diffraction grating 504. A portion of beam 150 is directed by diffraction grating 504 onto a suitable reflective element such as reflector 506. The tunable laser includes at least one microactuator coupled to one of diffraction grating 504 and reflector 506 for moving such element to select the wavelength of laser beam 150. In one preferred embodiment, reflector 506 is pivotably mounted on a first microactuator 507. As shown most clearly in FIGS. 10 and 11, beam 150 comprises a first beam portion 150a extending between laser source 502 and collimating lens 503, a second beam portion extending between collimating lens 503 and diffraction grating 504, a third beam portion 150c extending between the diffraction grating 504 and the reflector 506 and a fourth beam portion 150d directed outwardly from tunable laser 501 by the diffraction grating 504. Third beam portion 150c consists of the diffracted portion of second beam 150b that, due to low incidence angle at which second beam portion contacts diffraction grating 504, is relatively wide as it is directed towards reflector 506. Third beam portion 150c is redirected back from the reflector 506 at a right angle to the reflector. Collimating lens 503 is optionally coupled to a second microactuator 508 which is capable of moving the collimating lens in a direction perpendicular to first and second beam portions 150a and 150b.

The components of tunable laser 501 are carried by a mounting block 511. The laser source 502 is secured to one end of a laser submount block 512 which, in turn, is secured to the top of a laser spacer block 513 attached to one corner of mounting block 511. The second microactuator 508 is secured to the mounting block 511 by means of a lens submount 514, that is attached to the block 511 next to the laser spacer block 513 and at one end of the mounting block 511. The collimating lens 503 is secured to microactuator 508 by a lens substrate or block 515. A mirror actuator submount block 516 is secured to the central portion of the mounting block 511 next to the laser spacer block 513. The first microactuator 507 is adhered to the top of one end of lens actuator submount 516. The diffraction grating 504 extends alongside lens actuator submount 516 and is secured directly to mounting block 511. The mounting block 511, the laser submount 512, the laser spacer block 513, the lens submount 514 and the lens actuator submount 516 are each made from any suitable material such as ceramic. As shown, tunable laser 501 has a length ranging from five to 25 millimeters and preferably approximately 12 millimeters, a width ranging from four to 15 millimeters and preferably approximately seven millimeters and a height ranging from three to ten millimeters and preferably approximately six millimeters.

Figure 14:
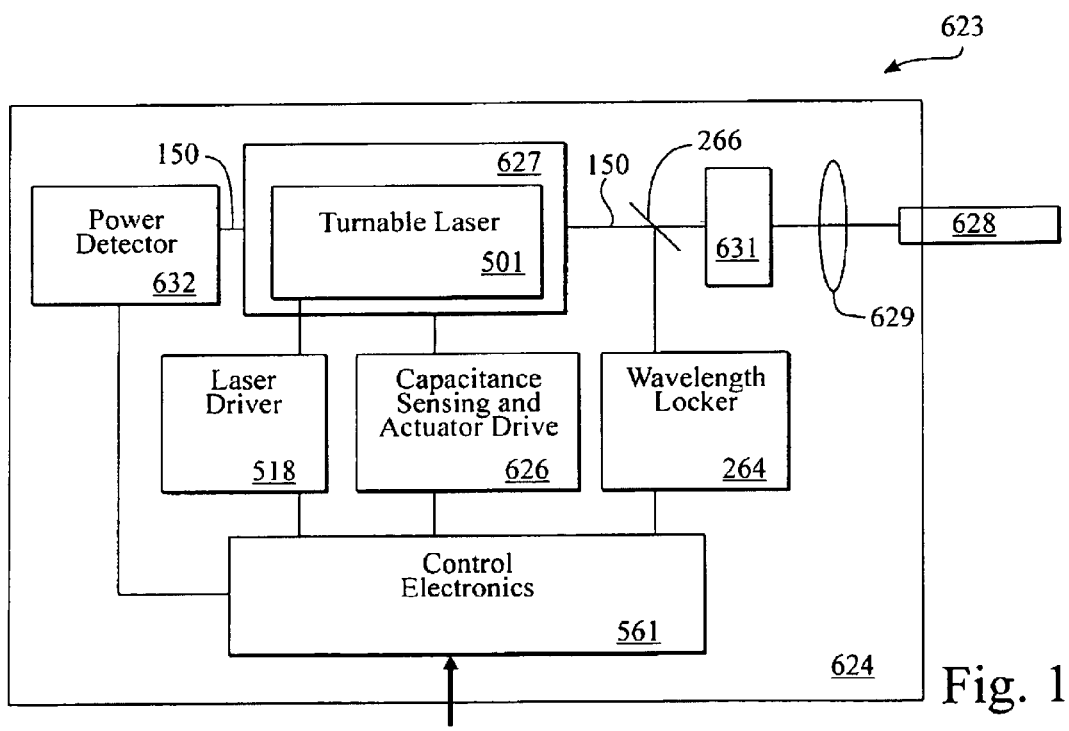
FIG. 14 shows a block diagram of a module containing a tunable laser with microactuator of the present invention.

Laser source 502 can be of any suitable type and is preferably a laser diode and more preferably a Fabry-Perot laser diode substantially similar to laser source 101 discussed above. Control signals are provided to laser source 502 by means of electrical leads (not shown) which connect to a plurality of electrical pads 517 provided on the top of laser spacer block 513. Suitable leads from a laser driver 518, not shown in FIG. 10 but shown in FIG. 14, are electrically secured to laser lead pads 517 for providing electrical control signals to the laser source 502.

Diffraction grating 504 can be of any suitable type, and, as shown, includes a block 521 having a front face 522 facing reflector 506. Face or surface 522 is ruled with a plurality of grooves (not shown) which can be of any suitable size and shape for diffracting second beam portion 150b. Grating 504 preferably has diffractive characteristics similar to diffraction grating 103.

First microactuator or motor 507 is preferably a MEMS-based microactuator of any suitable type and more preferably an electrostatic microactuator. A rotary or angular electrostatic microactuator is particularly preferred and such an electrostatic microactuator can be constructed in the manner disclosed in U.S. Pat. No. 5,998,906 and in International Publication No. WO 00/36740. The details of rotary electrostatic microactuator 507 are not shown in FIGS. 10 and 11. One preferred embodiment of rotary electrostatic microactuator is, however, shown in FIG. 12. In general, microactuator 507 is formed from a substrate 526 that extends substantially in a plane and is substantially similar to substrate 111 of tunable laser 100. A plurality of first and second comb drive assemblies 527 and 528 are carried by substantially planar substrate 526 and are arranged on the substrate in first and second sets 531 and 532. Each of the first and second comb drive assemblies includes a first comb drive member or comb drive 533 mounted on substrate 526 and a second comb drive member or comb drive 534 overlying the substrate 526. At least first and second spaced-apart suspension members or spring members are included in microactuator 507 for supporting or suspending second comb drives 534 over the substrate 526 and for providing radial stiffness to the movable second comb drives 534. As shown, first and second outer suspension members or springs 536 and 537 and a central suspension member or spring 538 are provided. Second comb drives 534 are part of a movable structure 539 overlying the substrate 526.

The substrate 526 is preferably formed from a silicon wafer having a thickness ranging from 400 to 600 microns and preferably approximately 400 microns. Springs 536–537, first and second comb drive assemblies 527 and 528 and the remainder of movable structure 539 are formed atop the substrate 526 by a second or top layer 542 made from a wafer of any suitable material such as silicon. Top layer or wafer 542 has a thickness ranging from 10 to 200 microns and preferably approximately 85 microns and is preferably fusion bonded to the substrate 526 by means of a silicon dioxide layer (not shown). The components of microactuator 507 are preferably etched from wafer 542 by deep reactive ion etching (DRIE) techniques or the Lithographie Gavanometrie and Abformung (LIGA) process for the reasons discussed above with respect to tunable laser 100. Springs 536–538 and movable structure 539 are spaced above the substrate 526 by an air gap (not shown), that ranges from 3 to 30 microns and preferably approximately 15 microns so as to be electrically isolated from the substrate 526.

First and second sets 531 and 532 of comb drive assemblies are symmetrically disposed about a radial centerline 543 of microactuator 507 and each include a first comb drive assembly 527 and a second comb drive assembly 528. Second comb drive assembly 528 of the first set 531 is disposed adjacent centerline 543 and first second comb drive assembly 527 of the second set 532 is disposed adjacent the centerline 543. A first comb drive assembly 527 is spaced farthest from centerline 543 in the first set 531 and a second comb drive assembly 528 is spaced farthest from the centerline in the second set 532. Each of the comb drive assemblies 527 and 528 is centered along a radial line which intersects radial centerline 543 at the virtual pivot point (not shown) of microactuator 507. Each of the first and second comb drive assemblies 527 and 528 has a length ranging from 300 to 3000 microns and preferably approximately 1300 microns, and commences a radial distance from the pivot point of microactuator 507 ranging from 500 to 5000 microns and preferably approximately 2000 microns.

First comb drive 533 of each of first and second comb drive assemblies 527 and 528 is immovably secured to substrate 526. Each comb drive 533 has a radially-extending bar or truss 546 provided with a first or inner radial portion 546a and a second or outer radial portion 546b. A plurality of comb drive fingers 547 extend from one side of bar 546 in radially spaced-apart positions along the length of the bar. Comb drive fingers or comb fingers 547 can be of any suitable shape and are preferably approximately arcuate in shape. Comb fingers 547 extend perpendicularly from bar 546 and thereafter substantially arc along a radius that preferably commences at the axis of rotation or virtual pivot point of microactuator 507. In a preferred embodiment, piecewise linear segments are used to form the comb fingers 547 for approximating such an arcuate shape.

Second comb drives 534 are spaced above substrate 526 so as to be movable relative to the substrate and first comb drives 533. The second comb drives 534 have a construction similar to first comb drives 533 and, more specifically, are formed with a radially-extending bar or truss 551 having a first or inner radial portion 551a and a second or outer radial portion 551b. A plurality of comb drive fingers or comb fingers 552 extend from one side of bar 551 in radially spaced-apart positions along the length of the bar 551. Comb fingers 552 are substantially similar in construction and size to comb fingers 547 of the related comb drive assembly 527 or 528. Movable comb fingers 552 of each second comb drive 534 are offset relative to the respective stationary comb fingers 547 so that comb fingers 552 can interdigitate with comb fingers 547 when the second comb drive 534 is pivoted about the virtual pivot point or pivot point of microactuator 507 towards the respective first comb drive 533.

The inner radial portions 551a of the two second comb drive bars 551a in each of the first and second sets 531 and 532 of comb drive assemblies are rigidly interconnected by a connector bar or beam 553 that extends radially inside the respective first comb drives 533 of such set 531 or 532. The outer radial portions 551b of second comb drive assembly 528 in first set 531 and of first comb drive assembly 527 in second set 532 are rigidly interconnected so that the second comb drives 534 in microactuator 507 move in unison about the pivot point of such microactuator. Movable structure 539 includes second comb drives 534 and first and second connector beams 553 and has a thickness ranging from 15 to 200 microns and preferably approximately 85 microns.

Figure 12:
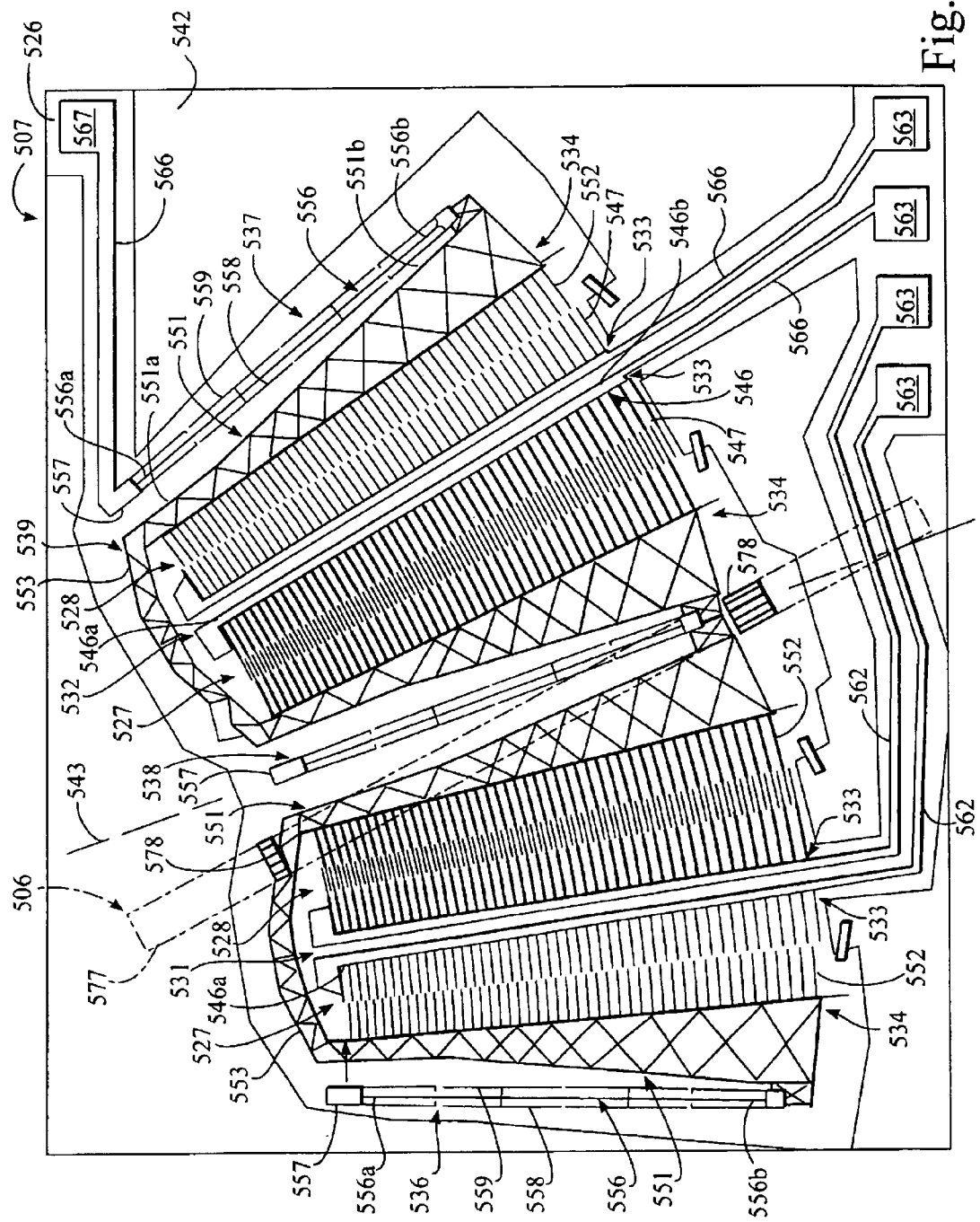
FIG. 12 shows an enlarged plan view, partially cut away and rotated 90°, of a portion of the tunable laser of FIG. 10 taken along the line 12—12 of FIG. 11.

Means including spaced-apart first and second outer springs 536 and 537 and optional central spring 538 are included within rotary electrostatic microactuator 507 for movably supporting second comb drives 534 and the remainder of movable structure 539 over substrate 526. First and second outer springs 536 and 537 are symmetrically disposed about radial centerline 543 and central spring 538 extends between first and second sets 531 and 532 of comb drive assemblies. Each of the springs 536–538, when in its rest position as shown in FIG. 12, is centered on a radial line extending through the virtual pivot point of microactuator 507. Central spring 538 extends along radial centerline 543. The springs are spaced approximately 20 to 30 degrees apart about the virtual pivot point of microactuator 507.

Each of the springs 536–538 is formed from a single beam-like spring member 556 having a first or inner radial end portion 556a and a second or outer radial end portion 556b. The inner radial end portion 556a of the spring member 556 is secured or coupled to substrate 526 at an anchor 557. The balance of the spring member 556 is spaced above the substrate by an air gap. The outer radial end portion 556b of outer springs 536 and 537 is secured or coupled to the outer radial extremity of the adjacent second comb drive bar 551 and the outer radial end portion 556b of central spring 538 is secured or coupled to the outer radial extremity of the adjacent second comb drive bars 551 forming the inner boundary of each of first and second sets 531 and 532 of comb drive assemblies. Each of the spring members 556 has a length ranging from 300 to 3000 microns and preferably approximately 1000 microns and has a width ranging from one to 20 microns and preferably approximately five microns. First and second elongate sacrificial bars 558 and 559 of the type described in U.S. Pat. No. 5,998,906 extend along opposite sides of each spring member 556 for ensuring even etching and thus the desired rectangular cross section of the spring member 556. Springs 536–538 each have a thickness similar to movable structure 539 and preferably the same as movable structure 539. Although three springs 536–538 are disclosed for microactuator 507, it should be appreciated that two such springs or greater than three such springs can be provided. In addition, although first and second comb drive assemblies 527 and 528 are shown and described as being disposed between outer springs 536 and 537, some or all of such comb drive assemblies 527 and 528 can be disposed outside of the springs 536 and 537.

Each of the second comb drives 534 of first and second comb drive assemblies 527 and 528 is movable in a first direction of travel about the pivot point of microactuator 507 between a first or intermediate position in which comb fingers 547 and 552 of the comb drive assembly are not substantially fully interdigitated and a second position in which such comb fingers 547 and 552 are substantially fully interdigitated. Each of the comb drive assemblies 527 and 528 is shown in FIG. 12 in the first position in which the comb fingers 547 and 552 of each comb drive assembly 527 and 528 are not substantially fully interdigitated. More specifically, comb fingers 547 and 552 of the second comb drive assembly 528 in first set 531 and of the first comb drive assembly 527 in second set 532 are partially interdigitated while in the first position and comb fingers 547 and 552 of the first comb drive assembly 527 in first set 531 and of the second comb drive assembly 528 in second set 532 are not interdigitated while in the first position. It can thus be seen that although comb fingers 547 and 552 can be partially interdigitated when a second comb drive 534 is in its first position, the comb fingers can alternatively be disengaged and thus not interdigitated when the second comb drive is in its first position. When in their second position, movable comb fingers 552 extend between respective stationary comb fingers 547. The movable comb fingers 552 approach but preferably do not engage stationary bar 546 of the respective first comb drive 533 and, similarly, the stationary comb fingers 547 approach but preferably do not engage movable bar 551 of the respective second comb drive 534.

Each of the second comb drives 534 of first and second comb drive assemblies 527 and 528 is also movable in a second direction of travel about the pivot point of microactuator 507 from the intermediate position shown in FIG. 12 to a third position in which the comb fingers 547 and 552 are spaced apart and fully disengaged (not shown). When comb fingers 547 and 552 of one comb drive assembly 527 or 528 in a set 531 or 532 are in the first position, the comb fingers of the other comb drive assembly 527 or 528 are in the third position. Thus each second comb drive 534 is movable between the second position, in which comb fingers 547 and 552 are substantially fully interdigitated, to the first or intermediate position, in which the comb fingers are not substantially fully interdigitated, to the third position, in which the comb fingers are fully disengaged and spaced apart.

Electrical means is included for driving the second comb drives 534 between their first and second positions. Such electrical means includes a suitable controller and preferably a controller and voltage generator 561, not shown in FIG. 12 but shown in FIG. 14, that is electrically connected to the first and second comb drives 533 and 534 of first microactuator 507. In this regard, the outer radial end portion 546b of each first comb drive bar 546 is electrically connected by means of a lead 562 to a bond pad 563 provided on a side of microactuator 507. Movable structure 539 is electrically connected by a lead 566 to a bond pad 567 also provided on a side of substrate 526. The lead 566 extends from such bond pad 567 to inner radial portion 556a of second spring 536. The bond pads 563 and 567 are electrically coupled by suitable wires or leads to a plurality of leads 568 formed on the top surface of actuator submount 516 (see FIGS. 10 and 11). A suitable plurality of electrical leads or wires (not shown) extend from leads 568 to controller 561.

Means in the form of a closed loop servo control can optionally be included in tunable laser 501 for monitoring the position of movable structure 539 relative to substrate 526. For example, controller 561 can include a conventional algorithm of the type discussed above with respect to microactuator 105 for measuring the capacitance between comb fingers 552 of movable comb drives 534 and comb fingers 547 of stationary comb drives 533.

The structural components of microactuator 507, that is movable structure 539, springs 536–538 and first comb drives 533, have the shape of a truncated fan when viewed in plan (see FIG. 12). In this regard, such components resemble a truncated or foreshortened sector of a circle, that is such components do not extend to the virtual pivot point of microactuator 507 but instead are spaced radially outwardly from such virtual pivot point. As such, the virtual pivot point of microactuator 507 intersects the plane of substrate 526 at a point outside the confines of the components of such actuator and more specifically outside the confines of movable structure 536. Springs 536 and 537 and movable structure 539 subtend an angle about the virtual pivot point of microactuator 507 of less than 180° and preferably less than 90°. In the specific embodiment of microactuator 507 shown in FIG. 12 and discussed above, springs 536 and 537 and movable structure 539 subtend an angle of approximately 45 degrees about such virtual pivot point.

Movable structure 539 is movable about the virtual pivot point of microactuator 507 in opposite first and second angular directions from its at rest or intermediate position shown in FIG. 12. When movable structure 539 moves in a counterclockwise direction about such virtual pivot point, second comb drives 534 of the second comb drive assembly 528 in each of the first and second sets 531 and 532 move to their respective second positions so that comb fingers 547 and 552 of the second comb drive assemblies 528 are substantially fully interdigitated. When movable structure 531 is moved in a clockwise direction about the virtual pivot point of microactuator 507, second comb drives 534 of the first comb drive assembly 527 in each of the first and second sets 531 and 532 move to their respective second positions so that comb fingers 547 and 552 of the first comb drive assemblies 527 are substantially fully interdigitated. Springs 536–538 provide radial rigidity to movable structure 539 for inhibiting snap over of interdigitated comb fingers 547 and 552.

Reflector 506 can be of any suitable type and is preferably formed from an elongate strip-like block 576 made from any suitable material such as silicon. A substantially planar surface or face 576 made form any suitable highly reflective material is provided on the front surface of block 576. The reflector can have a length ranging from 500 to 5000 microns and preferably approximately 2500 microns and a height ranging from 100 to 1000 microns and preferably approximately 400 microns. Reflector 506 is secured to movable structure 536 of microactuator 507 by any suitable means such as an adhesive or solder and extends perpendicularly to the microactuator. In this regard, first and second spaced-apart pads 578 are included on movable structure 539 for receiving first and second spaced-apart posts 579 that extend from the bottom of block 576 (see FIGS. 11 and 12). Springs can be used for securing the reflector 506 to the microactuator 507 in addition to or instead of posts 579. The positioning of reflector 506 on first microactuator 507 and the positioning of the first microactuator on mirror actuator submount 516 relative to diffraction grating 504 can be determined in the manner disclosed in U.S. Pat. Nos. 5,319,668 and 5,771,252.

Figure 13:
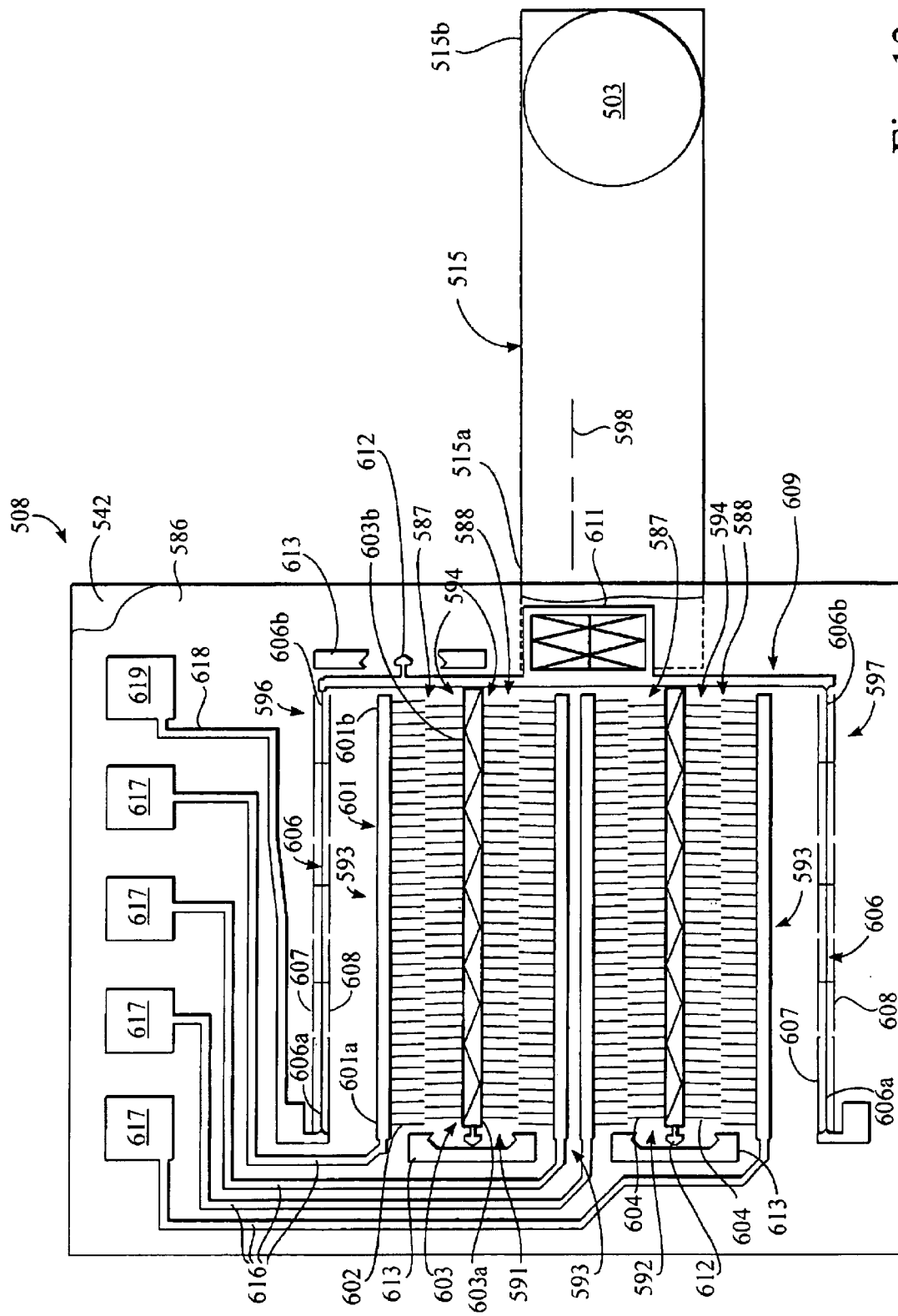
FIG. 13 shows an enlarged side elevational view, partially cut away, of a portion of the tunable laser of FIG. 10 taken along the line 13—13 of FIG. 11.

Second microactuator or motor 508 for moving collimating lens 503 is preferably a MEMS-based microactuator of any suitable type and more preferably an electrostatic microactuator A linear electrostatic microactuator can be utilized and constructed in the manner discussed above with respect to first microactuator 507. The details of a preferred linear electrostatic microactuator 508 for tunable laser 501 are shown in FIG. 13, where like reference numerals have been used to describe like components of microactuators 508 and 507. Microactuator 508 shown therein is formed from a planar substrate 586 substantially similar to substrate 526. A plurality of first and second comb drive assemblies 587 and 588, which are preferably linear comb drive assemblies, are carried by substrate 586 and arranged on the substrate in first and second sets 591 and 592. Each of the first and second comb drive assemblies 587 and 588 includes a first comb drive member or comb drive 593 mounted on substrate 586 and a second comb drive member or comb drive 594 overlying the substrate 586. At least first and second spaced-apart suspension members or spring members 596 and 597 are included in microactuator 508 for supporting or suspending the second comb drives 594 over the substrate 586 and for providing stiffness to the second comb drives 594.

Comb drive assembly sets 591 and 592 extend parallel to each other in symmetrical disposition relative to the longitudinal centerline 598 of microactuator 508. A single first comb drive assembly 587 and a single second comb drive assembly 588 are provided in each set 591 and 592 of comb drive assemblies. First comb drive 593 of each of first and second comb drive assemblies 587 and 588 is immovably secured to substrate 586 and has a longitudinally-extending bar or truss 601 having first and second end portions 601a and 601b. A plurality of comb drive fingers or comb fingers 602 extend from one side of bar 601 in longitudinally spaced-apart positions along the length of the bar. Comb fingers 602 can be of any type and are preferably of the type disclosed in International Publication No. WO 00/62410 having an International Filing Date of Apr. 12, 2000, the entire content of which is incorporated herein by this reference. Like the comb fingers therein, comb fingers 602 are slightly inclined from a 90° position relative to bar 601.

Second comb drives 594 are spaced above substrate 586 so as to be movable relative to the substrate and first comb drives 593. The second comb drives 594 have a construction similar to first comb drives 593 and, more specifically, are each formed with a longitudinally-extending bar or truss 603 having first and second end portions 603a and 603b. The second comb drives 594 of each set 591 and 592 are disposed back-to-back and, as such, share a bar 603. A plurality of comb drive fingers or comb fingers 604 extend from each side of bar 603 to form the back-to-back second comb drives 594 in each set 591 and 592. The comb fingers 604 on each side of the bar 603 are longitudinally spaced-apart along the length of the bar 603. Comb fingers 604 are substantially similar in construction and size to comb fingers 602. The comb fingers 604 of each movable comb drive 594 interdigitate with the comb fingers 602 of the related stationary comb drive 593 when the movable comb drive 594 is moved in a direction substantially perpendicular to longitudinal centerline 598.

First and second springs 596 and 597 are substantially similar in construction to springs 536–538 discussed above and each include a central spring member 606 and first and second sacrificial bars 607 and 608 extending parallel to the spring member along opposite sides of the spring member. Each spring member 606 has a first end portion 606a and a second end portion 606b. The first end portion 606a is secured or coupled to substrate 586. The second end portions 606a is secured or coupled to second comb drives 594. In this regard, an elongate bar or shuttle 609 extends between the free ends of first and second springs 596 and 597 in a direction substantially perpendicular to longitudinal centerline 598. The second end portion 606a of a spring member 606 is secured to each of the opposite ends of shuttle 609. Second end portion 603b of each second comb drive bar 603 is secured to shuttle 609 between springs 596 and 597. A mounting pad 611 is formed along one side of shuttle 609 for securing collimating lens 503 to the microactuator 507. In the foregoing construction of microactuator 507, first and second sets 591 and 592 of comb drive assemblies are disposed between first and second springs 596 and 597.

The second comb drives 594 of each of first and second comb drive assemblies 587 and 588 are movable in a first direction from their first or intermediate positions shown in FIG. 13, in which comb fingers 602 and 604 are not substantially fully interdigitated, to a second position, in which the comb fingers 602 and 604 are substantially fully interdigitated. The second comb drives 594 are also movable from their first position in an opposite second direction to a third position, in which the comb fingers 602 and 604 are spaced apart and fully disengaged. The interdigitation of first comb drive assemblies 587 of each set 591 and 592 serves to move shuttle 609 in a sideways direction substantially perpendicular to longitudinal centerline 598 to a first position relative to substrate 586 and the interdigitation of second comb drive assemblies 588 of each set 591 and 592 serves to move shuttle 609 in an opposite direction to a second position relative to the substrate 586. First and second springs 596 and 597 permit such movement and provide longitudinal rigidity to shuttle 609 and second comb drives 594 so as to inhibit snap over between comb fingers 602 and 604. Bumpers 612 are provided on the first end portions 603a of second comb drives 594 and on shuttle 609 for engaging respective stops 613 formed on substrate 586 to limit the sideways movement of second comb drives 594 and shuttle 609 and thus define the first and second positions of shuttle 609.

Electrical means is included for driving second comb drives 594 and shuttle 609 between their first and second positions. Such electrical means includes a controller that can be the same controller utilized for controlling first microactuator 507. Controller 561, not shown in FIG. 13 but shown in FIG. 14, is a suitable controller. An electrical lead or trace 616 extends from first end portion 601a of each first comb drive 593 to a bond pad 617 disposed along one side of substrate 586 for permitting electrical control signals to the first comb drives 593. An additional electrical lead or trace 618 extends from first end portion 606a of first spring 596 to a bond pad 619 disposed adjacent bond pads 617 for permitting electrical control signals to the movable second comb drives 594. Bond pads 617 and 619 are electrically coupled by suitable wires or leads (not shown) to a plurality of leads 621 formed on the top surface of lens submount 514 (see FIGS. 10 and 11). A suitable plurality of electrical leads or wires (not shown) extend from leads 621 to controller 561.

Figure 10:
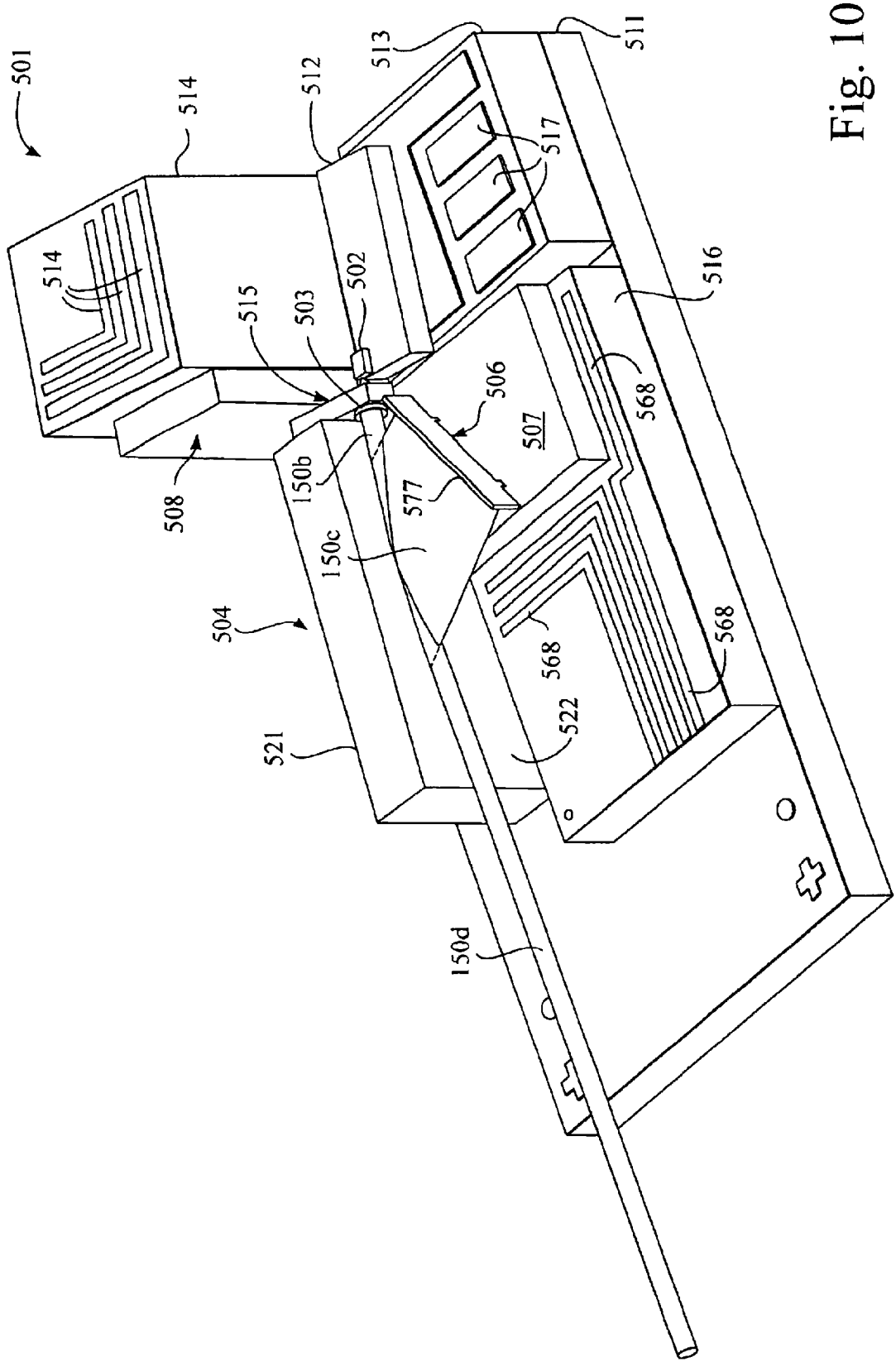
FIG. 10 shows a perspective view of a further embodiment of a tunable laser with microactuator of the present invention.
Figure 11:
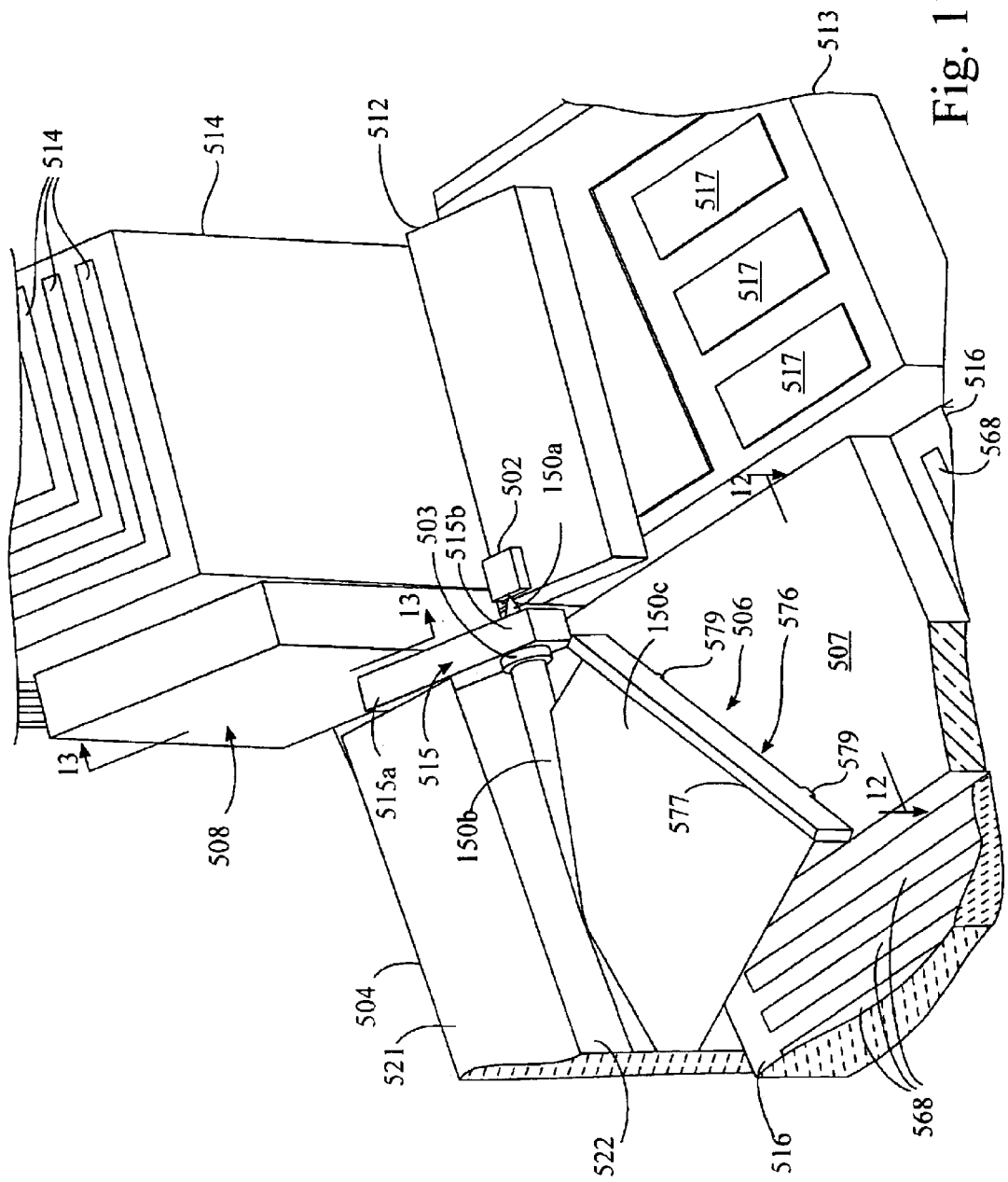
FIG. 11 shows an enlarged perspective view of a portion of the tunable laser with microactuator of FIG. 10.

Collimating lens block 515 is formed from an elongate block made from any suitable material such as silicon. Substrate 515 has first and second end portions 515a and 515b. The first end portion 515a is secured to mounting pad 611 by any suitable means such as an adhesive. Collimating lens 503 is secured to the second end portion 515b of the lens block 515. In a preferred embodiment, lens 503 is formed from the material of substrate 515 by etching the substrate 515. Movement of shuttle 609 to one of its first and second positions causes collimating lens 503 to move sideways relative to the longitudinal centerline 598 of microactuator 507. The microactuator 507 is mounted to lens submount 514, as shown in FIGS. 10 and 11, so that the sideways movement of shuttle 609 causes collimating lens 503 to move upwardly and downwardly relative to mounting block 511.

Means in the form of a closed loop servo control can optionally be included in tunable laser 501 for monitoring the position of second comb drives 594 and thus collimating lens 503. Although any suitable controls technique can be utilized, in one preferred embodiment a conventional algorithm of the type discussed above with respect to tunable laser 100 and first microactuator 507 is included in controller 561 for measuring the capacitance between comb finger 602 and 604 of second microactuator 508.

An exemplary module 623 for incorporating an external cavity tunable laser of the present invention is shown in FIG. 14. The module is shown with tunable laser 501 and includes package or support 624 for carrying the tunable laser, the laser driver 518 and control electronics or controller 561. The laser driver is coupled to the controller 561 and to laser source 502, while the controller is electrically coupled to first and second microactuators 507 and 508 of the tunable laser 501. A capacitance sensing and actuator drive 626 is provided and coupled to first and second microactuators 507 and 508 of tunable laser 501 and to controller 561. It should be appreciated that the capacitance sensing and actuator drive can be included in controller 561 as discussed above. An optional thermal electric cooler 627, or TE cooler, is included in module 623 where cooling of the tunable laser 501 is desired.

Output beam 150 is directed from the tunable laser to a fiber pigtail 628 mounted to support 624. A focusing or collimating lens 629 is disposed between the tunable laser and the fiber pigtail for coupling output beam into the fiber pigtail. Module 623 further includes a conventional isolator 631 disposed between the tunable laser 501 and the fiber pigtail 628 for inhibiting the reverse transmission of light into tunable laser 501. Optional beam splitter 266 and wavelength locker 264 are included in module 623, which can further include an optional power detector 632 such as a photodiode for measuring the power of output beam 150. The wavelength locker 264 and the power detector 632 are each coupled to controller 561 for providing electrical signals thereto. Module 623 is relatively compact and has a volume of 50 cubic centimeters or less.

In operation and use, tunable laser 501 can supply a laser beam of distinct wavelength, for example a wavelength in the range from approximately 1520 to approximately 1560 nanometers and preferably approximately 1540 nanometers, for use in an optical system such as in a telecommunications system and preferably a fiber optic telecommunications system. The tunable laser has an external cavity defined by the optical path traveled by output beam from laser source 502 to diffraction grating 504 and then to reflector 506, and back along the same path to the laser source.

The wavelength of output beam 150 is determined by the position of reflector 506 relative to front face 522 of diffraction grating 504. More specifically, wavelength tuning of tunable laser 501 is achieved by changing the pivot angle of reflector 506 to allow a unique diffracted wavelength to couple back into laser source 502, driving the lasing action at that particular wavelength. The gain bandwidth of laser source 502, the grating dispersion, and the external cavity mode structure all superimpose to determine the actual wavelength of output beam 150. In a preferred embodiment of tunable laser 501, the gain bandwidth of laser source 502 is greater than 40 nanometers, while the external cavity mode spacing is only 0.2 nanometers. Hence a large number of external cavity modes are supported by the gain medium of laser source 502. However, the spectral pass band (FWHM) of the diffraction grating peak is only 0.17 nanometers, so that the loss curve of diffraction grating 504 supports only a single external cavity mode.

First microactuator 507 serves to move the reflector 506 relative to diffraction grating 504 for selecting the wavelength of output beam 150 within the operational wavelength range of tunable laser 501. The reflector 506 simultaneously rotates and translates relative to diffraction grating 504 as the reflector pivots about the virtual pivot point of first microactuator 507. The pivoting of movable structure 539 of first microactuator 507 about the virtual pivot point of tunable laser 501 causes reflector 506 to rotate about an axis of rotation extending through the virtual pivot point perpendicular to the plane of microactuator substrate 526 and the plane of mounting block 511. The rotation of reflector 506 about the virtual pivot points causes the reflector to simultaneously rotate relative to diffraction grating 504 and translate relative to diffraction grating 504, that is move closer to or farther away from the diffraction grating, in directions parallel to the plane of substrate 526 and the plane of mounting block 511.

In order to achieve mode-hop-free tuning of the tunable laser 501, the diffraction angle and the external cavity length change together in a way which maintains the superposition between the grating diffraction peak and the external cavity mode. This is equivalent to maintaining the same number of modes in the cavity at all wavelengths. This is also equivalent to maintaining a constant phase in the cavity at all wavelengths. The simultaneous rotation and translation of reflector 506 about the virtual pivot point of tunable laser 501 inhibits such mode hopping by providing that the external optical path traveled by output beam 150 while lasing between the laser source 502 and the reflector 506 remains equal to an integer number of half wavelengths of the selected wavelength of output beam 150 over the range of selectable wavelengths of tunable laser 501.

When it is desired to rotate movable structure 539 and thus reflector 506 in a clockwise direction about the virtual pivot point of microactuator 507, in one preferred method a voltage potential is supplied by controller 561 to stationary comb drives 533 of first drive assemblies 527 so as to cause comb fingers 552 of the respective movable comb drives 534 to be electrostatically attracted to comb fingers 547 of the stationary comb drives 533. Such attraction force causes comb fingers 552 to move towards and interdigitate with comb fingers 547. The amount of such interdigitation, and thus the amount movable structure 539 and reflector 506 pivot about the virtual pivot of microactuator 507, can be controlled by the amount of voltage supplied to the stationary comb drives 533 of the first comb drive assemblies 527. When it is desired to pivot movable structure 539 and reflector 506 in a counterclockwise direction about the virtual pivot axis of microactuator 507, a suitable voltage potential can be supplied to stationary comb drives 533 of second comb drive assemblies 528 so as to cause comb fingers 552 of the respective movable comb drives 534 to move towards and interdigitate with comb fingers 547 of the second comb drive assemblies 528. As can be seen, the second comb drives 534 of one of first comb drive assemblies 527 or second comb drive assemblies 528 are in their second positions when the second comb drives 534 of the other of second comb drive assemblies 528 or first comb drive assemblies 527 are in their first positions.

Suitable voltage potentials to drive comb drive assemblies 527 and 528 can range from 20 to 200 volts and preferably range from 60 to 150 volts. Microactuator 507 is capable of a +/−1.5 degrees of pivotable rotation about the virtual pivot point of the microactuator 507, that is rotational movement of 1.5 degrees in both the clockwise and the counterclockwise directions for an aggregate pivotal movement of three degrees when drive voltages of 120 or 140 volts are utilized. The amount of a angular deflection of movable structure 539 about such virtual pivot point is dependent on the number of comb fingers 547 and 552, the electrostatic gap between the comb fingers and the length and width of springs 536–538.

Radially-extending springs 536–538 provide radial rigidity and stiffness to movable second comb drives 534 and thus inhibit snap over of the comb fingers 547 and 552 during interdigitation. The nonfolded design of springs 536–538 enhances out-of-plane stiffness, that is stiffness in microactuator 507 that is out of the plane of movable structure 539. Such out-of-plane stiffness facilitates support of the relatively large reflector 506 and inhibits misalignments between the reflector 506 and diffraction grating 504 during operation of microactuator 507.

Any of the wavelength monitoring techniques disclosed herein, including techniques using wavelength lockers and/or optical sensing devices such as PSDs, can be utilized for monitoring the wavelength of output beam 150 and, if necessary, moving reflector 506 to correct any deviation between the measured wavelength and the selected or desired wavelength of the output beam. In this manner, changes in the geometrical relationship between the components of tunable laser 501, for example changes in the relative relationship of laser source 501, diffraction grating 504 and/or reflector 506 due to temperature and/or mechanical effects, may be compensated for through movement of reflector 506 so that a desired wavelength of output beam 150 is maintained.

In one exemplary method of operating first microactuator 507 to servo control the wavelength of output beam 150, capacitive sensing of the reflector microactuator 507 can be used by controller 561, for example with a look-up table, to determine the coarse position of the microactuator 507 as a function of the desired wavelength of output beam 150 and optionally the temperature of tunable laser 501. The coarse position of the microactuator 507 and reflector 506 carried thereby can also be determined using a position sensing device, such as discussed above with respect to tunable lasers 201, 221 and 241. A wavelength locker such as wavelength locker 264, or other wavelength monitoring device, can be used to intermittently or continuously monitor the wavelength of beam 150 and provide error signals to controller 561 for determining, for example with another look-up table, the fine position of the microactuator 507 as a function of the error signal and optionally the temperature of the tunable laser 501.

The power of output beam 150 can also be monitored by any suitable power detector such as a photodiode (not shown) to permit positioning of collimating lens 503 so as to maximize such optical output power. Repositioning of collimating lens 503 may be desirable should the relative relationship of certain components of tunable laser 501, such as diffraction grating 504 and reflector 506, be improper due to initial misplacement or due to the operational environment of tunable laser 501 or module 623. For example, variable temperatures, shock or vibration may result in undesirable misalignment of the diffraction grating 504 and/or the reflector 506 that can be corrected by repositioning collimating lens 503. In addition, nonperfect rotation of reflector 506 may also necessitate movement of collimating lens 503. In this regard, a power detector such as power detector 632 can be coupled to controller 561 and collimating lens 503 moved by second microactuator 508 until such measured output power is maximized. Movement techniques for collimating lens 503 can include periodic dithering of the lens 503 or periodic movements in accordance with other control schemes so that the collimating lens 503 is positioned relative to second beam portion 150b to enhance coupling of the beam 150 back into laser source 502.

In one exemplary method of operating second microactuator 508 to servo control the output power of tunable laser 501, capacitive sensing of the lens microactuator 508 can be used by controller 561, for example with a look-up table, to determine the coarse position of collimating lens 503 as a function of the desired wavelength of output beam 150 and optionally the temperature of tunable laser 501. Collimating lens 503 can thereafter be periodically or otherwise dithered and the power of output beam 150 monitored by power detector 632 so that controller 561 can determine the fine position of collimating lens 503 and thus maximize the coupling of second beam portion 150b into laser source 502.

Second microactuator 508 is operated by controller 561, in substantially the same manner discussed above with respect to first microactuator, for moving collimating lens 503. The microactuator 508 can provide +/−30 microns of movement from the home or rest position shown in FIG. 13. Springs 596 and 597 provide sufficient longitudinal stiffness to inhibit snap over of comb fingers 602 and 604 and undesired movement of the collimating lens in a direction orthogonal to longitudinal centerline 598 of the microactuator 508.

As discussed above with respect to tunable laser 100, the output beam 150 of tunable laser 501 can be modulated by varying the current to laser source 502 and/or by means of external modulation for transmitting information in a fiber optic or other telecommunications system in which tunable laser 501 is utilized.

Another embodiment of a tunable laser of the present invention is shown in FIGS. 15–22. Tunable laser 651 shown therein is substantially similar to tunable laser 501 described above and like reference numerals have been used to describe like components of tunable lasers 501 and 651. The tunable laser 651 includes at least one microactuator coupled to a movable member or element, such as one of diffraction grating 504 and microreflector 506, for moving such element and in the instant application to select the wavelength of output beam 150. A first balanced apparatus or microdevice 652 is optionally provided in tunable laser 651 and includes microreflector 506. In general, microdevice 652 serves to pivot reflector 506 relative to diffraction grating 504. The microdevice is balanced to inhibit undesirable movement of the reflector 506 from externally applied accelerations to tunable laser 651. In one preferred embodiment, the balanced microdevice 652 includes a first microactuator or motor 653 which is preferably a MEMS-based microactuator of any suitable type and more preferably an electrostatic microactuator similar to microactuator 507 described above.

Figure 16:
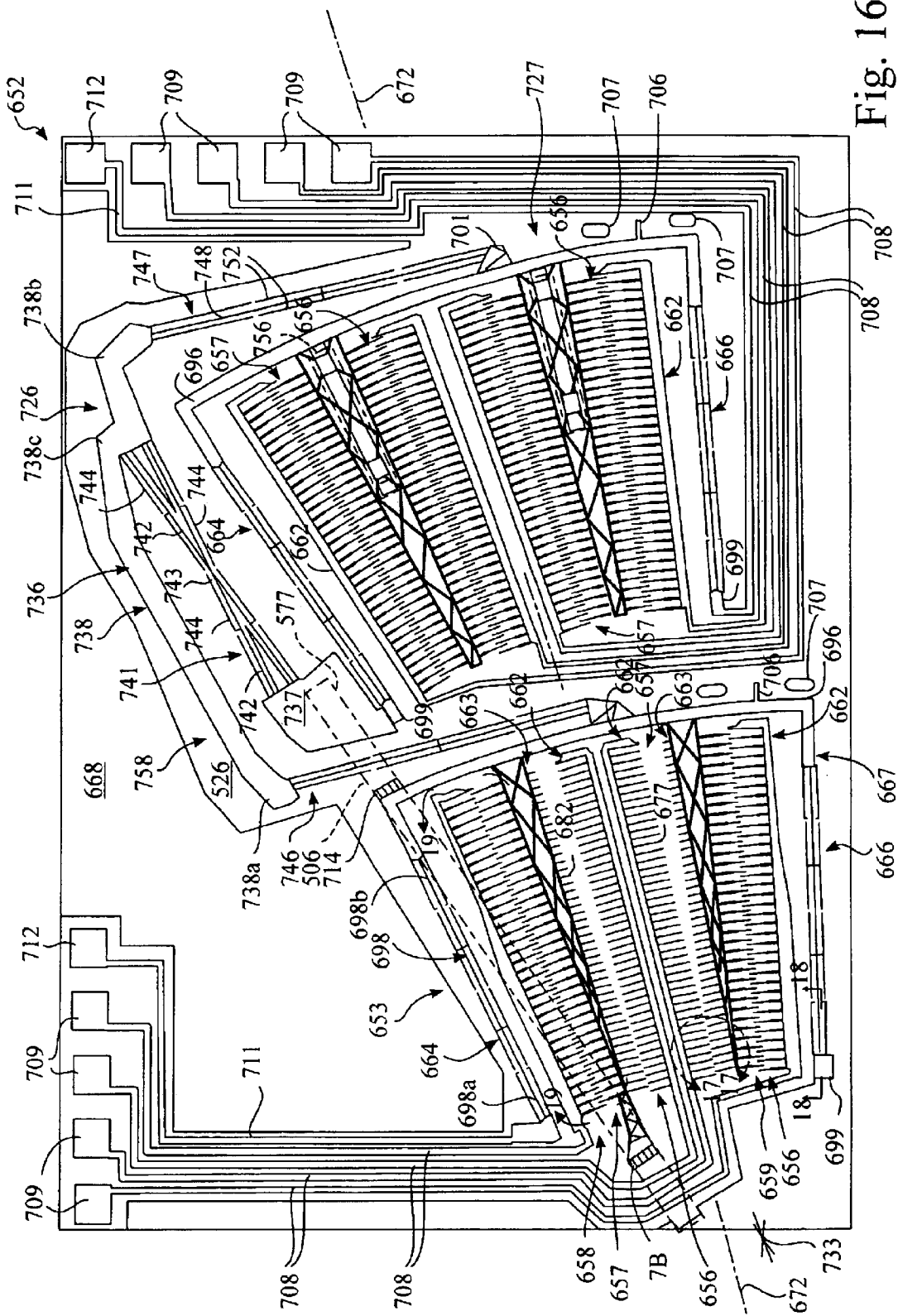
FIG. 16 is an enlarged plan view, partially cut away and rotated 180°, of a first microactuator of the tunable laser of FIG. 15 taken along the line 16—16 of FIG. 15.
Figure 20:
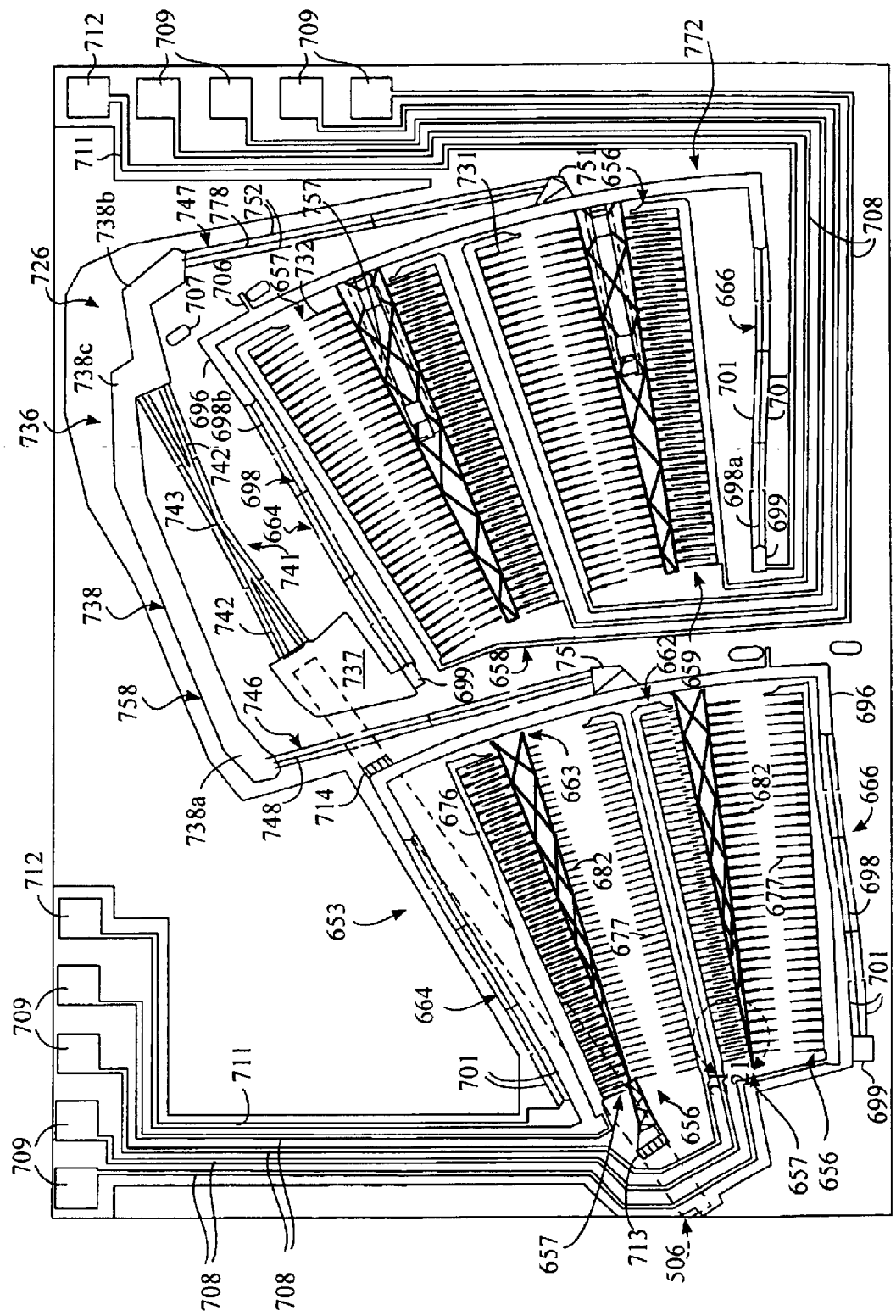
FIG. 20 is a plan view of the first microactuator of FIG. 16 in a second position.

Microactuator 652 has at least one and preferably a plurality of first and second comb drive assemblies 656 and 657 carried by substantially planar substrate 526 and arranged on the substrate in first and second sets 658 and 659 (see FIGS. 16 and 20). Each of the first and second comb drive assemblies includes a first comb drive member or comb drive 662 mounted on substrate 526 and a second comb drive member or comb drive 663 overlying the substrate. At least first and second spaced-suspension beams or spring members 664 and 666 are included in microactuator 653 for supporting or suspending second comb drives 663 over the substrate 526 and for providing radial stiffness to the movable second comb drives 663. The second comb drives 663 are part of a movable portion or structure 667 overlying the substrate 526.

First and second comb drive assemblies 662 and 663, first and second springs 664 and 666 and the remainder of movable structure 667 are formed atop substrate 526 by a second or top layer 668 made from a wafer of any suitable material such as silicon. Top layer or wafer 668 has a thickness ranging from 10 to 200 microns and preferably approximately 85 microns and is preferably fusion bonded to the substrate 526 by means of a silicon dioxide layer 669 (see FIG. 18). The components of microactuator 653 are preferably etched from top wafer 668 by any suitable technique and preferably by the techniques discussed above with respect to tunable laser 100. Springs 664 and 666 and movable structure 667 are spaced above the substrate 526 by an air gap 671 that ranges from 3 to 30 microns and preferably approximately 15 microns, so as to be electrically isolated from the substrate 526.

First and second sets 658 and 659 of comb drive assemblies are symmetrically disposed about a radial centerline 672 of microactuator 653 and each include a first comb drive assembly 656 and a second comb drive assembly 657 (see FIG. 16). First comb drive assembly 656 of the first set 658 and second comb drive assembly 657 of the second set 659 are disposed adjacent centerline 672. A second comb drive assembly 657 is spaced away from the centerline 672 in the first set 658 and a first comb drive assembly 656 is spaced away from the centerline in the second set 659 so as to be adjacent the respective sides of microactuator 652. Each of the first and second comb drive assemblies 656 and 657 has a length ranging from 300 to 3000 microns and preferably approximately 1300 microns, and commences a radial distance ranging from 500 to 5000 microns and preferably approximately 2000 microns from the pivot point of microactuator 653.

First comb drive 662 of each of first and second comb drive assemblies 656 and 657 is immovably secured to substrate 526. Each first comb drive 662 has a radially-extending truss or bar 676 provided with a first or inner radial portion 676a and second or outer radial portion 676b (see FIGS. 19 and 22). A plurality of first comb drive fingers or comb fingers 677 extend from one side of bar 676 in radially spaced-apart positions along the length of the bar. Comb fingers 677 can be of any suitable shape and are preferably approximately arcuate in shape. In a preferred embodiment, piecewise linear segments are used to form comb fingers 677 for approximating such an arcuate shape.

Second comb drives 663 are spaced above substrate 526 so as to be movable relative to the substrate and first comb drives 662. The second comb drives 663 have a construction similar to first comb drives 662 and, more specifically, are formed with a radially-extending truss or bar 681 having a first or inner radial portion 681a and a second or outer radial portion 681b (see FIGS. 19 and 22). A plurality of second comb drive fingers or comb fingers 682 extend from one side of bar 681 in radially spaced-apart positions along the length of the bar 681. Comb fingers 682 are substantially similar in construction in size to comb fingers 677 of the related comb drive assembly 656 or 657. In each of comb drive assembly sets 658 and 659, the second comb drives 663 of the first and second comb drive assemblies 656 and 657 share a second bar 681 such that the two second comb drives 663 are back-to-back. Movable comb fingers 682 of each second comb drive 663 are offset relative to the respective stationary comb fingers 677 so that the movable comb fingers 682 can interdigitate with the stationary comb fingers 677 when the second comb drive 663 is pivoted about the virtual pivot point or pivot point of microactuator 653 towards the respective first comb drive 662.

Figures 17, 21:
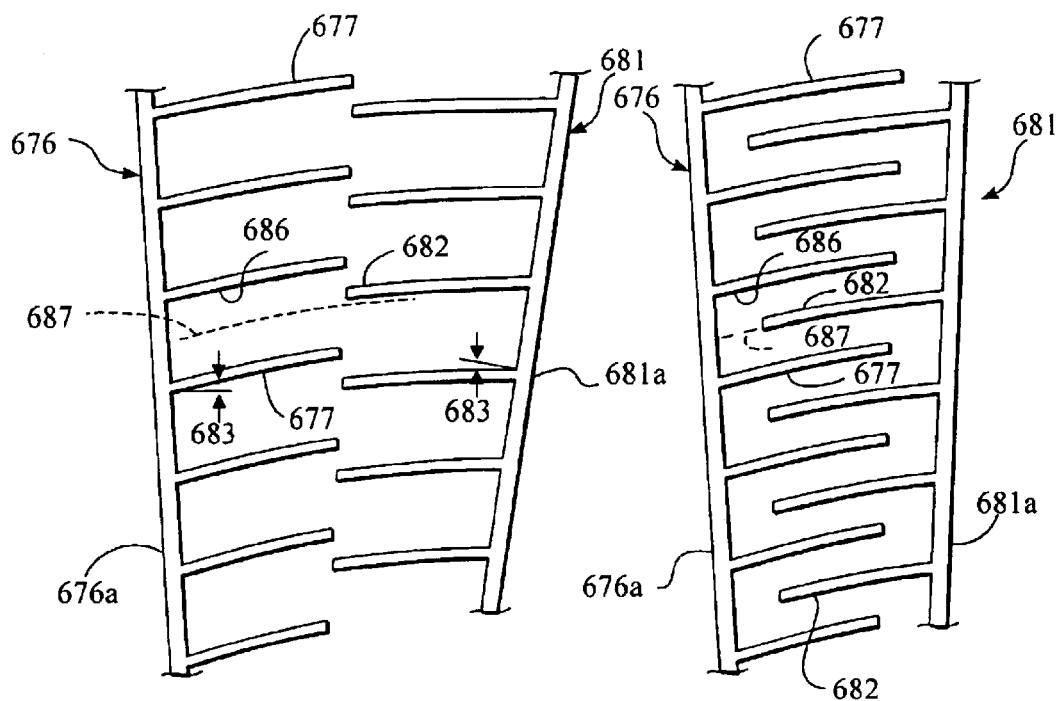
FIG. 17 is a fragmentary plan view of the first microactuator of FIG. 16 taken along the line 17—17 of FIG. 16 and rotated 90°.
FIG. 21 is a fragmentary plan view, similar to FIG. 17, of a portion of the first microactuator of FIG. 16 taken along the line 21—21 of FIG. 20 and rotated 90°.
Figure 18:
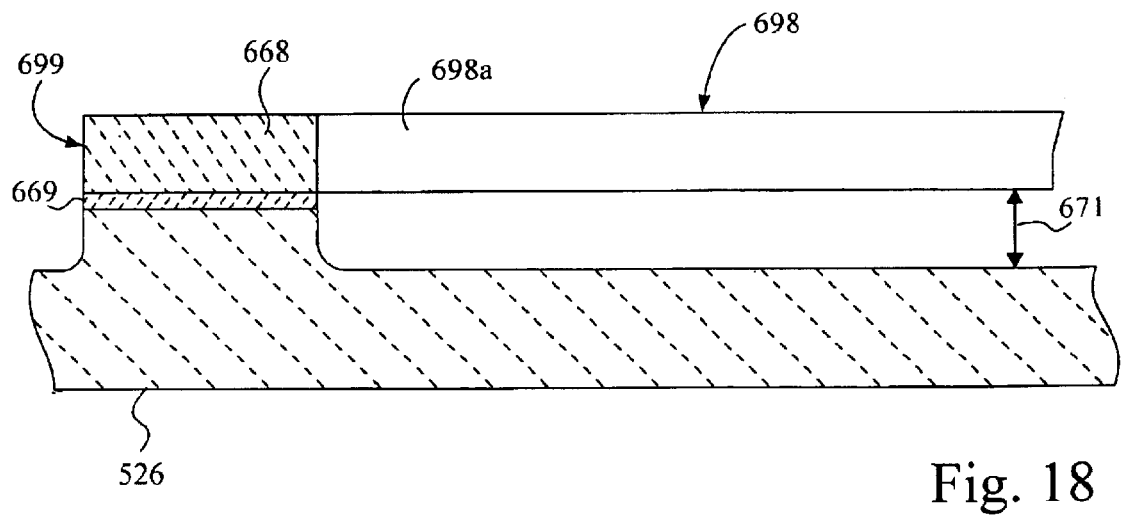
FIG. 18 is a cross-sectional view of the first microactuator of FIG. 16 taken along the line 18—18 of FIG. 16.

Each of first and second comb fingers 677 and 682 are optionally inclined relative to respective bars 676 and 681, that is each comb finger is joined to the respective bar at an oblique angle as opposed to a right angle (see FIG. 17). The inclination angle 683 at which each comb finger 677 and 682 is joined to its respective bar 676 or 681, measured from a line extending normal to the bar, can range from zero to five degrees and is preferably approximately three degrees. Stationary comb fingers 677 are inclined at such inclination angle 683 towards outer radial portion 376b of the stationary bar 676. Conversely, movable comb finger 682 are inclined at inclination angle 683 towards inner radial portion 681 of the movable bar 681. The inclination angle 683 of first comb fingers 677 is preferably equal to the inclination angle of second comb fingers 682. In one preferred embodiment, the equation defining the shape of each first and second comb finger 677 and 682 is:

$$R_2(\theta) = R_0 + m\theta + b,$$

where $R_0$ is the nominal radius of the comb finger measured from the virtual pivot point of microactuator 653, m is the slope and b is the offset of the comb finger from the nominal radius.

Each second comb drive finger 682 is optionally offset relative to the midpoint between the adjacent pair of first comb drive fingers 677 between which the second comb drive finger interdigitates when second comb drive 663 is electrostatically attracted to first comb drive 662. Each adjacent pair of first comb drive fingers 677 has a space 686 therebetween, as shown most clearly in FIGS. 17 and 21. The midpoint between an adjacent pair of first comb drive fingers 677 is represented by an imaginary midpoint line 687 in the figures. The initial offset of each first comb drive finger 677 from the respective midpoint line 687, measured when second comb drive 663 is in its rest position shown in FIGS. 16 and 17, can range from zero to two microns and is preferably approximately 0.75 microns in the illustrated embodiment. The offset of comb drive fingers 677 from midpoint line 687 has been exaggerated in FIG. 17 to facilitate the visualization and understanding thereof. It should be appreciated that comb fingers 677 and 682 which extend from their respective comb drive bars in arcs having a constant radius measured from the pivot point of microactuator 653 can be provided.

Although first and second comb fingers 677 and 682 can be identical in shape and size, the comb drive fingers of first microactuator 652 vary in size and shape. More specifically, second comb fingers 682 in first comb assembly 656 of the first set 658 of comb drive assemblies decrease in length in a linear manner from the inner radial extremity of second or movable comb drive 663 to the outer radial extremity thereof. Similarly, second comb fingers 682 in second comb drive assembly 657 of the second set 659 of comb drive assemblies decrease linearly in length from the inner radial portion 681a of second or movable comb bar 681 to the outer radial portion 681b of the second bar.

Figure 19:
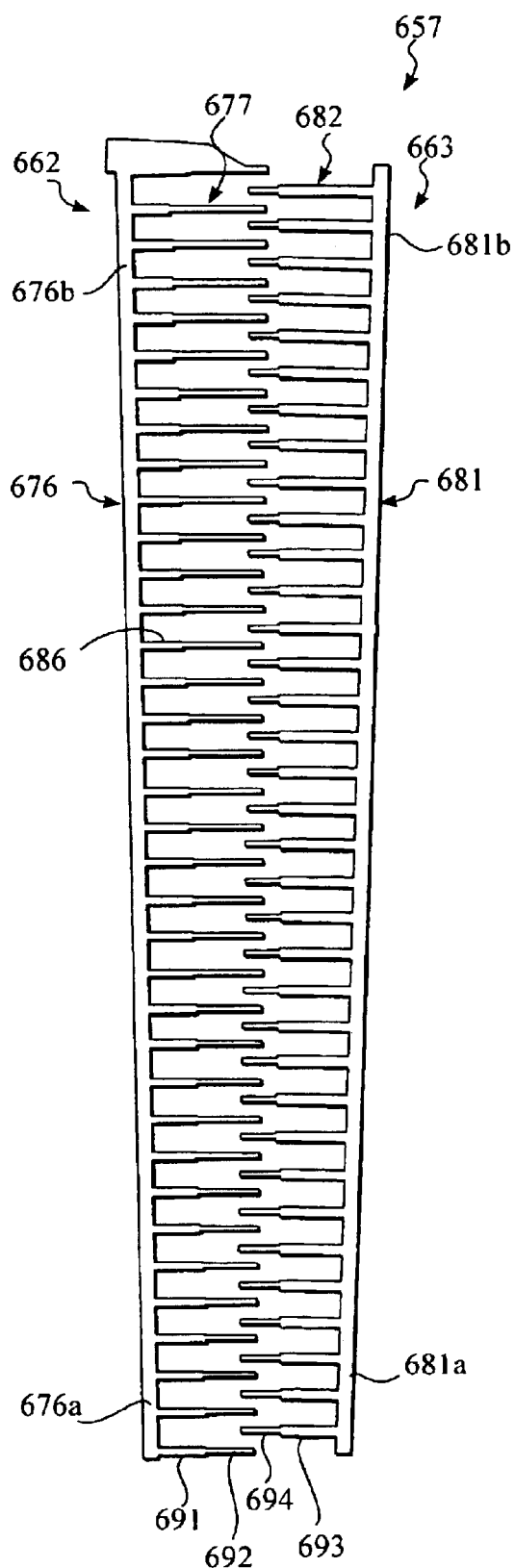
FIG. 19 is a fragmentary plan view of the first microactuator of FIG. 16 taken along the line 19—19 of FIG. 16 and rotated 90°.
Figure 22:
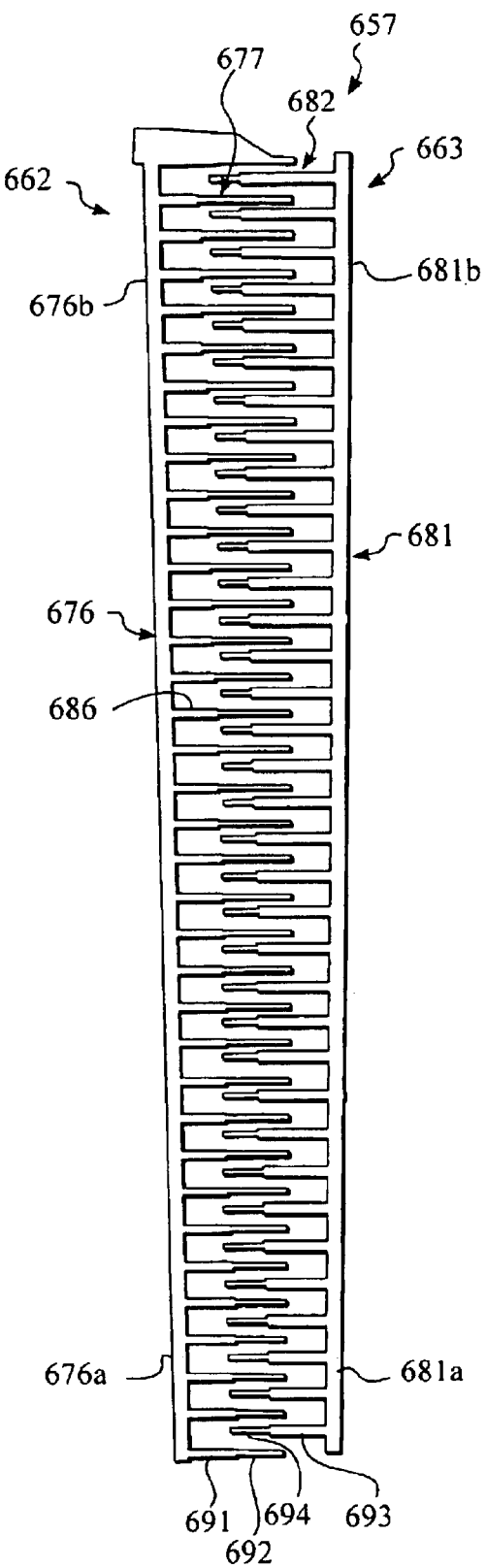
FIG. 22 is a fragmentary plan view, similar to FIG. 19, of the first microactuator of FIG. 16 in a position between the position of FIG. 16 and the position of FIG. 20.

First and second comb fingers 677 and 682 can be of constant width, as they extend outwardly from the respective bars 676 or 681, as with the comb fingers 677 and 682 in first comb drive assembly 656 of first set 658 and the comb fingers in second comb drive assembly 657 of second set 659, or can vary in width along the length thereof. For example, each of the comb fingers 677 and 682 in second comb drive assembly 657 of the first set 658 and in first comb drive assembly 656 of the second set 659 has an inner or proximal portion that is wider than the outer or distal portion of such comb finger. Specifically, each first comb finger 677 in such comb drive assemblies has an inner or proximal portion 691 and an outer or distal portion 692, as shown in FIGS. 19 and 22. Similarly, each second comb finger 682 in such comb drive assemblies has an inner or proximal portion 693 and an outer or distal portion 694. Each inner portion 691 or 693 has a width ranging from 4 to 20 microns and preferably approximately 10 microns, and each outer portion 692 and 694 has a smaller width ranging from 2 to 12 microns and preferably approximately five microns. Each of the stationary inner portions 691 has a length ranging from 40 to 150 microns and preferably approximately 80 microns and preferably, as shown in FIG. 19, and decreases linearly in relative length, that is after taking into consideration the increase in length with radius of each comb drive finger to reflect the truncated sector-shaped or pie-shaped configuration of the comb drive assemblies, from inner radial portion 676a of the first bar 676 to outer radial portions 676b of the first bar. Each of the movable inner portions 693 has a length of ranging from 40 to 150 microns and preferably approximately 80 microns and increases linearly in relative length from inner radial portion 681a to outer radial portions 681b of the second bar 681.

The outer radial portions 681b of the second bars 681 are joined to a connector bar or shuttle 696 extending substantially perpendicularly to the bars 681 and arcuately relatively to the virtual pivot point of microactuator 653. Shuttle 696 is a substantially rigid member and is included in movable structure 667 of the microactuator 653. The shuttle 696 forms the outer radial periphery of microactuator 653 and extends sideways to each of the sides of the microactuator.

Means including at least first and second springs 664 and 666 are provided in rotary electrostatic microactuator 653 for movably supporting second comb drives 663 and the remainder of movable structure 667 over the substrate 526. First and second springs 664 and 666 are symmetrically disposed about radial centerline 672 and, when in their respective rest positions shown in FIG. 16, are each centered on a radial line extending through the virtual pivot point of first microactuator 653. The springs 664 and 666 are angularly spaced apart approximately 20 to 30 degrees about the virtual pivot point of microactuator 653. First and second comb drive assemblies 656 and 657 are disposed between springs 664 and 666, although at least some of the comb drives assemblies can optionally be disposed outside of the springs.

Each of springs 664 and 666 can be of any suitable type and is preferably formed from a single beam-like spring member 698 having a first or inner radial end portion 698a and a second or outer radial end portion 698b (see FIGS. 16 and 20). It should be appreciated however that first and second springs 664 and 666 can have other configurations when in their rest positions, such as being pre-bent as disclosed in U.S. Pat. No. 5,998,906, and be within the scope of the present invention. The inner radial end portion 698a is coupled or secured to substrate 526 at an anchor 699 so as to suspend the spring member 698 above the substrate a distance equal to air gap 671. The outer radial end portion 698b of each spring member 698 is secured to shuttle 696 and thus coupled to the second comb drive 663 of first microactuator 653. Each of the spring members 698 has a length ranging from 300 to 3000 microns and preferably approximately 1000 microns and has a width ranging from 1 to 20 microns and preferably approximately four microns. First and second elongate sacrificial bars 701 of the type described in U.S. Pat. No. 5,998,906 extend along each side of each spring member 698 for ensuring even etching of the desired rectangular cross section of the spring member 698. Each of springs 664 and 666 has a thickness similar to the thickness of movable structure 667, and preferably the same as movable structure 667. In the embodiment illustrated in FIGS. 16–21, the springs 664 and 666 form the respective first and second radial sides of first microactuator 653.

Each of second comb drives 663 is movable in opposite first and second angular directions about the virtual pivot point of microactuator 653 in the same manner as discussed above with respect to first microactuator 507. In general, each second comb drive 663 is movable in the first angular direction about the pivot point between a first or intermediate position in which comb fingers 677 and 682 of respective comb drive assembly are not substantially fully interdigitated and a second position in which such comb fingers are substantially fully interdigitated. Each of first and second comb drive assemblies 656 and 657 is shown in FIG. 16 in their first positions and second comb drive assemblies 657 are shown in FIG. 20 in their second positions. Each of the second comb drives 663 is also movable in the second angular direction about the pivot point of microactuator 653 between its intermediate position and a third position which comb fingers 677 and 682 are spaced apart and fully disengaged. First comb drive assemblies 656 are shown in FIG. 20 in their spaced apart and fully disengaged third positions.

Means is included within first microactuator 653 for limiting the angular movement of movable structure 667 between its extreme angular positions about the virtual pivot point of the microactuator. In this regard, a bumper 706 is formed on shuttle 696 for alternatively engaging first and second stops 707 formed on substrate 526 from top wafer 668.

Electrical means is included in tunable laser 651 for driving second comb drives 663 between their first and second positions. Such electrical means include a suitable controller, such as controller and voltage generator 561 discussed above with respect to tunable laser 501, that is electrically connected to the first and second comb drives 662 and 663 of microactuator 653. In this regard, the inner radial end portion 676a of each first comb drive 662 is electrically connected to controller 561 by means of a lead 708 extending to a bond pad 709 provided along one side of substrate 526. Movable structure 667 is electrically connected to controller 561 by a lead 711 extending to a bond pad 712 also provided on a side of substrate 526. Bond pads 709 and 712 are electrically coupled by suitable wires or other leads (not shown) to the plurality of leads 568 formed on the top surface of actuator submount 516. For simplicity, only an exemplary number of leads 568 have been shown on actuator submount 516 in FIG. 15. Means in the form of a closed loop servo control system can optionally be included in tunable laser 651 for monitoring the position of movable structure 667 relative to substrate 526. For example, controller 561 can include a conventual algorithm of the type discussed above the respect to microactuator 105 for measuring the capacitance between comb fingers 682 of movable comb drives 663 and comb fingers 677 of stationary comb drives of 662.

The structural components of first microactuator 653, that is movable structure 667, first and second springs 664 and 666 and first comb drives 662, have the shape of a truncated fan when viewed in plan (see FIGS. 16 and 20). In this regard, such components resemble a truncated or foreshortened sector of a circle. Such components do not extend to the virtual pivot point of microactuator 653, but instead are spaced radially outwardly from such virtual pivot point. As such, the virtual point of the microactuator 653 intersects the plane of substrate 526 at a point outside the confines of the components of microactuator 653 and, more specifically, outside the confines of movable structure 667. Springs 664 and 666 and movable structure 667 subtend an angle about the virtual pivot point of microactuator 653 of less than 180 degrees and preferably less than 90 degrees. More preferably, springs 664 and 666 and movable structure 667 subtend an angle of approximately 45 degrees about such virtual pivot point.

Movable structure 667 is rotatable about the virtual pivot point of microactuator 653 in opposite first and second angular directions from its at-rest or intermediate position shown in FIG. 16 in the same manner as discussed above with respect to first microactuator 507 of tunable laser 501. In general, when movable structure 667 moves in a clockwise direction about such virtual pivot point, second comb drives 663 in first comb drive assemblies 656 of each set 658 and 659 move to their respective second positions. When movable structure is moved in an opposite counterclockwise direction about such virtual pivot point, second comb drives 663 in second comb drive assemblies 657 of each set 658 and 659 move to their respective second positions, as shown in FIG. 20.

Reflector 506 is coupled to microactuator 653. Specifically, the reflector 506 is carried by movable structure 667 in the same manner as discussed above with respect to microactuator 507 and extends perpendicularly from the plane of microactuator 653. First and second spaced-apart pads 713 and 714 are included on movable structure 667 for receiving the first and second post 579 depending from block 576 of the reflector 506. First pad 713 extends from inner radial end portions 681a of the second comb drives 663 of first set 658. Second pad 714 extends from the end of shuttle 696 secured to first spring 664. Pads 713 and 714 and posts 579 are included in the coupling means or coupler of microdevice 652 for connecting the reflector 506 to the microactuator 653.

A counterbalance 726 is carried by substrate 526 and coupled to second comb drives 663 of first microactuator 653. The counterbalance or counterbalancing means 726 optionally includes a second microactuator and preferably a MEMS-based microactuator of any suitable type. The counterbalance more preferably includes a rotary electrostatic microactuator or any other suitable electrostatic microactuator. In one preferred embodiment, shown in FIGS. 16 and 20, a balancing microactuator 727 substantially similar to first microactuator 653 is included in counterbalance 726. Like reference numerals have been used in the drawings to describe like components of microactuators 653 and 727. Stationary comb drive fingers or comb fingers 731 and movable comb drive fingers or comb fingers 732 of microactuator 727, identified in FIG. 20, are substantially similar to the comb fingers 676 and 682 in second comb drive assembly 657 of first set 658 and the comb fingers 676 and 682 in first comb drive assembly 656 of second set 659 of microactuator 653. Each of the stationary comb fingers 731 has an inner portion 691 and an outer portion 692, and each of the movable comb fingers 732 has an inner portion 693 and an outer portion 694.

In the same manner as discussed above with respect to first microactuator 653, movable structure 667 of balancing microactuator 727 moves or rotates in first and second opposite angular directions about a virtual pivot point, identified as pivot point 723 in FIG. 16. Pivot point 723 is generally located at the intersection of straight lines drawn from first and second springs 664 and 666, when in their respective rest positions, and radial centerline 672 of the microactuator 727.

Electrical means is included for driving second comb drives 534 of balancing microactuator 727 between their first and second positions and can include controller and voltage generator 561 used for controlling first microactuator 653. Controller 561 is electrically coupled to balancing microactuator 727 in the same manner as discussed above with respect to first microactuator 653 by means of bond pads 709 and 712 of the balancing microactuator 727. A suitable closed loop servo control system, such as one using a conventional algorithm of the type discussed above, can optionally be included in tunable laser 651 for measuring the capacitance between comb fingers 677 and 682 of balancing microactuator 727 to monitor the position of the movable structure 667 of the balancing microactuator 727.

Counterbalance 726 further includes a link 736 for coupling balancing microactuator 727 to first microactuator 653 and, more specifically, for coupling second comb drives 663 of the balancing microactuator 727 to second comb drives 663 of the first microactuator 653. Link or levers assembly 736 is anchored to substrate 526 by a mount 737 formed from top wafer 668 and secured to the substrate 526 by silicon dioxide layer 669. Link 736 includes a lever arm 738 having first and second end portions 738a and 738b and a central portion 738c (see FIG. 16). Lever arm 738 is pivotably coupled to mount 737 by means of a pivot assembly 741, which is X-shaped in conformation when viewed in plan and is formed from first and second pivot arms 742 joined at their center to form a pivot point 743 for the pivot assembly. The pivot assembly 741 is elongate in shape, with the first ends of the pivot arms 742 joined in spaced-apart positions to mount 737 and the second ends of the pivot arms joined in spaced-apart positions to lever arm 738 at central portion 738c. Each of the pivot arms 742 has a width and thickness similar to the width and thickness of spring members 698. First and second sacrificial bars 744, similar to sacrificial bars 701 discussed above, extend along each side of the pivot arms 742 for ensuring even etching of the desired rectangular cross section of the pivot arms.

First and second ends 738a and 738b of the level arm 738 are joined to the respective shuttles 696 of first microactuator 653 and balancing microactuator 727 by respective first and second coupling members or coupling springs 746 and 747 (see FIGS. 16 and 20). Springs 746 and 747 are similar to first and second springs 664 and 666 and are each formed from a spring member 748 substantially similar to spring member 698. Each of the spring members 748 has one end secured to the respective end of lever arm 738 and the other end secured to a bracket 751 joined to the respective shuttle 696. First and second sacrificial bars 752, substantially similar to sacrificial bars 701 discussed above, extend along each side of each spring member 748 for the reasons discussed above. Lever arm 738, pivot assembly 741, first and second coupling springs 746 and 747 and brackets 751 are each formed from top wafer 668 and overlie substrate 526 by the distance of air gap 671.

Counterbalance 726 optionally further includes one or more weights 756 carried by movable structure 667 of balancing microactuator 727 to offset or counterbalance the weight of reflector 506 mounted on the movable structure 667 of first actuator 653. In one preferred embodiment, a platform 757 is formed between the back-to-back movable bars 681 in each of the first set 658 of comb drive assemblies and the second set of 659 of comb drive assemblies of balancing microactuator 727. Each of the platforms 757 is formed from top wafer 668. Weights 756 are secured to platform 575 by any suitable means such as an adhesive (not shown). Movable structures 667 of first microactuator 653 and balancing microactuator 727, reflector 506, weights 756 and link 736 are included in the movable framework 758 of balanced microdevice 652.

Figure 15:
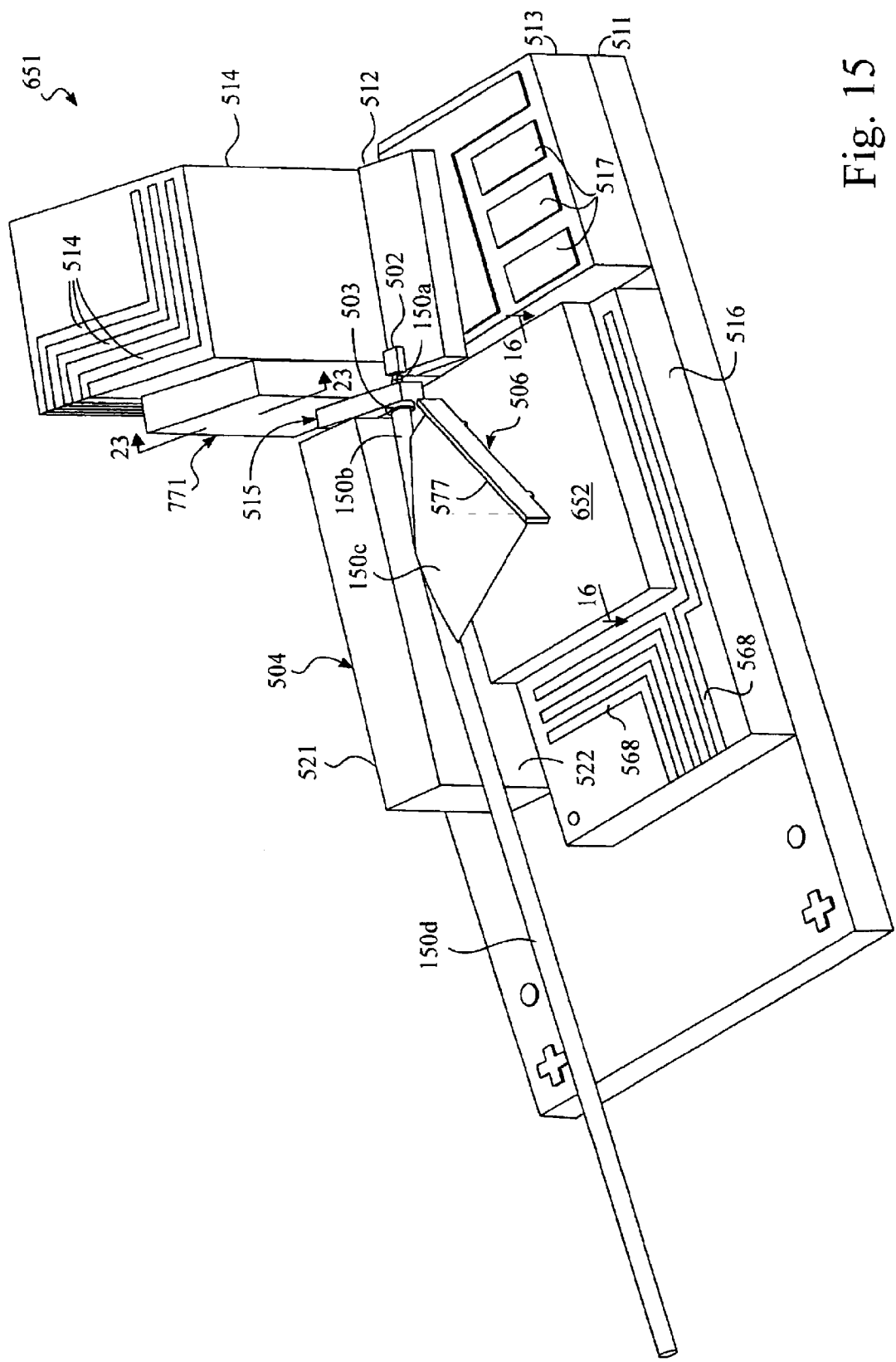
FIG. 15 is a perspective view of yet a further embodiment of a tunable laser with microactuator of the present invention.
Figure 23:
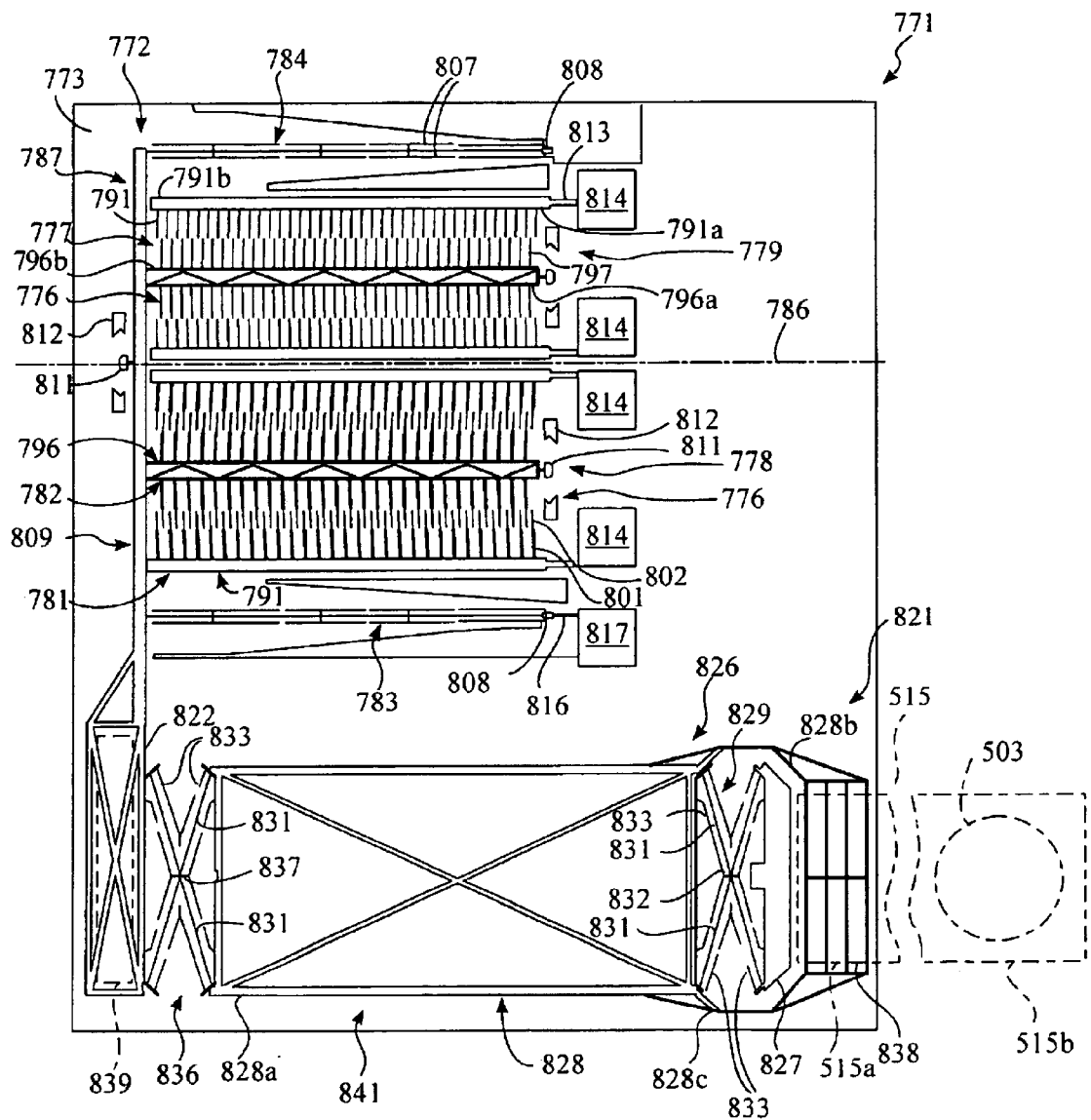
FIG. 23 is an enlarged plan view, partially cut away, of a second microactuator of the tunable laser of FIG. 15 taken along the line 23—23 of FIG. 15.
Figure 24:
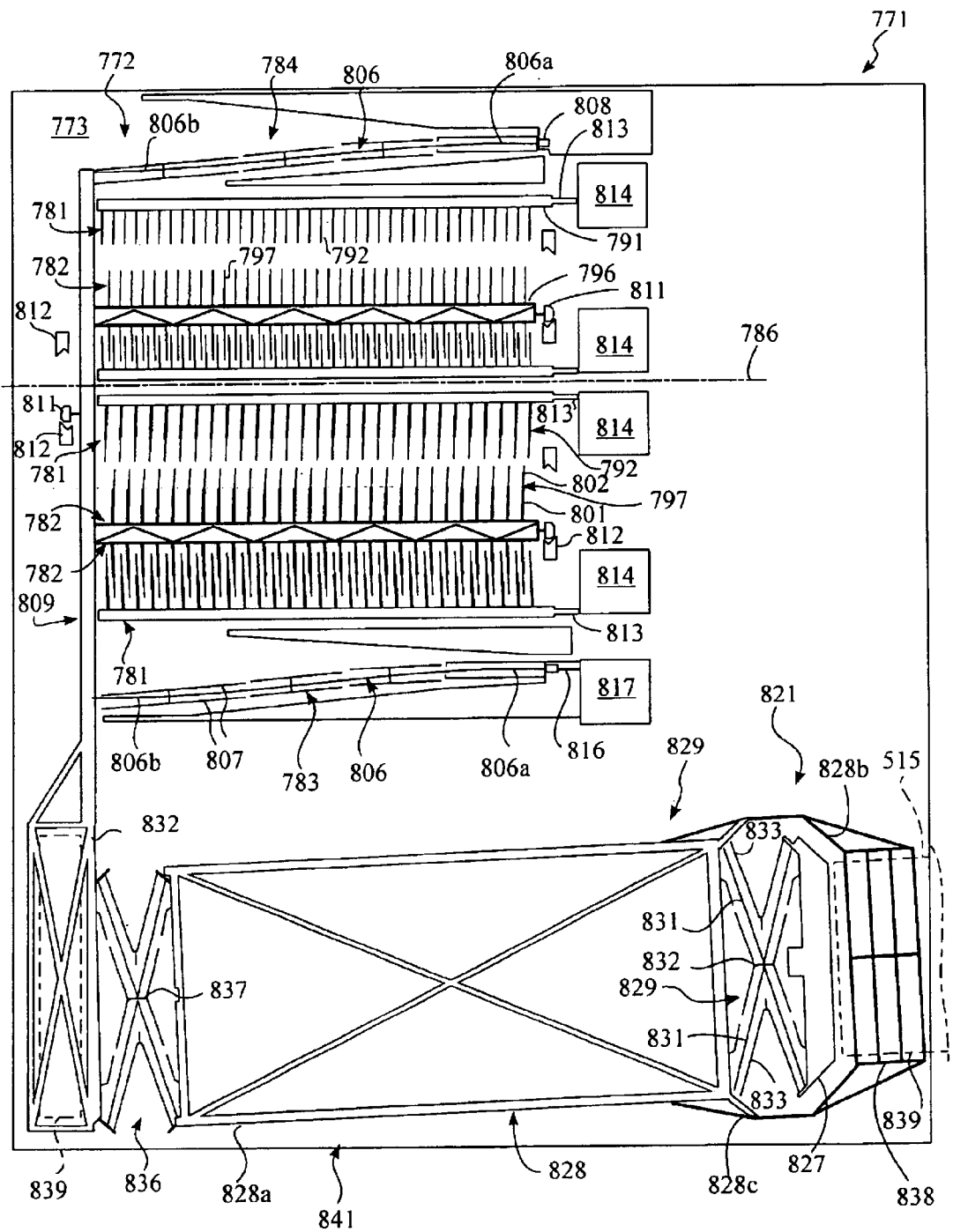
FIG. 24 is a plan view of the microactuator of FIG. 23 in a second position.

A second balanced apparatus or microdevice 771 is optionally included in tunable laser 651 and includes collimating lens 503 and lens block 515 (see FIGS. 15, 23 and 24). In general, second microdevice 771 serves to move collimating lens 503 so as to focus laser beam 150 into laser source 502 and is balanced to inhibit undesirable movement of the collimating lens 503 and lens block 515 from externally applied accelerations to tunable laser 651. In one preferred embodiment, second balanced microdevice 771 includes a second microactuator or motor 772 which is preferably a MEMS-based microactuator of any suitable type and more preferably an electrostatic microactuator similar to microactuator 508 described above.

Linear microactuator 772 can be constructed in the manner discussed above with respect to first microactuator 653 atop a planar substrate 773 that is substantially similar to substrate 526 discussed above. At least one and preferably a plurality of first and second comb drive assemblies 776 and 777, which are preferably linear comb drive assemblies, are carried by substrate 773 and arranged on substrate 773 in first and second sets 778 and 779. Each of the first and second comb drive assemblies 776 and 777 includes a first comb drive member or comb drive 781 mounted on substrate 773 and a second comb drive member or comb drive 782 overlying the substrate 773. At least first and second spaced-apart suspension members or spring members 783 and 784 are included in second microactuator 772 for supporting or suspending the second comb drives 782 over the substrate 773 and for providing stiffness to the second comb drives 794 in a direction along a longitudinal centerline 786 of the microactuator 782.

The components of second microactuator 772 are formed atop substrate 773 by a top layer or wafer substantially similar to top wafer 668 of first microactuator 653. The top wafer is secured to substrate 773 in any suitable manner and is preferably fusion bonded to the substrate by means of a silicon dioxide layer (not shown). The components of second microactuator 772 can be formed by any suitable means and are preferably etched from the top layer by any of techniques discussed above with respect to tunable laser 100. Second comb drives 782 are part of a movable portion or structure 787 that, together with springs 783 and 784, is spaced above substrate 773 by an air gap, similar to air gap 671 discussed above with respect to first microactuator 653, so as to be electrically isolated from substrate 773.

First and second comb drive assemblies sets 778 and 779 optionally extend parallel to each other in symmetrical disposition relative to longitudinal centerline 786 of second microactuator 772. A single first comb drive assembly 776 and a single second comb drive assembly 777 are provided in each set 778 and 779 of comb drive assemblies. First comb drive 871 of each of first and second comb drive assemblies 776 and 777 is immovably secured to substrate 773 and has a longitudinally-extending truss or bar 791 having first and second portions 791a and 791b. A plurality of comb drive fingers or comb fingers 792 extend from one side of bar 791 in longitudinally spaced-apart positions along the length of the bar.

Second comb drives 782 are spaced above substrate 773 so as to be movable relative to the substrate and first comb drives 781. The second comb drives 782 have a construction similar to first comb drives 781 and, more specifically, are each formed with a longitudinally-extending truss or bar 796 having first and second end portions 796a and 796b. The second comb drives 782 of each set 778 and 779 are disposed back-to-back and, as such, share a bar 796. A plurality of comb drive fingers or comb fingers 797 extend from each side of each bar 796 to form the back-to-back second comb drives 782 of each set 778 and 779. The comb fingers 797 on each side of bar 796 are longitudinally spaced apart along the length the bar 796.

Comb fingers 792 and 797 are substantially similar in construction. Each of the comb fingers are preferably of the type disclosed in International Publication No. WO 00/62410 having an International Filing Date of Apr. 12, 2000 and as such are inclined and offset. As more fully disclosed International Publication No. WO 00/62410, each of the comb fingers is slightly inclined from a line extending normal to the respective bar 791 or 796. In addition, when each of the comb drive assemblies 776 and 777 is in its rest position, movable comb fingers 797 are offset relative to a midpoint line extending between the adjacent pair of stationary comb fingers 792 into which such comb fingers 797 interdigitate. In addition to the foregoing, the comb fingers 792 and 797 in first set 778 of comb drive assemblies are similar in construction to certain of the comb fingers discussed above with respect to first microactuator 653. More specifically, the comb fingers in first set 778 are each formed with a first or inner portion 801 and a second or outer portion 802. The inner portion 801 of each such comb finger has a width greater than the width of the respective outer portion 802. The comb fingers 792 and 797 in second set 779 of comb drive assemblies each have a constant width along the length thereof.

First and second springs 783 and 784 are substantially similar in construction to springs 664 and 666 discussed above and each include a single spring member 806 and first and second sacrificial bars 807 extending parallel to the spring member along each of the opposite sides of the spring member. Each spring member 806 has a first end portion 806a and an opposite second end portion 806b. First end portion 806a of each spring members is coupled or secured to substrate 783 at an anchor 808 and second end portion 806b of each spring member is coupled or secured to second comb drives 782. In this regard, an elongate bar or shuttle 809 is secured to the free second end portion 806b of each spring member 806. Shuttle 809 extends substantially perpendicular to springs 783 and 784 when the springs are in their rest positions shown in FIG. 23. The second end portion 796b of each movable bar 796 of the second comb drives 782 is perpendicularly joined to the portion of shuttle 809 extending between springs 783 and 784. The shuttle 809 is part of the movable structure 787 of second microactuator 772. It should be appreciated that some of the first and second comb drive assemblies 776 and 777 of second microactuator can be disposed outside of springs 783 and 784.

Second comb drives 782 of each of first and second comb drive assemblies 776 and 777 are movable in a first direction from their first or intermediate positions shown in FIG. 23, in which comb fingers 792 and 797 are not substantially fully interdigitated, to a second position, in which the comb fingers 792 and 797 are substantially fully interdigitated. The second comb drives 782 are also movable from their first position in an opposite second direction to a third position, in which the comb fingers 792 and 797 are spaced apart and fully disengaged. The comb fingers of first comb drive assemblies 796 are shown in FIG. 24 in the second position, in which the comb fingers are substantially fully interdigitated, while the comb fingers of second comb drives assemblies 777 are shown in FIG. 24 in the third position, in which the comb fingers are spaced apart and fully disengaged. First and second springs 783 and 784 permit the movement of second comb drives 782 and provide longitudinal rigidity to shuttle 809 and a second comb drives so as to inhibit snap over between interdigitated comb fingers 792 and 797.

The interdigitation of the comb drive fingers of first comb drive assembly 776 serves to move shuttle 809 and the remainder of movable structure 787 in a sideways direction substantially perpendicular to longitudinal centerline 786 to a first position relative to substrate 773, as shown in FIG. 24. The interdigitation of the comb drive fingers of second comb drive assemblies 777 serves to move shuttle 809 and the remainder of movable structure 787 in an opposition second direction to a second position relative the substrate 773 (not shown). Bumpers 811 are provided on the first end portions 796a of movable comb drive bars 796 and on shuttle 809 for engaging respective stops 812 formed on substrate 773 to limit the sideways movement of the second comb drives 782 and shuttle 809 and thus define the first and second positions of the shuttle 809 and the remainder of movable structure 787.

Electrical means is included for driving second comb drives 782 and the remainder of movable structure 787 between their first and second positions. Such electrical means includes a controller, such as controller 561. An electrical lead or trace 813 extends from first end portion 791a of each first comb drive 781 to a bond pad 814 for permitting electrical control signals to be supplied to the first comb drives 781. An additional electrical lead or trace 816 extends from the first end portion 806a of the spring member 806 of first spring 783 to a bond pad 817 for permitting electrical control signals to be supplied to the movable second comb drives 782. Bond pads 814 and 817 are electrically coupled by suitable wires or leads (not shown) to the plurality of leads 621 formed on the top surface of lens submount 514. Means in the form of a closed loop servo control system, such as the conventional algorithm discussed above, can optionally be included in tunable laser 651 for measuring the capacitance between comb fingers 792 and 797 to monitor the position of the second comb drives 782 of second microactuator 772.

A counterbalance 821 is carried by substrate 773 and coupled to second comb drive 782 of second microactuator 772. In this regard, elongate shuttle 809 extends forwardly of microactuator 772 and is formed with a platform 822. Counterbalance or counterbalancing means 821 includes a lever assembly or coupler 826 that is carried by substrate 773 and serves to couple collimating lens 503 and lens block 515, or any other suitable movable member or optical element, to shuttle 809.

Lever assembly 826 is formed from the top wafer disposed atop substrate 773 and includes an anchor or mount 827 rigidly secured to the substrate 773. A lever arm 828 is provided and has opposite first and second ends portions 828a and 828b and a central portion 828c. Central portion 828c of the lever arm is secured to mount 827 by a pivot assembly 829 that is substantially similar to pivot assembly 741 described above. In this regard, pivot assembly 829 has first and second pivot arms 831 joined at their center to form a pivot point 832. First and second sacrificial bars 833 extends along each side of the pivot arms. One end of each of the pivot arms is joined to mount 827 and the other end of each of the pivot arms is joined to central portion 828c of lever arm 828.

First end portion 828a of the lever arm is coupled to shuttle platform 822 by means of an additional pivot assembly 836 substantially identical to pivot assembly 829. The pivot arms 831 of pivot assembly 836 form a pivot point 837 where they intersect at the center of the X-shaped pivot assembly 836. A mounting platform 838 is formed at second end portion 828b of lever arm. First end portion 515a of lens block 515 is secured to platform 838 by any suitable means such as an adhesive. The lens block 515 is preferably aligned relative to lever assembly 826 such that the substrate 515 extends along the centerline of lever arm 828. Lever arm 828 and pivot assemblies 829 and 836 of lever assembly 826 are spaced above substrate 773 by an air gap so as to be movable relative to the substrate. An optional weight 839 can be secured to shuttle platform 828 by any suitable means such as a adhesive (not shown). Movable structure 787, collimating lens 503, lens block 515, lever assembly 826 and weight 839 are included in the movable framework 841 of second balanced microdevice 771.

In operation and use, tunable laser 651 can be used in the same manner as discussed above for tunable laser 501 to supply a laser beam of a distinct wavelength, for example, a wavelength in the range of approximately 1520 to approximately 1560 nanometers and preferably approximately 1540 nanometers. Such a laser beam is particularly useful in an optical systems such as in a telecommunications systems and preferably a fiber optic telecommunications system.

Each of first microactuator 653 and balancing microactuator 727 are preferably driven by controller 561 in the same manner as discussed above with respect to first microactuator 507 of tunable laser 501. First microactuator 653 of tunable laser 651 serves to move reflector 506 relative to diffraction grating 504 in the same manner as first microactuator 507 of tunable laser of 501. Such movement of reflector 506 is obtained by providing suitable voltage potentials from controller 561 to first and second comb drive assemblies 656 and 657.

The offset and inclined comb drive fingers of second comb drive assemblies 656 and 657 contribute to the stability of first microactuator 653. In this regard, the bending of first and second springs 664 and 666 during interdigitation of comb fingers 677 and 682 causes the springs 664 and 666 to shorten slightly and thus results in movable comb fingers 682 following a noncircular trajectory. The actual trajectory of comb fingers 682 during movement from their first to second positions is approximated by the equation $$R_1(\theta) = (R_P - A\theta^2)\sec(\theta),$$

where A is given by $$A = (18R_P^2 + 2L^2 - 3LR_P)/30L,$$

with L being the length of spring members 698 and $R_P$ being the distance from the virtual pivot of first microactuator 653 to outer radial end portions 698b of the spring members 698.

The complimentary inclination of first and second comb drive fingers 677 and 682 relative to respective comb drive bars 676 and 681 results in the comb fingers having a shape that compensates for the trajectory of the second comb drives 663. As discussed above, first comb drive fingers 677 are inclined radially outwardly of the respective comb drive bar 676 and second comb drive fingers 862 are inclined radially inwardly at a equal angle relative to the respective comb drive bar 681. Such cooperative inclination of the comb fingers contributes to each second comb drive finger 682 being more centered relative to the respective par of adjacent first comb drive fingers 677 during interdigitation of the first and second comb drive fingers 677 and 682. Since the comb drive fingers remain more centered, radial stability is enhanced during interdigitation.

The offset alignment of second comb drive fingers 682 relative to first comb drive fingers 677 ensures that the second comb drive fingers 682 will be substantially centered on midpoint line 687, as shown in FIG. 21, when the first and second comb drive fingers are fully interdigitated. When this is so, the derivative of the net side force between the comb fingers 677 and 682 is substantially minimized and the side stability is increased. The combination of inclined comb fingers and initial offset allows the radial stability of the comb fingers to be maximized throughout the full deflection range. It should be appreciated the invention is broad enough to cover microactuators having comb drive assemblies with comb fingers that are offset but not inclined or inclined but not offset.

The electrostatic forces exerted between the comb fingers of microactuator 653 remain relatively constant during rotation of movable structure 667. In this regard, the varying of the lengths of comb fingers 682 along comb drive bars 681 in the first and second comb drive assemblies 662 and 663 adjacent radial centerline 672 and the varying of the lengths of inner portions 691 and 693 along the respective comb drive bars 676 and 681 in the first and second comb drive assemblies farthest from centerline 672 minimizes undesirable spikes or peaks in the electrostatic forces exerted between the respective first and second comb drives 662 and 663 during interdigitation of the respective comb fingers 677 and 682.

In an exemplary illustration, FIG. 22 shows second comb drive 663 of second comb drive assembly 657 of first set 658 in a partially interdigitated position between its first position shown in FIG. 19 and its second position shown in FIG. 20.

As can be seen therein, outer portion 692 of the stationary comb fingers 677 at outer radial portion 676b of first bar 676 is approximately half interdigitated between the inner portions 693 of adjacent movable comb fingers 682 at outer radial portion 681b of the second bar 681. The amount of interdigitation between the outer portion 692 of stationary comb fingers 677 with the inner portion 693 of movable comb fingers 682 decreases in a substantially linear manner from the outer radial portion to the inner radial portion of such first and second comb drive assemblies 6565 and 657. The amount of interdigitation between outer portion 694 of the movable comb fingers 682 and the inner portion 691 of adjacent stationary comb fingers 677 at the inner radial portion of the second comb drive assembly 657 illustrated in FIGS. 19 and 22 is less than the amount of interdigitation between outer portion 692 of the stationary comb fingers 677 and the inner portion 693 of adjacent movable comb fingers 682 at the inner radial portion of such second comb drive assembly 657. The amount of interdigitation between outer portion 694 and adjacent inner portions 691 decreases from the inner radial portion to the outer radial portion of such second comb drive assemblies 657.

Thus, as can be seen from FIG. 22, outer portions 692 sequentially commence interdigitation between adjacent inner portions 693, commencing at the outer radial portion of such second comb drive assembly 657 and continuing towards the inner radial portion of such second comb assembly 657, during movement of the respective second comb drive 663 towards the respective first comb drive 662 and thereafter outer portions 694 sequentially commence interdigitation between adjacent inner portions 691, commencing at the inner radial portion and continuing to the outer radial portion of such second comb drive assembly 657, during further rotational movement of such second comb drive 663 about the virtual pivot point of first microactuator 653 towards the first comb drive 662 of such second comb drive assembly 657. In this manner, any spike or peak in the engagement force resulting from an outer portion 692 or 694 interdigitating between the relatively wider inner portions 691 or 693 is spread throughout the interdigitation of a complimentary pair of first and second comb drives 662 and 663.

Counterbalance 726 serves to inhibit undesirable movements of the second comb drives 663 in first microactuator 653, and thus microreflector 506 carried thereby, in the direction of travel of those components from externally applied accelerations to microdevice 652. As discussed above, first and second suspension members or springs 664 and 666 provide radial stiffness to first microactuator 653. As such, springs 664 and 666 inhibit undesirable movements of the second comb drives 663 in the radial direction when forces or accelerations are externally applied to microdevice 652 or tunable laser 651. The counterbalance 726 particularly minimizes undesirable movements in an angular direction about the pivot point of first microactuator 653.

Angular movements of movable structure 667 of first microactuator 653 about the virtual pivot point of the microactuator 653 are counterbalanced by opposite angular movements of the movable structure 667 of balancing microactuator 727 about the virtual pivot point 733, shown in FIG. 16, of the microactuator 727. Specifically, when second comb drive assemblies 657 of first microactuator 653 are driven by controller 561 from their first position to their second position, as shown in FIG. 20, second comb drive assemblies 657 of balancing microactuator 727 are moved from their first position to their third position. Similarly, a clockwise movement of movable structure 667 of first microactuator 653 is offset by a counterclockwise movement of movable structure 667 of balancing microactuator 727.

The mass of reflector 506 mounted on movable structure 667 may be balanced by optional weights 756 mounted on movable structure 667 of balancing microactuator 727. The mass of optional weights 756 is adjusted so that the line between the virtual pivot of the first microactuator 653 and the combined center of mass of movable structure 667 of first microactuator 653 and reflector 506 is parallel to the line between the virtual pivot 733 of balancing microactuator 727 and the combined center of mass of movable structure 667 of balancing microactuator 727 and optional weights 756. The mass of optional weights 756 is also adjusted so that the product of the combined mass of movable structure 667 of first microactuator 653 and reflector 506 with the distance between the virtual pivot of first microactuator 653 and the combined center of mass of movable structure 667 of first microactuator 653 and reflector 506 is equal to the product of the combined mass of movable structure 667 of balancing microactuator 727 and optional balancing weights 756 with the distance between the virtual pivot 733 of balancing microactuator 727 and the combined center of mass of movable structure 667 of balancing microactuator 727 and optional weights 756. Linear accelerations to device 651 then produce equal torques on both first microactuator 653 and balancing microactuator 727 and equal forces on the two ends 738*a* and 738*b* of link 738 on pivot assembly 741.

If the perpendicular distances between the pivot point 743 and the coupling springs 748 are not equal, but instead have a ratio R, then the mass of optional weights 756 can be adjusted so that linear accelerations to device 651 produce torques on first microactuator 653 and balancing microactuator 727 that are not equal, but have the same ratio R. The force produced by linear accelerations acting on the mass of lever arm 738 may also be included when balancing the forces on the two ends 738*a* and 738*b* of pivot assembly 741.

First and second comb drive assemblies 776 and 777 of second microactuator 772 are preferably driven by the controller 561 in the same manner as discussed above with respect to second microactuator 508 of tunable laser 501 should repositioning of collimating lens 503 be necessary after the assembly of tunable laser 651. As shown in FIGS. 23 and 24, movement of first comb drive assemblies 776 of the second microactuator 772 to their second positions causes lever arm 828 to pivot in a counterclockwise direction and thus move collimating lens 503 upwardly relative to substrate 773. Conversely, movement of second comb drive assemblies 777 from their first position to their second position results in lever arm 828 moving in a clockwise direction and thus collimating lens moving downwardly relative to substrate 773. Pivot assembly 826 permits the lever arm 828 to pivot about pivot point 832 and pivot relative to mount 827. Pivot assembly 836 pivotably couples lever arm 828 to shuttle 809 for accommodating such pivotal movement of the lever arm 828 about pivot point 832. Since the amount of angular rotation of collimating lens 503 is substantially small, its upward and downward movement is substantially linear and thereby acceptable for proper focusing of output beam 150. It can thus be seen that movement of the second comb drives 782 of microactuator 772 in a first direction causes collimating lens 503 to move in a second direction substantially opposite to the first direction.

In a manner similar to counterbalance 726, counterbalance 821 of second balance microdevice serves to inhibit undesirable movements of the second comb drives 782 of second microactuator 772, and thus collimating lens 503, in the direction of travel of those components from externally applied accelerations to microdevice 771 and tunable laser 651. As discussed above, first and second springs 783 and 784 of microactuator 772 provide stiffness to second comb drives 782 along the longitudinal centerline 786 of microdevice 771. Counterbalance 821 particularly inhibits undesirable movements of the second comb drives 782, in a direction substantially perpendicular to centerline 786, between the first, second and third positions of the comb drives. In this regard, the object or element being moved by second microactuator 772, in this instance collimating lens 503 and lens block 515, serves as part of the counterbalance of microdevice 771. Factors contributing to the counterbalancing of the microdevice of 771 include the aggregate mass of movable structure 787 and weight 839 relative to the aggregate mass of lens block 515 and collimating lens 503, the location of the center of mass of movable structure 787 and weight 839 relative to the center mass of lens block 515 and collimating lens 503 and the length of first end portion 828*a* of lever arm 828 relative to the length of second end portion 828*b* of the lever arm 828. The mass of framework 841 and the distance from pivot 832 to the framework center of mass may also be considered.

In another embodiment of the tunable laser of the present invention, micromechanical means that includes at least one microactuator is provided for rotating and translating one of diffraction grating 504 and reflector 506 for selecting the wavelength of output beam 150. In one preferred embodiment, at least one microactuator is provided for rotating reflector 506 relative to diffraction grating 504 and for translating the reflector 506 relative to the diffraction grating. Such a tunable laser is substantially identical to tunable laser 651 and includes a microdevice 851, substantially similar to microdevice 652, shown in FIG. 25. Like reference numerals have been used to described like components of microdevices 652 and 851. Microdevice 851 is preferably a balanced microdevice and includes a first microactuator 852 substantially similar to first actuator 653 of balanced microdevice 652.

First microactuator 852 has first and second springs 664 and 666 which extend radially inwardly to intersect the radial centerline 672 at the virtual pivot point (not shown) of the first microactuator 852. Outer radial end portion 698*b* of the spring member 698 of each of first and second springs 664 and 666 is joined to a shuttle 853, which is substantially similar to shuttle 696. The shuttle or rotation shuttle 853 extends angularly beyond first set 658 of first and second comb drive assemblies 656 and 657 farther than shuttle 696 of first microactuator 653 and first spring 664 is spaced angularly farther from the first set 658 of comb drive assemblies than spring 664 in first microactuator 653. Springs 664 and 666 define the outer sides of first microactuator 852, and are angularly spaced apart a distance ranging from 15 to 60 degrees and preferably approximately 30 degrees about the virtual pivot point of microactuator 852.

The inner radial end portion 698*a* of the spring member 698 of each of first and second springs 664 and 666 is coupled or secured to substrate 526 by means of a substantially ridged shuttle member or shuttle 856 and first and second suspension beams 857. Translation shuttle 856 is substantially similar in construction to rotation shuttle 853 and extends from the inner radial extremity of first spring 664 to the inner radial extremity of second spring 666. The shuttle 856 has a linear central portion 856*a* which extends perpendicular to reflector 506 and has a length ranging from 200 to 1500 microns and preferably approximately 1000 microns. A suspension beam 857 is secured to each end of central portion 856a and preferably extends perpendicular to the central portion 856a. The other end of each suspension beam 857 is secured to a mount 858 anchored to substrate 526. Each of the suspension beams has a length ranging from 50 to 500 microns and preferably approximately 200 microns and a width ranging from three to 10 microns and preferably approximately four microns. Translation shuttle 856 and suspension beams 857 are each formed from top wafer 668 and are suspended above substrate 526 by air gap 671.

Means is included within balanced microdevice 851 for moving translation shuttle 856 in a direction parallel to central portion 856a between first and second longitudinal positions relative to substrate 526. Such translation can be accomplished manually or by means of any suitable motor and is preferably performed by a MEMS-based actuator and more preferably an electrostatic microactuator. In this regard, balanced microdevice 851 includes a translation actuator 866 which is preferably a linear electrostatic microactuator and as shown is a microactuator substantially similar to linear microactuator 772 discussed above. Like reference numerals have been used to describe like components of microactuators 772 and 866. Translation microactuator 866 has a shuttle 867, substantially similar to shuttle 809, that is disposed parallel to translation shuttle 856 and is coupled to second comb drives 782 of the translation microactuator 866. Linear shuttle 867 is further joined to spring members 806 of each of the first and second springs 783 and 784 of the microactuator 866. Second comb drives 782 and shuttle 867 are included in the movable portion or structure 868 of translation microactuator 866.

Coupler 871 is included in balanced microdevice 851 for coupling translation microactuator 866 to translation shuttle 856. A substantially ridged lever arm 872 is included in coupler 871 and has a first end portion 872a coupled to the end of shuttle 867 by a first coupling spring 873 and a second end portion 872b coupled to translation shuttle 856 by a second coupling spring 874. The linear couplings 873 and 874 are substantially identical in construction and each have a length ranging from 50 to 500 microns and preferably approximately 200 microns and a width ranging from three to 10 microns and preferably approximately four microns. Lever arm 872 is pivotably coupled to substrate 526 by means of a pivot assembly 876 substantially similar to pivot assembly 741 described above. Like reference numbers have been used to describe like components of pivot assemblies 741 and 846. One end of each of the first and second pivot arms 742 of pivot assembly 876 is rigidly secured in spaced apart positions to an anchor or mount 877, which is joined to substrate 526 by silicon dioxide layer 669. The other end of each of the first and second pivot arms 742 is joined to second end portion 872b of lever arm 872 in spaced apart positions. Lever arm 872, first and second coupling springs 873 and 874 and the first and second pivot arms 742 of pivot assembly 776 are formed from top wafer 668 and suspended above substrate 576 by air gap 671.

Electrical means is included within balanced microdevice 851 for driving first microactuator 852, balanced microactuator 727 and translation microactuator 866. Bond pads 709 of first microactuator 852 are disposed between first set 658 of comb drive assemblies and first spring 664. Bond pad 817 of translation microactuator 866 serves to electrically couple both the second comb drives 782 of translation microactuator 866 and the second comb drives 663 of the first microactuator 852 to the controller 561. The second comb drives of first microactuator 852 are additionally electrically coupled to the controller 561 by means of bond pad 712 of balancing microactuator 727. A suitable closed loop servo control system, such as one using a conventional algorithm of the type discussed above, can optionally be included in tunable laser 651 for measuring the capacitance between comb fingers 792 and 797 of translation microactuator 866 to monitor the position of the movable structure 787 of translation microactuator 866.

In operation and use, first microactuator 852 of balance microdevice 851 can be utilized in the manner discussed above to rotate reflector 506 about the virtual pivot point of the first microactuator 852 relative to diffraction grating 504 to adjust the external cavity length of tunable laser 651. When it is desired to translate reflector 506 relative to the diffraction grating 504, that is move the reflector 506 linearly towards or away from the diffraction grating 504 in a direction perpendicular to reflector 506 without rotation about the virtual pivot point of the microactuator 852, translation microactuator 866 can be driven in the appropriate manner by controller 561.

Figure 25:
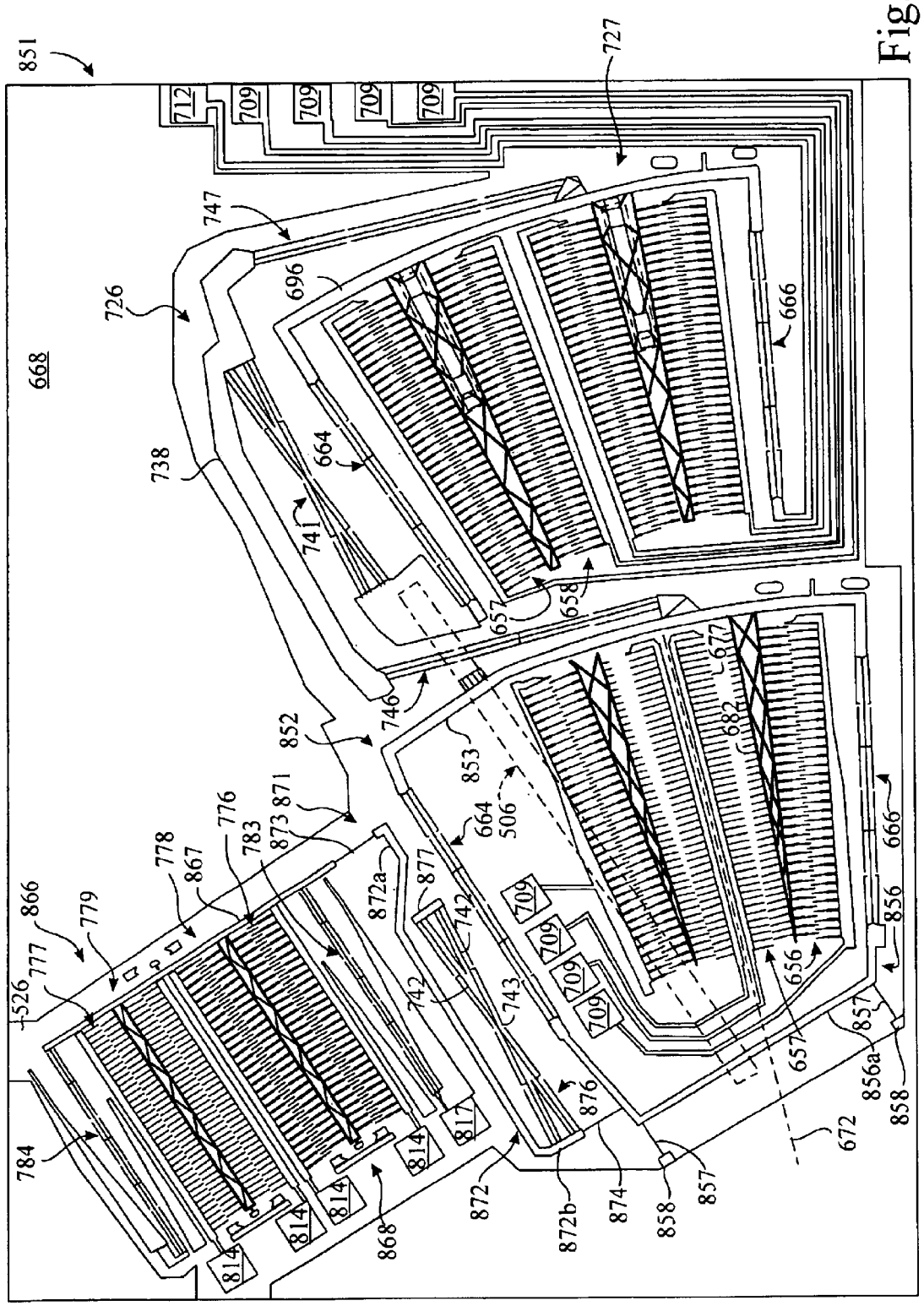
FIG. 25 is an enlarged plan view, taken along the line 16—16 of FIG. 15 and rotated 180°, of another embodiment of the first microactuator of the tunable laser of FIG. 15.

In one exemplary operation of translation microactuator 866, movement of first comb drive assemblies 776 in the microactuator 866 from their intermediate or rest positions shown in FIG. 25 to their second positions, in which the first and second comb drives 781 and 782 of such comb drive assemblies are substantially fully interdigitated, results in shuttle 867 of the translation microactuator 866 moving towards reflector 506. First end portion 872a of the lever arm 872 of coupler 871 follows the movement of shuttle 876 and is thus pivoted about pivot point 743 of pivot assembly 876 to cause the second end portion 872b of the lever arm 872 to move away from first microactuator 852 and microreflector 506 carried thereby. First and second coupling springs 873 and 874 accommodate such pivotal movement of lever arm 872 about pivot point 743. The forward movement of shuttle 867 under the force of translation microactuator 866 causes translation shuttle 856 of first microactuator 852 to be moved towards the translation shuttle 866 in a linear direction which is substantially parallel central portion 856a of the translation shuttle 856. Movable structure 667 of first microactuator 852 follows the translation of shuttle 856 so as to cause microreflector 506 to translate away from diffraction grating 504. In a similar manner interdigitation of the first and second comb drives 781 and 782 of the second comb drive assemblies 777 of translation shuttle 856 results in microreflector 506 being translated towards diffraction grating 504.

Translation shuttle 856 and translation microactuator 866 are capable of translating microreflector 506 forwardly or rearwardly a distance ranging from 0.5 to three microns and preferably approximately 1.5 microns for a total travel between forwardmost and rearwardmost positions ranging from one to six microns and preferably approximately three microns. Such small translations of movable structure 667 of first microactuator 852, and second comb drives 663 included herewith, does not substantially interfere with the desired rotational movements of movable structure 667 about the virtual pivot point of first microactuator 852 or the control algorithms of controller 561 for driving microactuators 852 and 727. Suspension beams 857 are sufficiently flexible to permit the desired translation of shuttle 856, but sufficiently rigid so as to not move during rotation of movable structure 667 about the virtual pivot point of first microactuator 852.

First microactuator 852 and translation microactuator 866 can be utilized in any of the servo control techniques discussed above the respect to first microactuator 507 of tunable laser 501 for coarsely and/or finely positioning microreflector 506 relative to deflector 504. Such control techniques are modified to reflect both the rotation and translation of microreflector 506 relative to diffraction grating 504.

First microactuator 852 of balanced microdevice 851, and microreflector 506 carried thereby, are balanced by balancing microactuator 727 and optional weights 756 carried thereby in the same manner as discussed above with respect to balanced microdevice 652 to inhibit undesirable movements of the microreflector 506 in response to externally applied accelerations to microdevice 851 and tunable laser 651. The relatively small mass of the movable structure 868 of translation microactuator 866 is balanced, by means of coupler 871, by the mass of translation shuttle 856. In this manner, coupler 871 and translation shuttle 856 and included within the counterbalancing means or counterbalance of microdevice 851 for balancing the movable mass of translation microactuator 866, together with the movable mass of coupler 871 and translation shuttle 856, in the direction of movement of shuttles 856 and 867 at pivot point 743 of pivot assembly 876.

Figure 26:
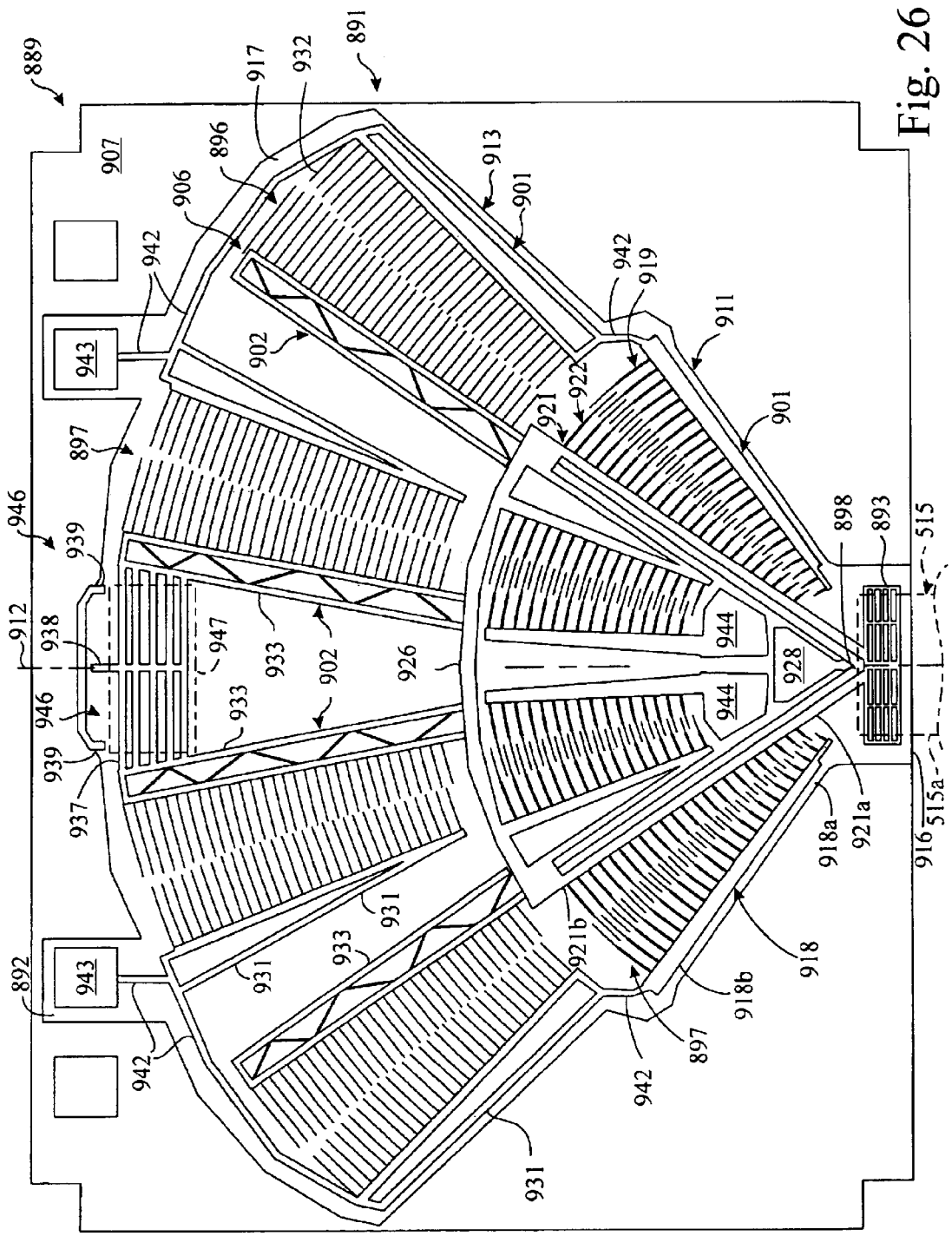
FIG. 26 is an enlarged plan view, taken along the line 23—23 of FIG. 15 but rotated 90°, of another embodiment of the second microactuator of the tunable laser of FIG. 15.
Figure 27:
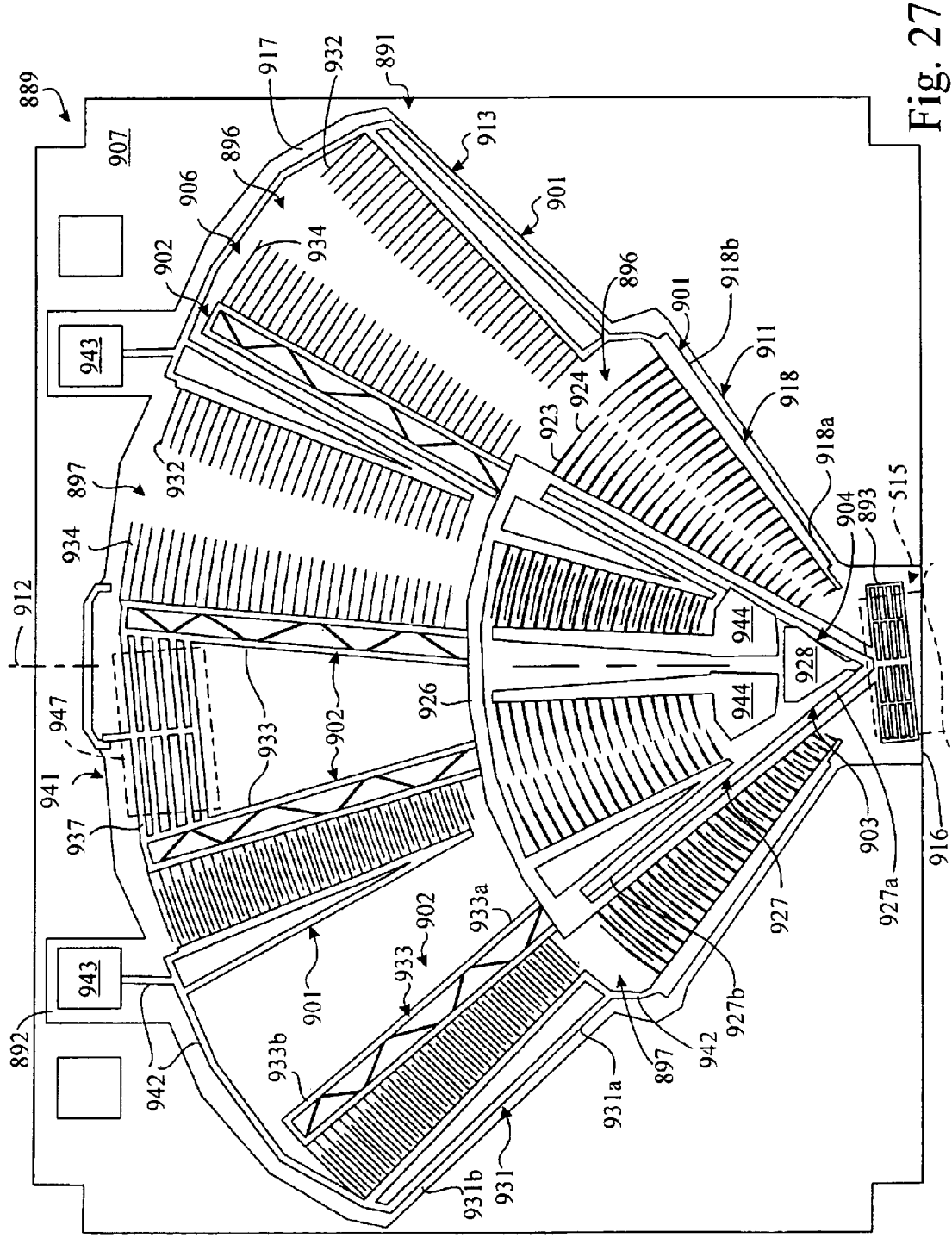
FIG. 27 is a plan view of the microactuator of FIG. 26 in a second position.

Other balanced microdevices can be used with tunable laser 651 for adjusting the position of collimating lens 503. For example, a balanced microdevice having a rotary electrostatic microactuator and preferably a fan-shaped rotary electrostatic microactuator can be used. A balanced microdevice 889 having a particularly preferred rotary electrostatic microactuator 891 is shown in FIGS. 26 and 27. Balanced rotary microactuator 891 is formed from a substrate 892 substantially similar to substrate 526. A movable or rotatable member, in the exemplary embodiment shown as a platform 893, overlies substrate 892. A plurality of first and second comb drive assemblies 896 and 897 are carried by substrate 892 for rotating platform 893 in opposite first and second angular directions about an axis of rotation extending perpendicular to substrate 892 and shown as a pivot point 898 in FIGS. 26 and 27. Each of the first and second comb drive assembles 896 and 897 includes a first comb drive member or comb drive 901 mounted on substrate 892 and a second comb drive member or comb drive 902 overlying the substrate 892. First and second spaced-apart springs 903 and 904 are included in microactuator 891 for supporting or suspending second comb drives 902 and platform 893 over the substrate 892 and for providing radial stiffness to such comb drives and platform. Second comb drives 902 and platform 893 are part of a movable portion or structure 906 of microactuator 892.

Substrate 892 is substantially similar to substrate 526. Platform 893, first and second comb drive assemblies 896 and 897, first and second springs 903 and 904 and the other components of microactuator 891 are formed atop substrate 892 by a second or top layer or wafer 907 substantially similar to top wafer 668 discussed above. The top layer or wafer 907 is preferably fusion bonded to substrate 892 by means of a silicon dioxide layer (not shown). The components of microactuator 891 are formed from top wafer 907 by any suitable means and preferably by any of the techniques discussed above.

At least one and preferably a plurality of first comb drive assemblies 896 are included in balanced rotary microactuator 891 and angularly disposed about pivot point 898 for driving movable structure 906 in a clockwise direction about the pivot point 898. At least one and preferably a plurality of second comb drive assemblies 897 are included in microactuator 891 for driving movable structure 906 in a counterclockwise direction about pivot point 898. The comb drive assemblies of microactuator 891 are arranged in a first or inner radial set 911 symmetrically disposed about radial centerline 912 of microactuator 891 and in a second or outer radial set 913 symmetrically disposed about radial centerline 912. Each of the comb drive assemblies 896 and 897 extends substantially radially from pivot point 898 and, in the aggregate, subtends an angle of approximately 180 degrees or less, preferably approximately 120 degrees or less and more preferably approximately 90 degrees. As such, microactuator 891 has a fan like shape when viewed in plan, as shown in FIGS. 26 and 27. The microactuator 891 has a base 916 extending substantially perpendicularly of radial centerline 912, and pivot point 898 is disposed adjacent based 916. The microactuator 891 has an arcuate outer radial extremity 917 resembling the arc of a circle centered on pivot point 898 and a radial dimension from pivot point 898 to outer radial extremity 917 ranging from 1000 to 2500 microns and preferably approximately 1600 microns.

Two first comb drive assemblies 869 and two second comb drive assembles 897 are included in inner set 911 of comb drive assemblies. The first comb drive 901 in each comb drive assembly of inner set 911 has a radially-extending bar 918 having a first of inner end portion 918*a* and a second or outer end portion 918*b*. A plurality of comb drive fingers or comb fingers 918 extend from one side of the bar 918 in radially spaced-apart positions along the length of the bar. The second comb drive 902 in each comb drive assembly of inner set 911 is formed from a radially-extending bar 921 having a first or inner end portion 921*a* and a second or outer end portion 921*b*. A plurality of comb drive fingers or comb fingers 922 extend from one side of the bar towards the respective first comb drive 901 in radially spaced-apart positions along the length of the bar. Comb fingers 919 and 922 can be of any suitable size and shape and are preferably arcuate in shape. In a preferred embodiment, piecewise linear segments are used to form the comb fingers 919 and 922 for approximating such an arcuate shape.

Although the comb fingers 919 and 922 can have a constant width along the length thereof, each of the comb fingers preferably has a first or inner portion 923 and a second or outer portion 924. The inner portion 923 has a width greater than the width of outer portion 924 for reasons discussed above. As shown in FIG. 26, comb fingers 919 and 922 are partially interdigitated when in their first rest position. Specifically, outer portions 924 of stationary comb fingers 919 are interdigitated with outer portions 924 of movable comb fingers 922.

The inner end portion 921*a* of the movable bar 921 spaced farthest from radial centerline 912 on each side of inner set 911 of first and second comb drive assemblies is joined to platform 893. The outer end portion 921*b* of each of the movable bars 921 in inner set 911 is joined to a rigid shuttle 926 which is substantially arcuate in shape. The arcuate shuttle 926 is part of the movable structure 906 of balanced rotary microactuator 891.

Although springs 903 and 904 can be of any suitable type, each of the springs preferably consists of a single beam-like member 927 having a first or inner end portion 927*a* and a second or outer end portion 927*b*. The inner end portion 927*a* of each of the spring members is coupled to substrate 892 and, more specifically, is secured to a mount 928 that is formed from top wafer 907 and is rigidly joined to substrate 892. The inner end portions 927*a* are each joined to the mount 928 at pivot point 898. Each of the spring members 927 extends between two adjacent movable bars 921 and the outer end portion 927*b* of each spring member is joined to an end of arcuate shuttle 926. First and second springs 903 and 904 are angularly spaced apart a distance of approximately 70 degrees and, when viewed together in plan, are substantially V-shaped.

A plurality of first and second comb drive assemblies 896 and 897 are included in outer set 913 of comb drive assemblies. More specifically, two first comb drive assemblies 896 and two second comb drive assemblies 897 are included in the outer set 913. The first comb drive 901 in each comb drive assembly 896 and 897 of outer set 913 is formed from a radially-extending bar 931 having a first or inner end portion 931*a* and a second or outer end portion 931*b*. A plurality of comb drive fingers or comb fingers 932 extend from one side of the stationary bar 931 in radially spaced-apart positions along the length of the bar. Each of the second comb drives 902 in outer set 913 is formed from a substantially radially-extending bar 933 having a first or inner end portion 933*a* and a second or outer end portion 933*b*. A plurality of comb drive fingers of comb fingers 934 extend from one side of the movable bar 933 towards the respective first comb drive 901 in radially spaced-apart positions along the length of the bar 933.

Although comb fingers 932 and 934 can be of any suitable size and shape, the comb fingers are preferably arcuate in shape and, like comb fingers 919 and 922, are preferably formed from piecewise linear segments for approximating such an arcuate shape. Comb fingers 932 and 934 are not substantially interdigitated when in their first or rest position, shown in FIG. 26. More specifically, the comb fingers 932 and 934 are disengaged in the rest or intermediate position of FIG. 26. Comb fingers 919, 922, 932 and 934 can optionally be inclined and offset in the manner discussed above with respect to the comb fingers of first microactuator 653.

The inner end portion 933*a* of each movable bar 933 is joined to arcuate shuttle 926 and is thus movable in unison with the movable bars 921 of inner set 911 of comb drive assembles. The second comb drives 902 of the first comb drive assembly 896 and the second comb drive assembly 897 symmetrically disposed relative to the radial centerline at the center of outer set 913 face away from each other. The movable bar 933 of such second comb drives 902 are interconnected by means of a platform 937 that is preferably joined to the outer end portions 933*b* of such movable bars.

Movable structure 906 is rotatable in first and second opposite angular directions above pivot point 898. Movement of the second comb drives 902 of first comb drive assemblies 896 from their first positions, shown in FIG. 26, to their second positions, in which the respective comb fingers thereof are substantially filly interdigitated, results in movable structure 906 rotating in a clockwise direction about pivot point 898. Similarly, movement of the second comb drives 902 of second comb drive assemblies 897 from their first positions, shown in FIG. 26, to their second positions, in which the comb fingers of such second comb drive assemblies are substantially fully interdigitated as shown in FIG. 27, results in movable structure 906 rotating in a counterclockwise position about pivot point 898. When the second comb drives 902 of one of first and second comb drive assemblies 896 and 897 move to their second positions, the second comb drives 902 of the other of the comb drive assemblies 896 and 897 move to their third positions, in which the comb fingers thereof are spaced apart and fully disengaged. First comb drive assemblies 896 are shown in their third positions in FIG. 27. Movable structure 906 is capable of rotating plus and minus two to ten degrees and preferably approximately six degrees in each direction, for an aggregate rotation between its extreme angular positions ranging from four to 20 degrees and preferably approximately 12 degrees.

Means is included within balanced rotary microactuator 891 for limiting the angular movement of movable structure 906 about pivot point 898. In this regard, a bumper 938 extends radially outwardly from outer platform 937 and engages one of first and second stops 939 when movable structure 906 is in either of its first and second extreme angular positions about pivot point 898.

The electrical means of tunable laser 651 can be utilized for driving second comb drives 902 between their first and second positions. As discussed above, such electrical means can include controller 561. First comb drives 901 of the first and second comb drive assemblies 896 and 897 of inner set 911 spaced farthest from radial centerline 912 and all of the first comb drives 901 of outer set 913 are electrically connected by means of leads 942 to at least one end and as shown first and second bond pads 943. The first comb drives 901 of the first and second comb drive assemblies 896 and 897 of inner set 911 spaced closest to radial centerline 912 are connected at respective inner end portions 918*a* to respective first and second bond pads 944 disposed between first and second springs 903 and 904. Mount 928 additionally serves as a bond pad for electrically connecting second comb drives 902 and movable structure 906 to controller 561. Means in the form of a closed loop servo control system, for example a conventional algorithm of the type discussed above, can optionally be included in tunable laser 651 for measuring the capacitance between comb fingers 919 and 922 and comb fingers 932 and 934 to monitor the position of movable structure 906 relative to substrate 892.

Collimating lens 503 is coupled to movable structure 906 by means of platform 893. Specifically, first end portion 515*a* of lens block 515 is secured to platform 893 by any suitable means such as an adhesive (not shown). The lens block 515 is centered on radial centerline 912 of balanced rotary microactuator 891 when movable structure 906 is in its rest position shown in FIG. 26.

A counterbalance 946 is carried by substrate 892 and movable structure 906 and thus, second comb drives 902. Counterbalance 946 includes a weight 947 secured to outer platform or coupler 937 by any suitable means such as an adhesive (not shown) and thus coupled to movable structure 906 and second comb drives 902. The mass of weight 947 and its position on movable structure 906 are selected so that the center of mass of movable structure 906, lens block 515, collimating lens 503 and weight 947, in the angular direction about pivot point 848, is located substantially at the pivot point 848. Movable structure 906, lens block 515, collimating lens 503 and weight 947 are collectively referred to as the movable framework 948 of balanced microdevice 889.

In operation and use, the rotary microactuator 891 of balanced microdevice 889 can be used in substantially the same manner as second microactuator 772 to readjust the position of collimating lens 503 when necessary. Rotation of movable structure 906 in its first and second opposite angular directions about pivot point 848 results in collimating lens 503 similarly rotating about pivot point 848. Since the amount of angular rotation of collimating lens 503 is substantially small, the upward and downward movement of the collimating lens 503 is substantially linear and thereby acceptable for proper focusing of output beam 150.

Counterbalance 946 serves to limit undesirable movements of the collimating lens 503 about the axis of rotation of microactuator 891 when external accelerations are applied to microdevice 889 and tunable laser 651.

The tunable lasers of the present invention are advantageous for numerous reasons. Among others, they are each very small in size and mass, which enables the use of simple closed-loop methods to control the components to accurately set and hold the wavelength of the output beam 150. In contrast to the prior art, which may require novel laser structures, such as, for example, a long-wavelength vertical-cavity surface-emitting laser (VCSEL), the present invention can be implemented using an inexpensive and readily available Fabry-Perot laser diode as the laser source. Use of a Fabry-Perot laser in the present invention is further beneficial because, unlike VCSELs, a Fabry-Perot laser can operate at long operating wavelengths, for example, up to and over 1700 nanometers, and in particular 1540 nanometers, which is one wavelength currently used by telecommunications equipment.

Because the laser source and the microactuator of the tunable lasers of the present invention can be made separately, the wafer fabrication processes for their manufacture can be made simpler, which can provide high manufacturing yields.

Because the pivot or rotation angle of the rotary microactuators of the present invention, and hence the reflector mounted thereon, can be held steady under simple closed loop control, the wavelength of output beam 150 may also be held steady. Furthermore, unlike prior art tunable lasers, in which wavelength versus actuator voltage must be re-calibrated as the laser ages, the stable dispersive properties of the diffraction gratings of the present invention do not change with age. As a result, further calibration of the module 623 is not necessarily required after an initial calibration step. Even if in some embodiments the wavelength of the output beam 150 can not be held stable over the lifetime of the module 623, the wavelength stability of the present invention is sufficient that only intermittent re-calibration is envisioned.

The tunable lasers of the present invention offer the additional advantages of low cost, a wide tuning range, which can be greater than 40 nanometers, a narrow linewidth, simple control circuitry, a stable operating wavelength, and a high output power.

It should be appreciated that the movable collimating lens and the servo control techniques of the present invention can be utilized in any suitable tunable laser including any of those discussed herein. A suitable tunable laser for movable such a collimating lens and/or having such servo control apparatus and techniques need only include a laser source and a diffractive element such as a diffraction grating. A reflective element such as reflector 506 can optionally be included. Any suitable motor can be provided for moving such a collimating lens to enhance the operation of such a tunable laser. In addition, the microactuators of the present invention are not limited for use in tunable lasers, the telecommunications industry or optical apparatus, it being appreciated that the microactuators disclosed herein can be used in a wide range of applications in addition to those discussed herein for moving any suitable member or element.

A variety of laser sources can be used each of the tunable lasers disclosed and described herein. In one alternate embodiment, a Fabry-Perot laser source with as high a relaxation oscillation frequency as possible can be used for the laser source of the present invention. Such a laser source would permit the tunable lasers herein to achieve high data transfer rates. Such a laser source would preferably maximize the differential gain, maximize the internal photon density, and minimize the photon lifetime. Multiple-Quantum-Well (MQW) lasers provide these characteristics and have been demonstrated to operate with modulation bandwidths well in excess of 10 GHz. See for example *IEEE Photonics Technology Letters*, Vol. 9, No. 3, pp. 306–308, "24-GHz Modulation Bandwidth and Passive Alignment of Flip-Chip Mounted DFB Laser Diodes", by Lindgren, et al. With this approach, direct modulation as high as 2.5 Gb/sec are possible for any of the tunable lasers disclosed herein.

In other embodiments, any of the tunable lasers disclosed herein can be designed to operate at frequencies corresponding to multiples of longitudinal mode spacing (i.e., multiples greater than the relaxation oscillation frequency).

Although, the foregoing discussion has presented particular embodiments of the present invention, it is to be understood that the above description is not to be limited to only the described telecommunications application and embodiments. For example, other applications include remote sensing or spectroscopy applications. It will also be appreciated by those skilled in the art that it would be possible to modify the size, shape, appearance and methods of manufacture of various elements of the invention, or to include or exclude various elements and stay within the scope and spirit of the present invention.

What is claimed is:

1. A single mode tunable laser operable over a range of wavelengths comprising a laser source for providing light with a single wavelength selected from the range of wavelengths, a diffractive element spaced from the laser source for redirecting the light received from the laser source, a reflective element spaced from the diffractive element for receiving the light redirected by the diffractive element and for further redirecting the light back to the diffractive element, the diffractive element receiving the light further redirected by the reflective element and returning the light to the laser source whereby the laser source, the diffractive element and the reflective element cause the light to lase at the wavelength, and at least one microactuator coupled to one of the diffractive element and the reflective element for causing angular movement of such element to permit selection of the single wavelength of the light from the range of wavelengths the laser source, the diffractive element, the reflective element and the at least one microactuator being dart of a tunable laser assembly having a length ranging from 5 to 25 millimeters a width ranging from 4 to 15 millimeters and a height ranging from 3 to 10 millimeters.

2. The tunable laser of claim 1 wherein the light travels from the laser source to the diffractive element and then to the reflective element along an optical path length and wherein the wavelength has a half wavelength and can be selected from the range of wavelengths, the at least one microactuator moving said one of the diffractive element and the reflective element so that the optical path length equals an integer number of half wavelengths of the selected wavelength.

3. The tunable laser of claim 2 wherein the range of wavelengths extends from approximately 1520 nanometers to approximately 1560 nanometers.

4. The tunable laser of claim 1 wherein the selected wavelength is 1540 nanometers.

5. The tunable laser of claim 1 wherein the at least one microactuator includes a microactuator coupled to the reflective element for causing angular movement of the reflective element.

6. The tunable laser of claim 1 wherein the at least one microactuator includes a microactuator coupled to the reflective element for rotating the reflective element about a pivot point.

7. The tunable laser of claim 6 wherein the pivot point is spaced apart from the microactuator.

8. The tunable laser of claim 6 further comprising means for translating the reflective element relative to the diffractive element.

9. The tunable laser of claim 1 wherein the at least one microactuator includes a first microactuator coupled to the reflective element for rotating the reflective element about a pivot point and a second microactuator coupled to the reflective element for translating the reflective element relative to the diffractive element.

10. The tunable laser of claim 1 wherein the at least one microactuator includes a micromachined actuator.

11. The tunable laser of claim 1 wherein the at least one microactuator is an electro static microactuator having interdigitatable comb fingers.

12. The tunable laser of claim 11 further comprising a controller for measuring the capacitance between the interdigitatable comb fingers and providing a drive signal to the at least one microactuator in response to the measured capacitance.

13. A tunable laser comprising a laser source for providing light with a wavelength selected from a range of wavelengths, a diffractive element spaced from the laser source for redirecting the light received from the laser source, a reflective element spaced from the diffractive element for receiving the light redirected by the diffractive element and for further redirecting the light back to the diffractive element, the diffractive element receiving the light further redirected by the reflective element and returning the light to the laser source whereby the laser source, the diffractive element and the reflective element cause the light to lase at the wavelength, at least one micro actuator coupled to one of the diffractive element and the reflective element for moving such element to select the wavelength of the light and a counterbalance coupled to the at least one microactuator and the one of the diffractive element and the reflective element for inhibiting undesirable movement of the one of the diffractive element and the reflective element in response to externally applied accelerations to the tunable laser.

14. The tunable laser of claim 1 wherein the reflective element includes a retroreflector.

15. The tunable laser of claim 1 wherein the laser source includes a Fabry-Perot laser.

16. The tunable laser of claim 1 further comprising an optical sensor for sensing a light beam reflected from one of the diffractive element and the reflective element so as to measure the wavelength of the light and producing an error signal corresponding to any deviation between the measured wavelength and the selected wavelength and a controller electrically coupled to the optical sensor and the at least one microactuator for receiving the error signal and providing a control signal to the at least one microactuator in response to the error signal.

17. The tunable laser of claim 16 wherein the optical sensor is a position sensing device.

18. The tunable laser or claim 17 further comprising an additional laser source for supplying the light beam.

19. The tunable laser of claim 17 wherein the light beam is supplied by the laser source.

20. The tunable laser of claim 16 wherein the optical sensor is a wavelength locker.

21. The tunable laser of claim 1 further comprising an optical sensor for sensing the light so as to measure the wavelength of the light and producing an error signal corresponding to any deviation between the measured wavelength and the selected wavelength and a controller electrically coupled to the optical sensor and the at least one microactuator for receiving the error signal and providing a control signal to the at least one microactuator in response to the error signal.

22. The tunable laser of claim 21 wherein the optical sensor is selected from the group consisting of a position sensing device and a wavelength locker.

23. The tunable laser of claim 1 further comprising a collimating lens disposed between the laser source and the diffractive element and an additional microactuator coupled to the collimating lens for moving the collimating lens to enhance the return of the light to the laser source.

24. The tunable laser of claim 23 wherein the additional microactuator is an electrostatic microactuator.

25. The tunable laser of claim 23 further comprising a counterbalance coupled to the collimating lens and the additional microactuator for inhibiting undesirable movement of the collimating lens in response to externally applied accelerations to the collimating lens.

26. The tunable laser of claim 1 further comprising an electroabsorptive modulator disposed in the optical path.

27. The tunable laser of claim 26 wherein the electroabsorptive modulator is disposed between the laser source and the diffractive element.

28. A tunable laser microassembly comprising a laser source for providing light with a wavelength selected from a range of wavelengths, a diffractive element spaced from the laser source for redirecting the light received from the laser source, a reflective element spaced from the diffractive element for receiving the light redirected by the diffractive element and for further redirecting the light back to the diffractive element, the diffractive element receiving the light further redirected by the reflective element and returning the light to the laser source whereby the laser source, the diffractive element and the reflective element cause the light to lase at the wavelength, and a micro-dimensioned actuator coupled to one of the diffractive element and the reflective element for rotating such element to select the wavelength of the light.

29. The tunable laser of claim 28 wherein the micromechanical actuator includes a rotatable micromechanical actuator coupled to one of the diffractive element and the reflective element for rotating and translating such element.

30. The tunable laser of claim 29 further comprising an additional microactuator coupled to such element for translating such element.

31. A laser assembly comprising a laser source for providing light along an optical path with a wavelength selected from a range of wavelengths, a diffractive element positioned in the optical path and spaced from the laser source for redirecting the light received from the laser source, a reflective element positioned in the optical path and spaced from the diffractive element for receiving the light redirected by the diffractive element and for further redirecting the light back along the optical path to the diffractive element, the diffractive element receiving the light further redirected by the reflective element and returning the light along the optical path to the laser source whereby adjustment of the optical path created by the laser source, the diffractive element and the reflective element causes the light to lase at a selected wavelength, a collimating lens disposed between the laser source and the diffractive element and a microactuator coupled to the collimating lens for moving the collimating lens to permit enhanced coupling of the light into the laser source.

32. The laser assembly of claim 31 wherein the microactuator is an electrostatic microactuator.

33. The laser assembly of claim 31 further comprising counterbalancing means coupled to the microactuator and to the collimating lens for inhibiting undesirable movement of the collimating lens in response to externally applied accelerations to the tunable laser.

34. The laser assembly of claim 31 further comprising a power detector for monitoring the power of the light and a controller electrically coupled to the power detector and the microactuator for providing a control signal to the microactuator for moving the collimating lens to enhance coupling of the light into the laser source and thus increase the power of the light.

35. The tunable laser of claim 13 wherein the at least one microactuator includes a microactuator coupled to the reflective element for rotating the reflective element about a pivot point.

36. The tunable laser of claim 35 wherein the pivot point is spaced apart from the microactuator.

37. A tunable laser comprising a laser source for providing light with a wavelength selected from a range of wavelengths, a diffractive element spaced from the laser source for redirecting the light received from the laser source, a reflective element spaced from the diffractive element for receiving the light redirected by the diffractive element and for further redirecting the light back to the diffractive element, the diffractive element receiving the light further redirected by the reflective element and returning the light to the laser source whereby the laser source, the diffractive element and the reflective element cause the light to lase at the wavelength, and a rotatable electrostatic microactuator having a movable structure extending substantially in a plane and coupled to the reflective element for rotating the reflective element about a pivot point extending substantially perpendicular to the plane to select the wavelength of the light.

38. The tunable laser of claim 37 further comprising a collimating lens disposed between the laser source and the diffractive element.

39. The tunable laser of claim 37 further comprising a counterbalance coupled to the microactuator and the reflective element for inhibiting undesirable movement of the reflective element in response to externally applied accelerations to the reflective element.

40. The tunable laser of claim 37 wherein the pivot point is spaced apart from and free of the movable structure.

* * * * *